United States Patent [19]
Numata et al.

[11] Patent Number: 6,043,536
[45] Date of Patent: Mar. 28, 2000

[54] SEMICONDUCTOR DEVICE

[75] Inventors: Toshinori Numata, Kawasaki; Mitsuhiro Noguchi, Yokohama, both of Japan

[73] Assignee: Kabushiki Kaisha Toshiba, Kawasaki, Japan

[21] Appl. No.: 09/313,774

[22] Filed: May 18, 1999

[30] Foreign Application Priority Data

May 19, 1998 [JP] Japan .................................. 10-137236

[51] Int. Cl.$^7$ ................................................. H01L 29/786
[52] U.S. Cl. ........................... 257/347; 257/59; 257/219; 257/226; 257/349; 257/352
[58] Field of Search ............................. 257/59, 219, 226, 257/347, 349, 352

[56] References Cited

FOREIGN PATENT DOCUMENTS 9-312401  12/1997  Japan .

OTHER PUBLICATIONS

S. Cristloveanu, et al., pp. 112–120, "Electrical Characterization of Silicon–On–Insulator Materials and Devices", 1995.

M.J. Van Dort, et al., IEDM 91, pp. 495–498, "Quantum––Mechanical Threshold Voltage Shifts of MOSFET's Caused by High Levels of Channel Doping", 1991.

J.W. Slotboom, et al., IEEE Transactions on Electron Devices, vol. ED–24, No. 8, pp. 1123–1125, "Bandgap Narrowing in Silicon Bipolar Transistors", Aug. 1977.

D.K. Ferry, pp. 46–51, "Quantum Mechanics for the Device Physics", 1996.

*Primary Examiner*—Fetsum Abraham
*Attorney, Agent, or Firm*—Oblon, Spivak, McClelland, Maier & Neustadt, P.C.

[57] ABSTRACT

In a semiconductor device including a full depletion MISFET transistor made by using a SOI layer and intended to stabilize a predetermined threshold value while holding the threshold value sensitivity to fluctuation in thickness of the SOI layer even upon changes in impurity concentration of a channel region of the MISFET transistor by changing a back gate voltage in accordance with the impurity concentration of the channel region, thickness of the SOI layer is determined to reduce changes in threshold value, and impurity concentration of the channel region is measured by using a detector element to adjust the back gate voltage in response to the measured value. Thus, the desired threshold voltage can be maintained.

20 Claims, 49 Drawing Sheets

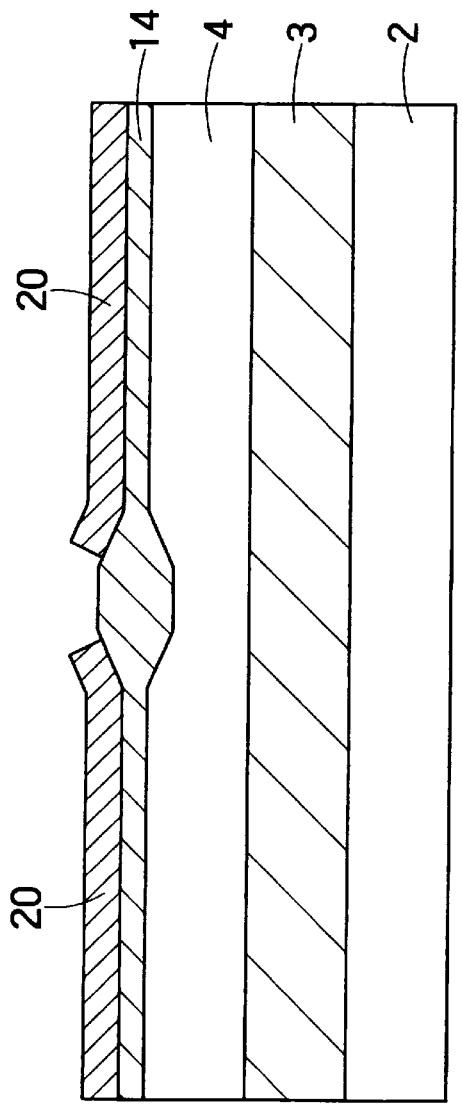
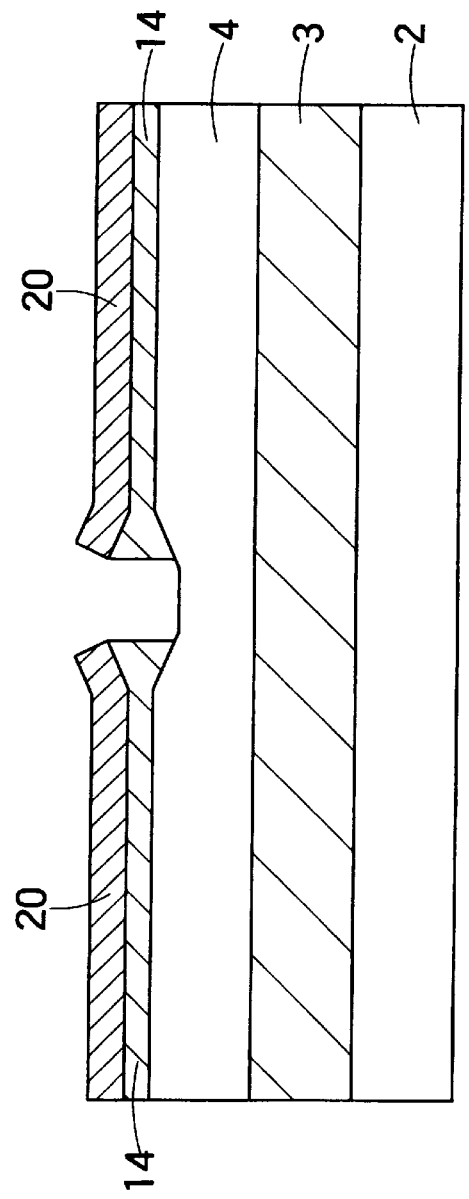
FIG. 19A
FIG. 19B

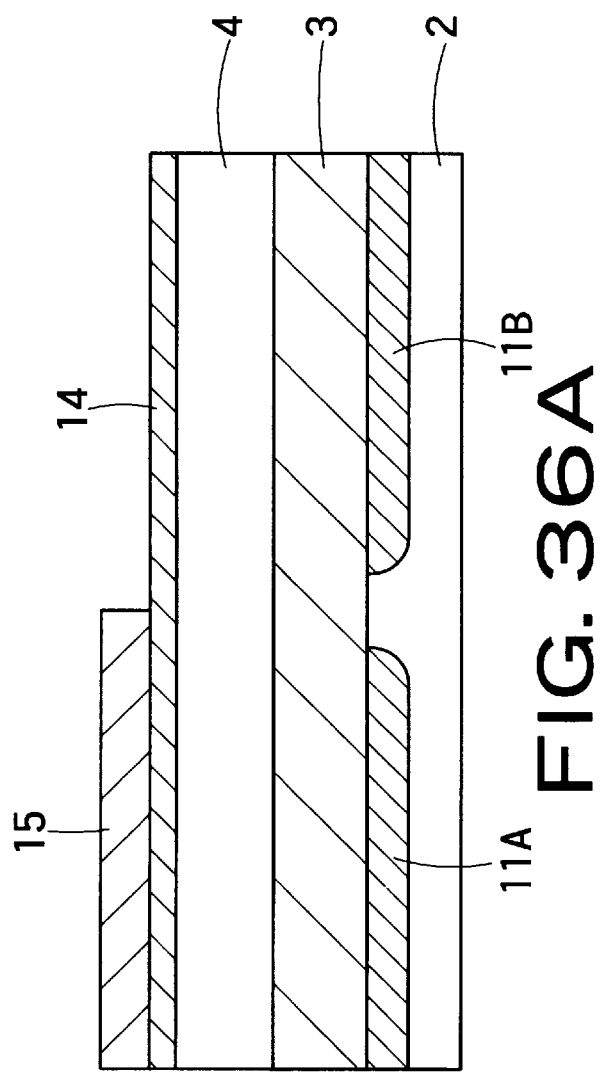
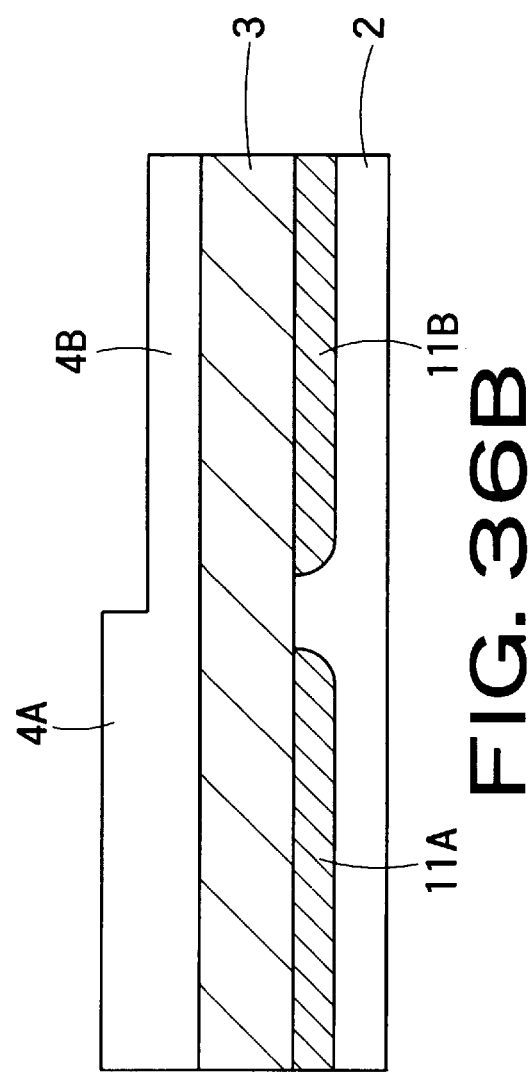
FIG. 36A
FIG. 36B

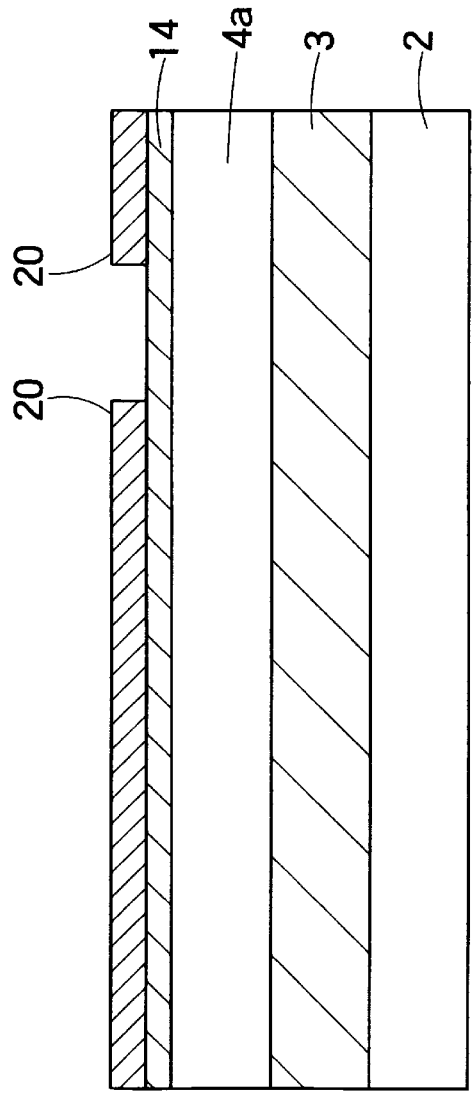
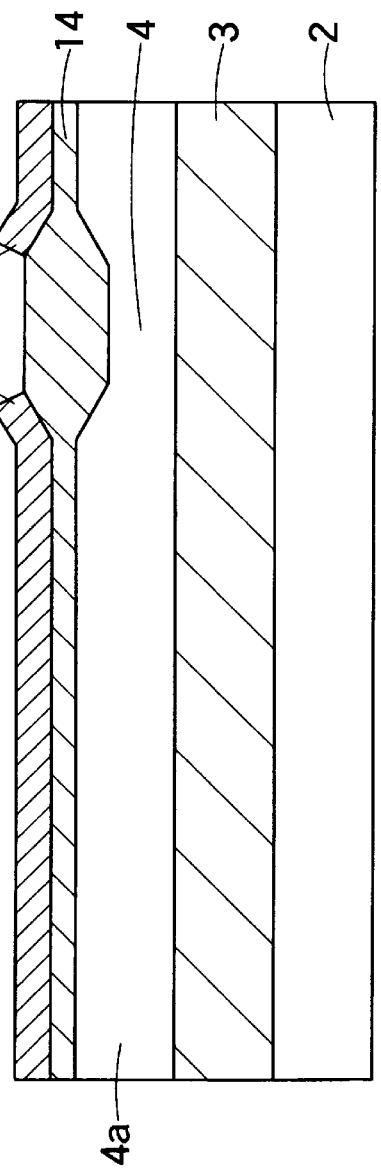

SEMICONDUCTOR DEVICE

BACKGROUND OF THE INVENTION

This invention relates to a semiconductor device, and more specifically to such having formed a fully depleted MISFET (metal insulator semiconductor field effect transistor) on a semiconductor layer stacked on a support substrate via an insulating film.

A FET made of an SOI (silicon on insulator), which is a semiconductor layer on an insulating substrate, is remarked as a hopeful device for application to a low-consumption device or a high-speed circuit such as high-speed CPU because its source-drain parasitic capacitance can be reduced much smaller than that of FET made on a bulk semiconductor substrate. Especially when the thickness of the SOI film as the semiconductor layer is reduced smaller than the thickness of the depletion layer of the channel region, the channel region can be fully depleted. As a result, it can remove or prevent unfavorable phenomena such as kink characteristics and current overshoot effect which are involved in FETs made by using a semiconductor layer thicker than the depletion layer.

The transistor in which the entire channel region can be carrier-freed (hereinafter called "fully depleted transistor") also has other various advantages, such as prevention of short-channel effect, improvement in punch-through resistance, improvement in sub-threshold coefficient, increase of the channel mobility, and so on.

The complete depletion transistor, however, involves the problem that the threshold value fluctuates due to the fluctuation in the impurity concentration of the semiconductor layer in the channel region or the fluctuation in the thickness of the SOI film which may caused by the changes of the process conditions, for example.

A method for treating the problems caused by changes of the process conditions is disclosed, for example, in Japanese Patent Laid-open Publication No. H9-312401, in which a back gate is provided on the support substrate under the insulating layer under the SOI layer, and the threshold value is controlled by changing the voltage to be applied to the back gate between the operative mode and the standby mode.

In this method, however, the back gate voltage is determined regardless of fluctuation in thickness of the SOI film and concentration of the substrate. And, nothing has been disclosed on specific means or construction for applying the back gate voltage so as to minimize the threshold value sensitivity to fluctuation of the thickness of the SOI film, for example.

More specifically, in the method and construction for reducing the threshold value sensitivity to in the conventional fully depleted transistor, the relationship of the back gate voltage, the optimum value of the SOI film thickness and the impurity concentration have not been taken into consideration. Therefore, it has been difficult to fix the threshold value to a regulated value and to decrease the threshold value sensitivity to fluctuation in the SOI layer thickness and impurity concentration.

SUMMARY OF THE INVENTION

It is therefore an object of the invention to provide a semiconductor device including a fully depleted MISFET transistor made by using a SOI layer, in which the threshold value can be set to a regulated value while maintaining the threshold value sensitivity to fluctuation of the SOI film thickness in a substantially minimum value even upon fluctuation of the impurity concentration of the channel in MISFET, by changing the back gate voltage, taking account of the impurity concentration.

The central object of the invention lies in providing a semiconductor device having a fully depleted transistor made in a semiconductor layer in confrontation with the back gate via an insulating film, in which a control circuit is provided to control the back gate voltage in response to the channel impurity concentration of the transistor so that a back gate voltage responsive to the impurity concentration be applied to the back gate.

The present invention may use the novel conditions minimizing changes in threshold value of the transistor with fluctuation in thickness of the SOI film when the thickness of the buried insulating film becomes thin. That is, MISFET based on device parameters originally found by the Inventors is remarkably advantageous in promising small changes in threshold value even upon fluctuation in thickness of the SOI layer and hence in stably exhibiting predetermined characteristics.

That is, in the semiconductor layer forming the fully depleted SOI transistor, the SOI film thickness is determined to reduce changes in threshold value for a regulated threshold value, and the impurity concentration is set within a range determined by accumulation and inversion along the surface of the semiconductor layer in contact with the insulating film, for example, to a middle value. The range of the thickness that can minimize changes in threshold value depends on the regulated threshold value.

According to the invention, there is provided a semiconductor device comprising:

a support substrate having a first back gate;

an insulating film provided on said support substrate;

a first semiconductor layer provided on said insulating film;

a first MISFET having as a channel region thereof a first portion of said first semiconductor layer opposed to said first back gate of said support substrate;

a detector element outputting a measurement signal which varies with impurity concentration, carrier concentration or thickness of said first semiconductor layer; and voltage applying means for applying a voltage to said first back gate responsive to said measurement signal.

According to the invention, there is further provided a semiconductor device comprising:

a support substrate having a back gate;

an insulating film provided on said support substrate;

a first semiconductor layer provided on said insulating film;

a first MISFET having as a channel region thereof a portion of said first semiconductor layer opposed to said back gate of said support substrate;

a storage element storing information on a voltage to be applied to said back gate; and voltage applying means for applying a voltage to said back gate responsive to said information stored in said storage element.

According to the invention, there is further provided a semiconductor device including a support substrate having formed a first back gate, an insulating film on the support substrate, and a first MISFET having as a channel region thereof a portion of a first semiconductor layer provided in alignment with the first back gate on the insulating film, characterized in satisfying the relation:

$$\{64 \times 1.4^{tbox/10} \times 0.9^{9 \times Vth \times 3/tox}\} -$$
$$\{1.4 \times 2.5^{tbox/10} \times 0.67^{9 \times Vth \times 3/tox}\} \times 10^{-16} \times N_A =$$
$$\{64 \times 1.4^{tbox/10} \times 0.9^{27Vth/tox}\} - \{1.4 \times 2.5^{tbox/10} \times 0.67^{27Vth/tox}\} \times$$
$$10^{-16} \times N_A \leq t_{si} \leq \{64 \times 1.4^{tbox/10} \times 0.9^{11 \times Vth \times 3/tox}\} -$$
$$\{1.4 \times 2.5^{tbox/10} \times 0.67^{11 \times Vth \times 3/tox}\} \times 10^{-16} \times N_A =$$
$$\{64 \times 1.4^{tbox/10} \times 0.9^{33Vth/tox}\} -$$
$$\{1.4 \times 2.5^{tbox/10} \times 0.67^{33Vth/tox}\} \times 10^{-16} \times N_A$$

where $t_{box}$ is the effective oxide thickness (nm) of the insulating film, $t_{si}$ is the thickness (nm) of the first semiconductor layer, $N_A$ is the impurity concentration (cm$^{-3}$)of the channel region and $V_{th}$ is the threshold value (V) of the MISFET when the effective oxide thickness of the gate insulating layer is $t_{ox}$ (nm).

Alternatively, the semiconductor device according to the invention comprises a support substrate having formed first and second back gates, an insulating film on the support substrate, a first semiconductor layer formed on the insulating film and having a first thickness, a first MISFET transistor including as its channel region a portion of the first semiconductor layer in alignment with the first back gate of the support substrate, a second semiconductor layer formed on the insulating film and having a second thickness different from the first thickness, a second MISFET transistor having as its channel region a portion of the second semiconductor layer in alignment with the second back gate of the support substrate, and a voltage applying means for applying a voltage to the first back gate independently of a voltage of the second back gate.

Alternatively, the semiconductor device according to the invention comprises a support substrate having formed a back gate, an insulating film on the support substrate, a first semiconductor layer on the insulating film, a MISFET transistor including as its channel region a portion of the first semiconductor layer in alignment with the back gate of the support substrate, a storage element for storing information on a voltage to be applied to the back gate, and a voltage applying means for applying a voltage to the back gate in accordance with the information stored in the storage element.

Alternatively, the semiconductor device according to the invention comprises a support substrate having formed first and second back gates, an insulating film on the support substrate, a first semiconductor layer formed on the insulating film and having a first thickness, a first MISFET transistor including as its channel region a portion of the first semiconductor layer in alignment with the first back gate of the support substrate, a first storage element for storing information on a voltage to be applied to the first back gate, a second semiconductor layer formed on the insulating film and having a second thickness different from the first thickness, a second MISFET transistor including as its channel region a portion of the second semiconductor layer in alignment with the second back gate of the support substrate, a voltage applying means for applying a voltage to the first back gate in accordance with the information stored in the first storage element independently from the voltage of the second back gate.

The storage element may store information on impurity concentration or carrier concentration of the first semiconductor layer.

The MISFET transistor is preferably a fully depleted transistor in which the channel region can be completely carrier-freed.

The detector element is preferably an impedance element, which varies at least in resistance value, capacity and inductance in response to impurity concentration or carrier concentration of the first or second semiconductor layer.

Preferably, the thickness of the first or second semiconductor layer having formed the channel region of the MISFET transistor is in the range from 1 nm to 100 nm, and impurity concentration thereof is in the range from $3 \times 10^{16} \text{cm}^{-3}$ to $8 \times 10^{17} \text{cm}^{-3}$.

The support substrate is preferably a semiconductor substrate, and impurity concentration of the back gate is preferably in the range from $3 \times 10^{16} \text{cm}^{-3}$ to $1 \times 10^{20} \text{cm}^{-3}$.

A circuit for measuring the impurity concentration or the carrier concentration by means of the detector element may be made together with the MISFET transistor on the common semiconductor layer.

Preferably, the first semiconductor layer is thicker than the second semiconductor layer, and the first semiconductor layer has a lower impurity concentration than the semiconductor layer.

Threshold value of the first MISFET transistor is preferably lower than that of the second MISFET transistor.

The invention is embodied as explained above and attains the following effects.

First, the threshold value can be maintained in a desired value while minimizing the threshold value sensitivity to fluctuation in SOI film thickness and impurity concentration which are issues of fully depleted transistors.

Additionally, when an integrated circuit is made, for example, since the invention corrects fluctuation in impurity concentration and reduces changes in threshold value with fluctuation in SOI film thickness as compared with conventional devices, elements having uniform characteristics can be integrated.

On the other hand, in a MOS logic circuit, as the threshold value of a transistor increases, the current drive power decreases, and the delay time are elongated. As the threshold value decreases, the off-time sub-threshold leak current increases. Therefore, the invention can hold variance in delay time and power consumption smaller.

The delay time is proportional to $(V_{DD}-V_{th})^{-\alpha}$ where $V_{DD}$ is the source voltage, $V_{th}$ is the threshold value, and $\alpha$ is a positive integer including 1. Therefore, the delay time can be decreased so much as the variation of $V_{th}$, and the device can be driven with a lower voltage under the same delay time. Therefore, by decreasing the drive voltage, the reliability of the gate insulating film to the source voltage can be increased more, and the power consumption for charging and discharging the gate can be reduced.

Moreover, even when a recess gate structure by LOCOS sacrificial oxidation is made, by determining the SOI film thickness to minimize the threshold value sensitivity to fluctuation in SOI thickness for a desired threshold value, changes in threshold value near the SOI film thickness are minimized, and the desired threshold value can be obtained.

Furthermore, since variance in threshold value between paired transistors can be reduced more, current mirror circuits or cross-coupled sense amplifiers, for example, can be realized with better accuracy and symmetry, and a higher accuracy of the current source and a higher sensitivity of sense amplifiers can be realized.

Additionally, the invention can minimize threshold voltage sensitivities to fluctuation in SOI film thickness of individual elements in a semiconductor circuit incorporating MISFETs having two or more threshold values. Also in a CMOS circuit, threshold value sensitivities to fluctuation in SOI film thickness are minimized in respective fully depleted MISFETs having SOI film thicknesses corresponding to respective desired threshold values of n-type MISFETs and p-type MISFETs. This is difficult with FD-SOIMISFETs having a uniform SOI film thickness. Therefore, in a logic circuit using transistors and CMOS circuits having a plurality of threshold values, changes in threshold value can be held substantially minimum for respective desired threshold values even under fluctuation in SOI film thickness.

Furthermore, the back gate voltage control circuit responsive to impurity concentration can be made on a common substrate by using a half-Vdd circuit or a substrate bias circuit.

The process for obtaining impurity concentration of the semiconductor layer forming the MISFET through measurement of the resistance is advantageous in that it can be performed under a low voltage by using the process of measuring the capacity of the capacitance and that no problem exists regarding limitation of applied voltage due to resistance to voltage of the gate oxide film. On the other hand, the process for obtaining impurity concentration through measurement of the capacity of the capacitance is advantageous in that the sensitivity is higher than the process by measurement of resistance and that the power consumption is lower.

Moreover, since the gate used in MISFET can be also used to make the detector element, the detector element for measuring impurity concentration can be made on a common substrate through the same number of processes as those of a conventional semiconductor device.

Further, by making the detector element for measuring impurity concentration of the semiconductor layer with a thin SOI film thickness in a semiconductor layer region with a thick SOI film thickness, it is possible to ensure a film thickness margin for making a p-n junction of the detector element. Then, upon making an n-type layer in a p-type semiconductor layer by ion implantation to make the p-n junction, the p-n junction region can be made by using the current lithographic process, by doing so simultaneously with ion implantation for making the source-drain electrode region in the n-type MISFET.

As explained above, the invention can maintain the threshold value in a predetermined value in a semiconductor device including a fully depleted transistor while holding threshold value sensitivity to fluctuation in SOI film thickness or impurity concentration substantially minimum, and its industrial merit is great.

BRIEF DESCRIPTION OF THE DRAWINGS

The present invention will be understood more fully from the detailed description given herebelow and from the accompanying drawings of the preferred embodiments of the invention. However, the drawings are not intended to imply limitation of the invention to a specific embodiment, but are for explanation and understanding only.

In the drawings:

FIGS. 19A and 19B are cross-sectional views schematically showing a manufacturing process of a recessed gate structure by LOCOS sacrificial oxidation;

FIGS. 36A and 36B are cross-sectional views schematically showing a manufacturing process of a central part of the semiconductor device shown in FIG. 35;

FIGS. 39A and 39B are cross-sectional views schematically showing a process of a technique using a recessed structure by LOCOS sacrificial oxidation to make a thin SOI region;

DETAILED DESCRIPTION OF THE PREFERRED EMBODIMENTS

According to the invention, the thickness of the SOI layer is determined to decrease changes in threshold value. Further, by measuring the impurity concentration of the channel region by using a detector element, and then adjusting the back gate voltage with reference to the measured value, the desired threshold value can be maintained. Therefore, the threshold value can be set to a regulated value while continuously minimizing the threshold value sensitivity to fluctuation of the SOI film thickness and fluctuation of the impurity concentration, which may occur in fully depleted transistors.

Embodiments of the invention are explained below with reference to the drawings, taking n-type MOSFET as an example. As to the pattern of the SOI layer for separating elements, it is not essential in the present invention. So, the description will not touch it particularly.

Figure 1:
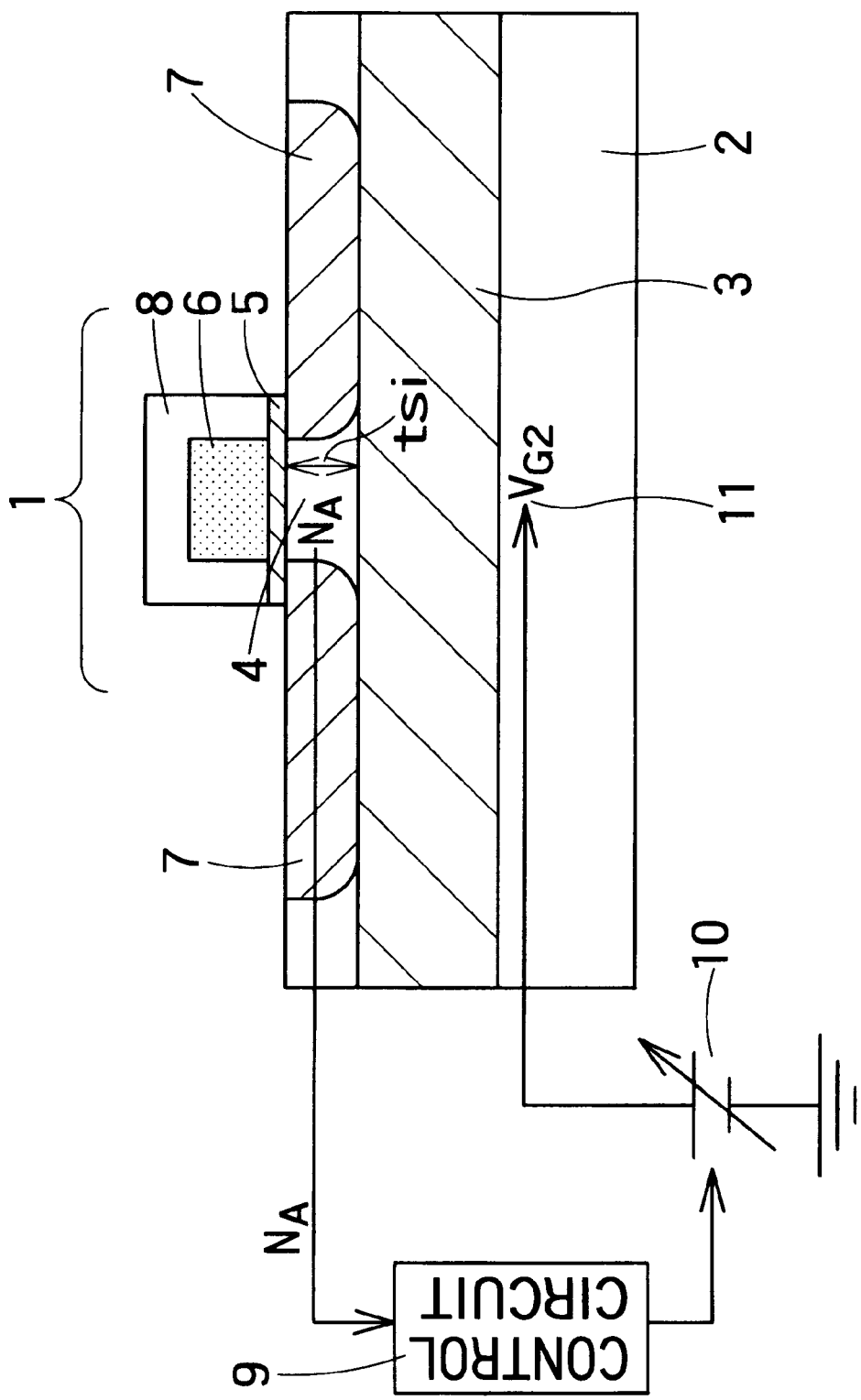
FIG. 1 is a cross-sectional view showing a central part of a semiconductor device taken as a first example of the invention.

FIG. 1 is a cross-sectional view showing a central part of a semiconductor device according to the first embodiment of the invention. In FIG. 1, reference numeral 6 refers to a gate electrode, 7 to a source-drain region, 2 to a support substrate, 3 to an insulating film, 4 to a channel region, 5 to a gate insulating film, 8 to an insulating film, 9 to a control circuit, 10 to a variable power source (, for example, a power source controlling the output current or voltage by the voltage or current of a control input), and 11 to a back gate.

A specific example of the semiconductor device is configured as explained below. Made on a major surface of the support substrate 2 of silicon is the insulating film 3 which may be a silicon oxide film or a silicon nitride film having a thickness of 1 nm to 1 $\mu$m, for example. Formed on the insulating film 3 is the channel region 4 of silicon, for example, having the thickness of $t_{si}$ and a p-type impurity concentration $N_A$ of boron or indium. The thickness $t_{si}$ may be 1 nm to 500 nm, for example, and the impurity concentration $N_A$ may be $10^{16}$ to $10^{19} cm^{-3}$, for example.

The gate electrode 6 is made on the channel region 4 via the gate insulating film 5. Material of the gate insulating film 5 may be selected from silicon oxide, silicon nitride, tantalum oxide, titanium oxide, and so forth, and its thickness may be 1 nm to 200 nm. Material of the gate electrode 6 may be polycrystalline silicon, aluminum (Al), tungsten (W) or titanium nitride (TiN), for example, and its thickness may be 10 nm through 1 $\mu$m.

Sidewalls of the gate electrode 6 are covered and insulated by the insulating film 8 made of silicon oxide or silicon nitride, for example. In regions at opposite sides of the channel region 4, the source-drain regions 7 added with an n-type impurity such as arsenic (As), phosphorus (P), antimony (Sb), or the like, by $10^{18}$ through $10^{21} cm^{-3}$, for example. The channel region 4 is fully carrier-freed to form the fully depleted transistor FET in the state where an inversion layer is formed along the interface between the channel region 4 and the insulating film 5.

As explained later, the control circuit 9 is supplied with information on voltage, current capacity or resistance from a detector element (not shown) which measures the impurity concentration $N_A$ in the semiconductor layer, particularly in the channel region 4, then calculates an optimum back gate voltage value, and outputs a corresponding control signal. The variable power source 10 applies a predetermined back gate voltage to the back gate 11 in response to the control signal from the control circuit 9.

Next explained is a process for manufacturing the semiconductor device shown in FIG. 1. Let the process use a silicon substrate as the support substrate 2, silicon oxide film as the insulating film 3, and silicon SOI layers as the channel region 4 and the source-drain region 7. The SOI substrate can be made by using the method of preparing two silicon substrates each oxidized on one surface, bringing their oxide film surfaces into close contact, and annealing them at 1000 through 1200° C. to bond them. Alternatively, there can be used the method of ion-implanting oxygen ions into a silicon substrate under the conditions of the accelerated voltage of 160 keV and the dose amount of 1.5~3.0×$10^{18}$ ions/cm² and then annealing it at 1300 through 1350° C. to make a buried oxide film 3.

The semiconductor layer on the insulating film 3 is thinned by polishing, ion etching, or wet etching to form a SOI film with an even thickness in the range from 1 nm to 1 µm.

After that, an impurity-doped region is made as the back gate 11 in the support substrate 2 by lithography and ion implantation. That is, the back gate 11 can be made by injecting phosphorus (P) or arsenic (As), for example, into the support substrate 2 via a region of the insulating film 3 to form a MISFET transistor by lithography under the conditions of the accelerated voltage of 50 to 700 keV and the dose amount of $1 \times 10^{13} \sim 1 \times 10^{16}$ ions/cm$^2$, approximately. However, the process of making the back gate 11 may precede the process of making the insulating film 3 and the SOI layer 4.

Subsequently, ions are implanted into the channel region 4 so that the impurity concentration therein be within the range of $1 \times 10^{16}$ cm$^{-3} \sim 1 \times 10^{19}$ cm$^{-3}$.

Thereafter, by making the gate oxide film 5 and making the gate electrode 6 and the insulating film 8, the central part of MISFET 1 is completed.

In the manufacturing process explained above, especially for setting the threshold value of the fully depleted SOI transistor in the range of −0.1 to 0.4 V, the thickness of the SOI film of the channel layer 4 and its impurity concentration are preferably chosen from 1 nm to 1 µm and from $3 \times 10^{16}$ cm$^{-3}$ to $8 \times 10^{17}$ cm$^{-3}$.

Next explained are optimum values of the thickness $t_{si}$ of the SOI film in the channel region 4, its impurity concentration $N_A$ and back gate voltage $V_{G2}$ in the semiconductor device according to the invention.

Figure 2:
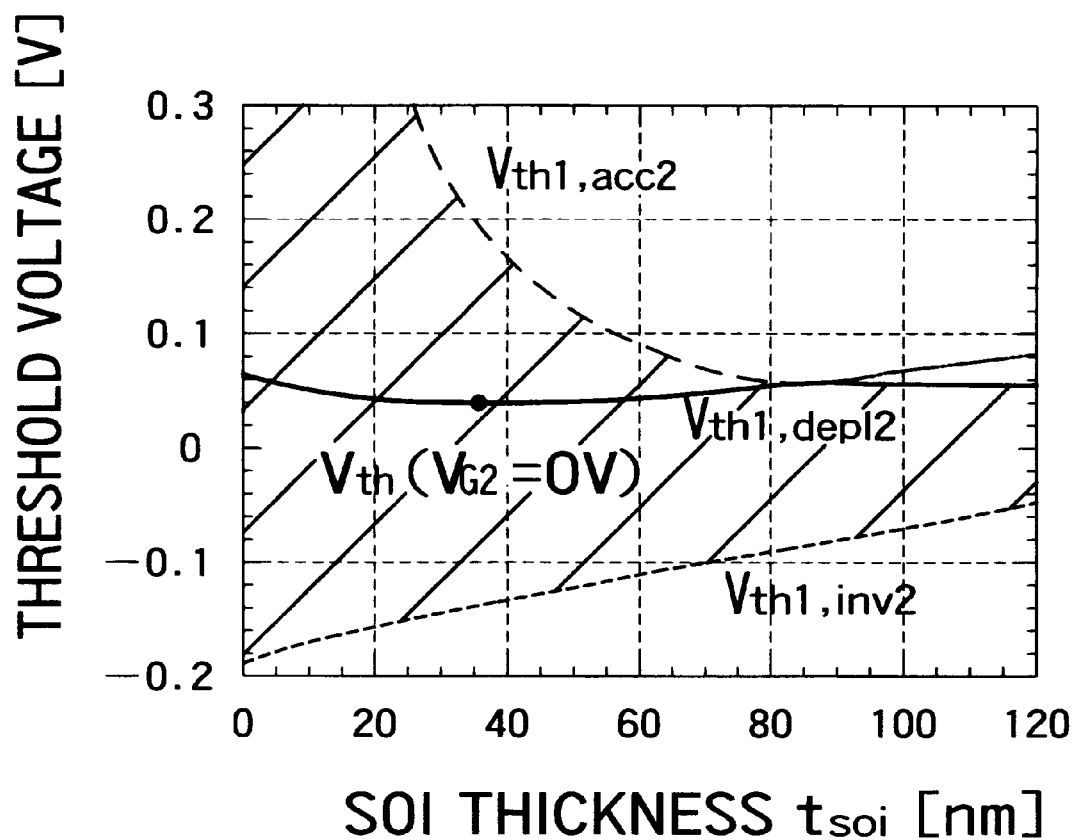
FIG. 2 is a graph showing relation between SOI film thickness and threshold value in fully depleted FET obtained by calculation by the Inventors.

FIG. 2 is a graph showing relation between the SOI film thickness and the threshold value of the fully depleted FET obtained by the Inventors' calculation. Here was taken as a model an n-type MOSFET made up of a silicon oxide film, 20 nm thick, as the insulator substrate 3, a p-type Si substrate doped by $1 \times 10^{20}$ cm$^{-3}$ as the back gate 11, an n-type polysilicon (polycrystalline silicon) doped by $1 \times 10^{20}$ cm$^{-3}$ as the gate electrode 6, and a silicon oxide film, 3 nm thick, as the gate oxide film 5. And, FIG. 2 shows by the solid line the relation between the thickness of the channel region 4, i.e., SOI film thickness $t_{si}$ and the threshold value $V_{th}$ under the back gate voltage being 0 V and the impurity concentration of the channel region 4 being $1 \times 10^{17}$ cm$^{-3}$. The hatched region corresponds to the adjustable range of the threshold value.

For calculation of the relation shown in the graph, the Inventors used the same equation as taught by a literature ("Electrical Characterization of Silicon-on-Insulator Materials and Devices" by Sorin Cristloveanu and Sheng S. Li, Kluwer Academic Publishers (1995)) as the equation expressing the threshold value of the fully depleted transistor, and referred to some literatures ( M. J. van Dort, P. H. Woerlee, A. J. Walker, C. A. H. Juffermans and H. Lifka: IEDM91 p495; J. W. Slotboom and H. C. de Graaff, IEEE Trans. Electron Devices, Vol. ED-24, No. 8, pp 1123–1125 (1977); and "Quantum Mechanism for Device Physics" by David K. Ferry, translated by Yosuke Nagaoka, et al., Maruzen (1996)) as the surface quantization effect.

As noted from FIG. 2, the threshold value of the transistor has a minimum value (marked by an arrow in FIG. 2) with respect to the thickness $t_{si}$ of the channel region 4. Near the minimum value, the threshold value changes least with changes in thickness $t_{si}$. That is, the threshold value changes by a very small amount relative to fluctuation in thickness of the SOI layer.

By applying a back gate voltage, the threshold value can be changed within the range where electrons along the surface of the channel region 4 in contact with the insulating film 3 exhibit accumulation ($V_{th1,acc2}$ in FIG. 2) or inversion ($V_{th1,inv2}$ in FIG. 2). Therefore, in the fully depleted transistor, in which the threshold value is controlled by applying a predetermined back gate voltage and the thickness of the channel region 4 is determined for the threshold value so determined to coincide with the minimum value in FIG. 2, such that the threshold value determined by applying a predetermined back gate voltage, changes in threshold value relative to fluctuation of the SOI film thickness can be minimized for the determined value.

Next explained are details of the calculation process of the threshold value of SOI as shown in FIG. 2. In the explanation given below, a calculation process based on a classical theory model is first explained, and a calculation process added with correction of a surface quantization effect of the channel inversion layer is explained subsequently.

In the fully depleted transistor capable of applying a back gate voltage, the threshold value depends upon the electron state along the surface of the channel region 4 in contact with the insulating film 3. The surface state of the channel region 4 in contact with the insulating film 3 can be changed from an accumulation state to an inversion state by a back gate voltage.

Then, the relation between the gate voltage $V_{G1}$ and the surface potential can be expressed by the following equation.

$$V_{G1} = \Phi_{MS1} - \frac{Q_{OX1}}{C_{OX1}} + \left(1 + \frac{C_{Si}}{C_{OX1}}\right)\Phi_{S1} - \frac{C_{Si}}{C_{OX1}}\Phi_{S2} - \frac{\frac{1}{2}Q_{dep1} + Q_{inv1}}{C_{OX1}} \quad (1)$$

where $\Phi_{s1}$ and $\Phi_{s2}$ are Fermi potentials of the surface of the channel region 4 in contact with the gate insulating film 5 and the surface of the channel region 4 in contact with the insulating film 3, $\Phi_{Ms1}$ is the difference of the work function of the gate insulating film 5 from that of the gate electrode 6, $Q_{OX1}$ is the fixed charge density in the gate insulating film 5, and $C_{OX1}$ is the capacitance of the gate insulating film 5, and $Q_{inv1}$ is the electric charge of the channel inversion layer. $Q_{dep1}$ is the electric charge of the depletion layer in the channel region 4, which is expressed as $-qN_A t_{si}$ by using the electron charge quantity q, impurity concentration $N_A$ of the channel region 4 and thickness $t_{si}$ of the channel region 4. The Fermi potential $\Phi_F$ is expressed as $\Phi_F=(kT/q)\ln(N_A/n_i)$ by using the intrinsic carrier density $n_i$ of silicon, Boltzmann constant k, temperature T and electron charge quantity q, and $C_{si}=\epsilon_{si}/t_{si}$ ($\epsilon_{si}$ is the dielectric constant of silicon).

The threshold value $V_{th}$ of the fully depleted transistor can be expressed for the following different cases depending upon the surface electron state on one side of the channel region 4 in contact with the insulating film 3. The surface potential $\Phi$si and the charge $Q_{inv1}$ of the channel inversion layer when satisfying $V_{G1}=V_{th}$ are $\Phi$si=$2\Phi$F and $Q_{inv1}=0$ respectively, from the condition that the gate voltage is the threshold value.

(1) When the back surface exhibits accumulation, from $\Phi_{s2}=0$ $$V_{th1,acc2} = \Phi_{MS1} - \frac{Q_{OX1}}{C_{OX1}} + \left(1 + \frac{C_{Si}}{C_{OX1}}\right)2\Phi_F - \frac{Q_{dep1}}{2C_{OX1}} \quad (2)$$

where suffixes "1" and "2" of $V_{th1,acc2}$ represent states on the surface of the channel region 4 in contact with the gate insulating film 5 and the surface thereof in contact with the insulating film, respectively. Equation (2) represents the case where the surface of the channel region 4 in contact with the insulating film 3 exhibits an accumulated state.

(2) When the back surface exhibits inversion, from $\Phi_{s2}=2\Phi_F$, $$V_{th1,inv2} = \Phi_{MS1} - \frac{Q_{OX1}}{C_{OX1}} + 2\Phi_F - \frac{Q_{dep1}}{2C_{OX1}} \quad (3)$$

(3) when the back surface exhibits depletion, its potential becomes an intermediate value between those of the accumulated state and inverted state, and $\Phi_{s2}$ depends upon the back gate voltage $V_{G2}$. Then, if the back gate voltage $V_{G2}$ is $V_{G2,acc}$ and $V_{G2,inv}$, respectively, when the surface of the channel region 4 in contact with the insulating film 3 exhibits accumulation and inversion, then the condition of $V_{G2,acc}<V_{G2}<V_{G2,inv}$ is satisfied. Further, since the capacitance $C_{si}$ of the channel region 4 and the capacitance $C_{OX2}$ of the insulating film 3 are connected in series, $\Phi_{s2}$ is expressed as $$\Phi_{S2} = \frac{C_{OX2}}{(C_{Si}+C_{OX2})}(V_{G2}-V_{G2,acc})$$

Therefore, the threshold value is expressed by the following equation.

$$V_{th1,dep12} = V_{th1,acc2} - \frac{C_{Si}C_{OX2}}{C_{OX1}(C_{Si}+C_{OX2})}(V_{G2}-V_{G2,acc}) \quad (4)$$

Considering that $V_{G2,acc}$ is symmetric with respect to the insulating film 3, conditions of $\Phi_{s1}=2\Phi_F$ and $\Phi_{s2}=0$ lead to the following equation.

$$V_{G2,acc} = \Phi_{MS2} - \frac{Q_{OX2}}{C_{OX2}} - \frac{C_{Si}}{C_{OX2}}2\Phi_F - \frac{Q_{dep1}}{2C_{OX2}} \quad (5)$$

Figure 3:
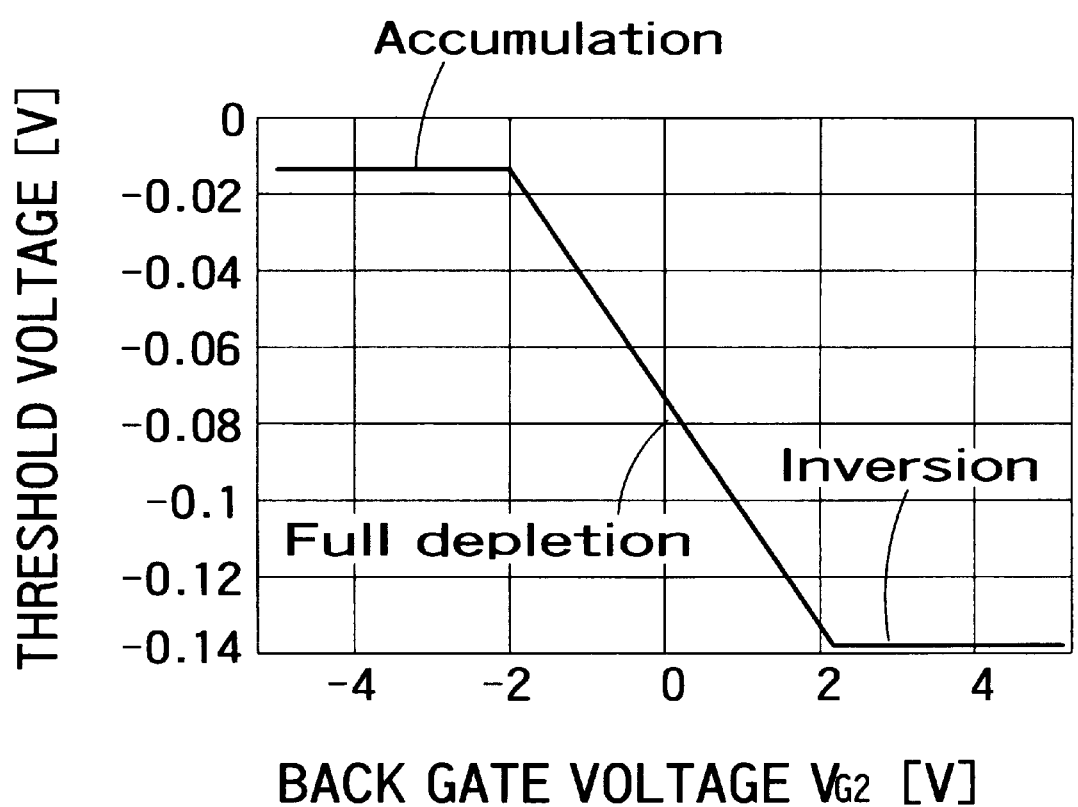
FIG. 3 is a graph showing threshold values relative to back gate voltage, calculated by Equation (2) through (5) in the case of impurity concentration of a channel region 4 being $N_A=1\times10^{17} \text{cm}^{-3}$, SOI film thickness $t_{si}=60$ nm, $\Phi_{Msi}=-1V$, and $Q_{OX1}=Q_{OX2}=0$.

FIG. 3 is a graph showing the relation of the threshold value relative to the back gate voltage calculated from Equations (2) through (5) for the case where the impurity concentration $N_A$ of the channel region 4 is $1 \times 10^{17} cm^{-3}$, SOI film thickness $t_{si}$ is 60 nm, $\Phi_{Ms1}=-1V$, and $Q_{OX1}=Q_{OX2}=0$. In the fully depleted transistor, when the electron state along the surface of the channel region 4 in contact with the insulating film 3 exhibits inversion or accumulation, the potential $\Phi_{s2}$ along the surface becomes constant. Therefore, even when a larger back gate voltage is applied, the threshold value maintains the constant value independently of the back gate voltage. that is, the threshold value of the fully depleted transistor is limited within the range from the threshold value upon accumulation being the electron state of the surface of the channel region 4 in contact with the insulating film 3 to the threshold value upon inversion being same.

Figure 4:
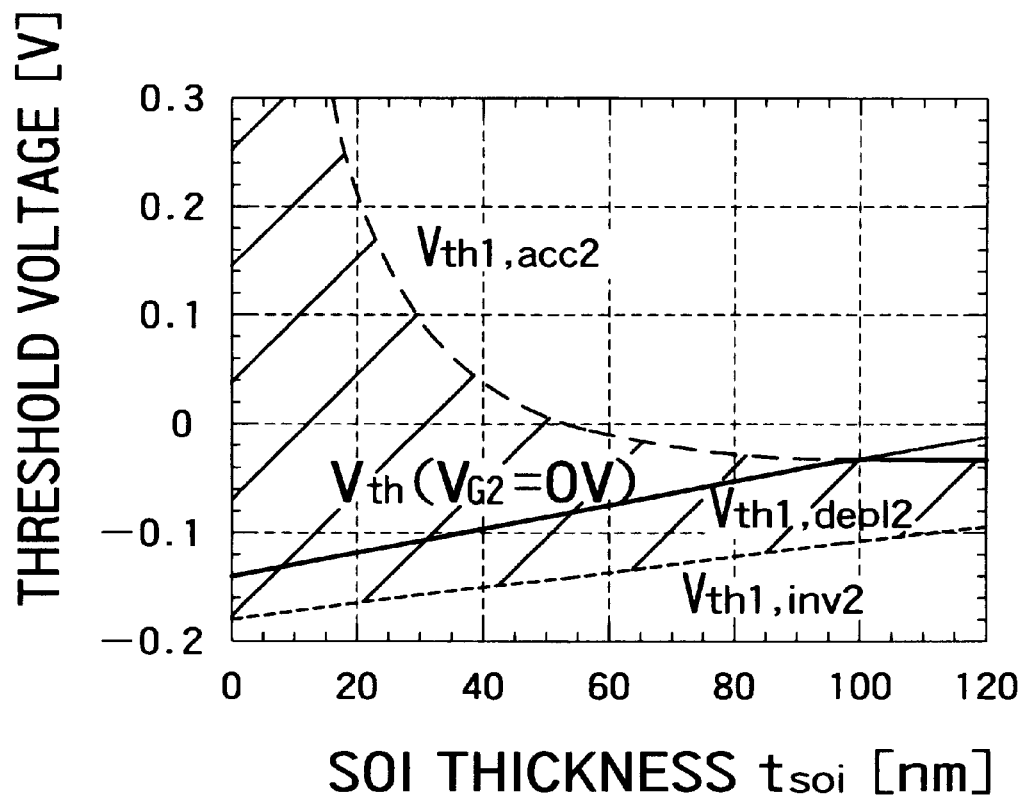
FIG. 4 is a graph showing dependency of threshold value upon SOI film thickness of the channel region 4, calculated by using a classic theory model of Equations (2) through (5) under the conditions with the thickness of a buried oxide film being 80 nm and impurity concentration of the channel region 4 being $1\times10^{17}\text{cm}^{-3}$.

FIG. 4 is a graph showing dependency of the threshold value of the channel region 4 calculated by using the classic theory model of Equations (2) through (5) with the thickness of the buried oxide film being 80 nm and the impurity concentration of the channel region 4 being $1 \times 10^{17} cm^{-3}$ upon the SOI film thickness. FIG. 4 shows $V_{th1,acc2}$ by a broken line, $V_{th1,inv2}$ by a dotted line and the threshold value for the SOI film thickness satisfying $V_{G2}=0V$ by a solid line.

$V_{th1,acc2}$ and $V_{th1,inv2}$ do not depend on $V_{G2}$ and are determined by the thickness of the channel region 4. On the other hand, $V_{th1,dep12}$ changes in threshold value with the back gate voltage $V_{G2}$. It is noted from FIG. 4 that, as the SOI film becomes thinner, $V_{th1,dep12}$ in the classic theory model linearly decreases because the depletion layer charge $(-Q_{dep1})$ contained in the SOI depletion layer decreases.

Next explained is a case where a surface quantization correction is added to the above-explained classic theory model. The change in the threshold value caused by such a surface quantization correction can be derived analytically. In orfer ti inroduce the surface quantization correction, the inventors took the following two kinds of parameters into account:

a increased amount of the surface band curve $\Delta\psi s$ of the surface potential; and a decrease in the gate capacitance caused by a capacitance of the inversion layer.

The increased amount of the surface band curve by surface quantization correction of the surface potential is expressed as:

$$\Delta\psi_S = (E_O - E_C - \Delta E_g)/q + E_S\Delta z \quad (6)$$

The value obtained by adding $2\Phi_F$ to this equation is determined as the surface potential $\Phi_{s1}$ upon the gate voltage being the threshold value.

Figure 5:
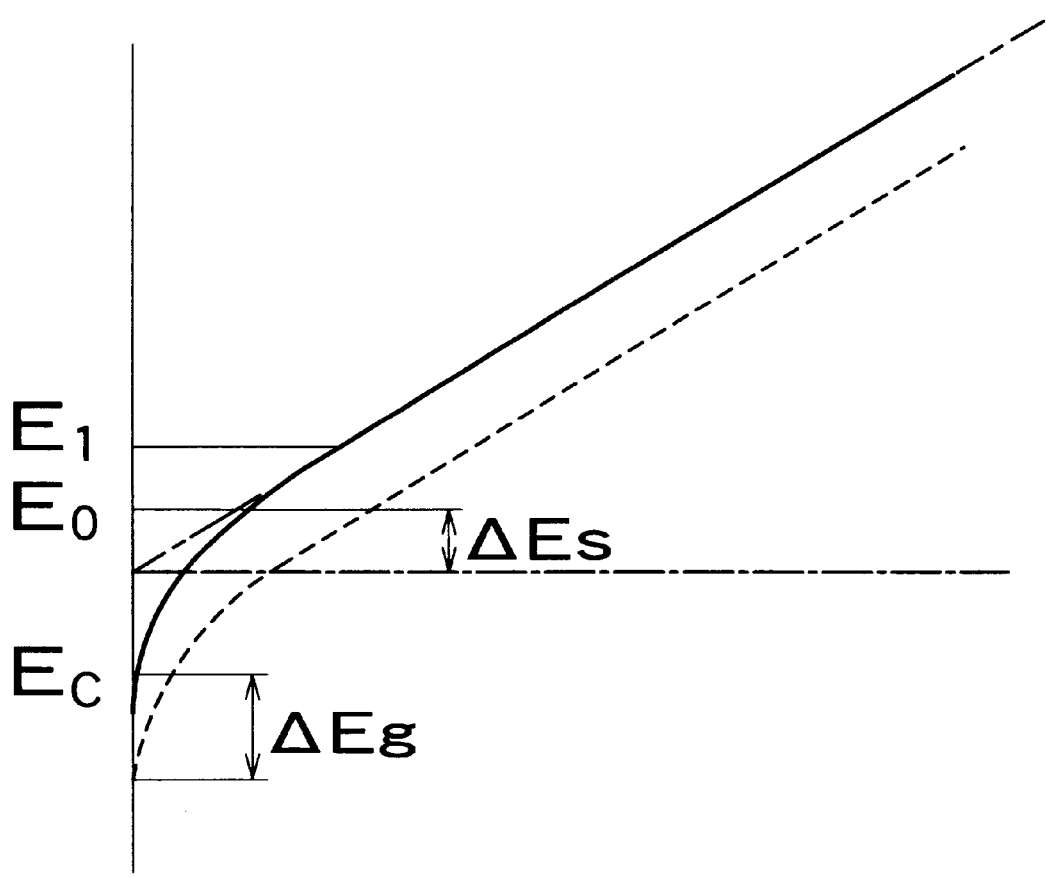
FIG. 5 is a band diagram for explaining surface quantization correction.

FIG. 5 is a band diagram for explaining surface quantization correction.

Equation (6) is made up of the shift Eo–Ec from the conduction band Ec to the minimum energy level Eo as shown in FIG. 5, bandgap narrowing effect $\Delta Eg$ by addition of high-concentrated channel impurities, and change $Es\Delta z$ of the surface potential by the shift $\Delta z$ of a position where the surface charge density by the quantum theory is maximum, and respective terms are expressed as follows.

The shift Eo–Ec to the minimum energy level Eo is:

$$E_0 - E_c = \frac{\hbar^2}{2m}\left(\frac{9\pi m q E_S}{4\hbar^2}\right)^{2/3} \quad (7)$$

where Es represents the surface electric field which is expressed as:

$$E_S = \left(\frac{\Phi_{S1}-\Phi_{S2}}{t_{Si}} + \frac{qN_A t_{Si}}{2\varepsilon_{Si}}\right) \quad (8)$$

The bandgap narrowing effect $\Delta Eg$ by addition of high-concentrated channel impurity is:

$$\Delta E_g/q = \Delta V_{go}(N_A) = 9\left\{ ln\left(\frac{N_A}{10^{17}}\right) + \sqrt{\left(ln\left(\frac{N_A}{10^{17}}\right)\right)^2 + 0.5} \right\}(mV) \quad (9)$$

Approximation of $Es\Delta z$ is expressed as:

$$E_S\Delta z \approx max\left((1-(1/3)^{2/3})(E_O - E_C) - \frac{kT}{q}, O\right) \quad (10)$$

Since the center of the charge of the inversion layer is distant by $\Delta z$ from the interface between the silicon film and the $SiO_2$ film due to the effective interface quantization effect, the capacitance $C_{OX1}$ of the gate oxide film is expressed by $C_{OX1}=\varepsilon_{OX}/(t_{OX1}+\varepsilon_{si}/\varepsilon_{OX}\Delta z)$.

Figure 6:
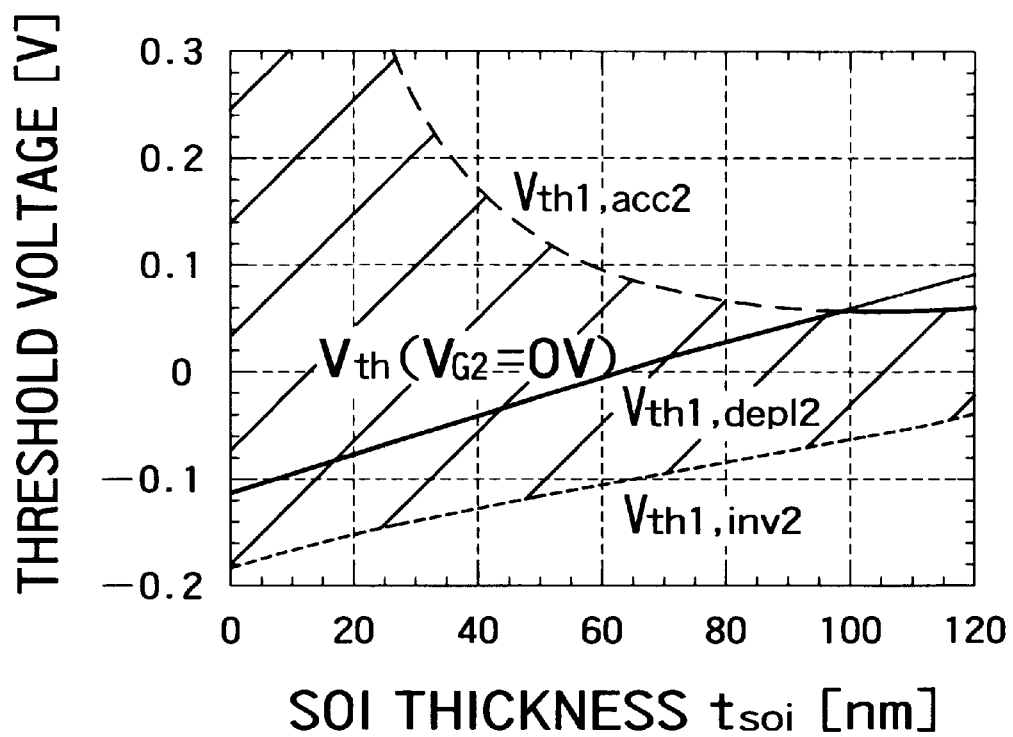
FIG. 6 is a graph showing dependency of the threshold value upon SOI film thickness of the channel region 4, obtained by taking account of quantization correction.

Addition of the above-mentioned quantization effect to FIG. 4 results in FIG. 6. That is, FIG. 6 is a graph showing dependency of the threshold value upon the SOI film thickness of the channel region 4. It is noted from FIG. 6 that the threshold value is made larger than the classic theory model by taking account of the surface quantization effect.

Figure 7A:
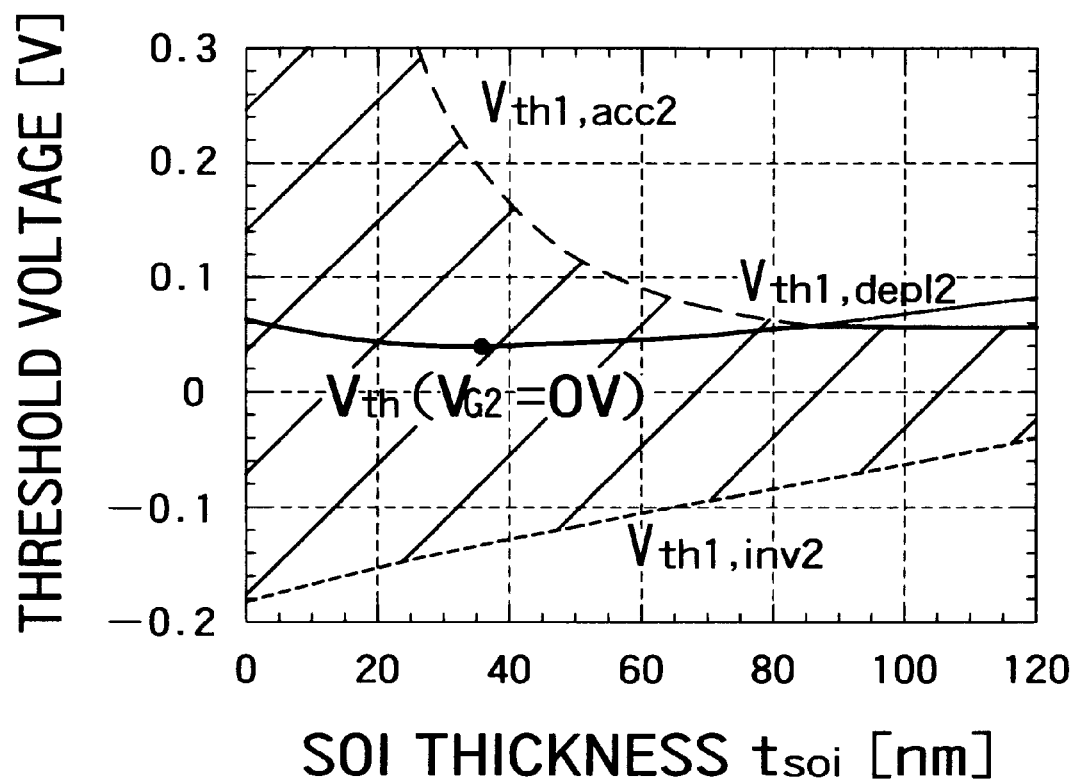
FIG. 7A is a graph showing dependency of the threshold value upon SOI film thickness of the channel region 4 in the case of the thickness of the buried oxide film being 20 nm.

This relation further changes as the buried oxide film becomes thinner. For example, FIG. 7A shows the relation in the case where the buried oxide film is 20 nm thick. As noted from FIG. 7A, the threshold value has a minimum value relative to the SOI film thickness under the condition of the back gate voltage being constant.

Figure 8:
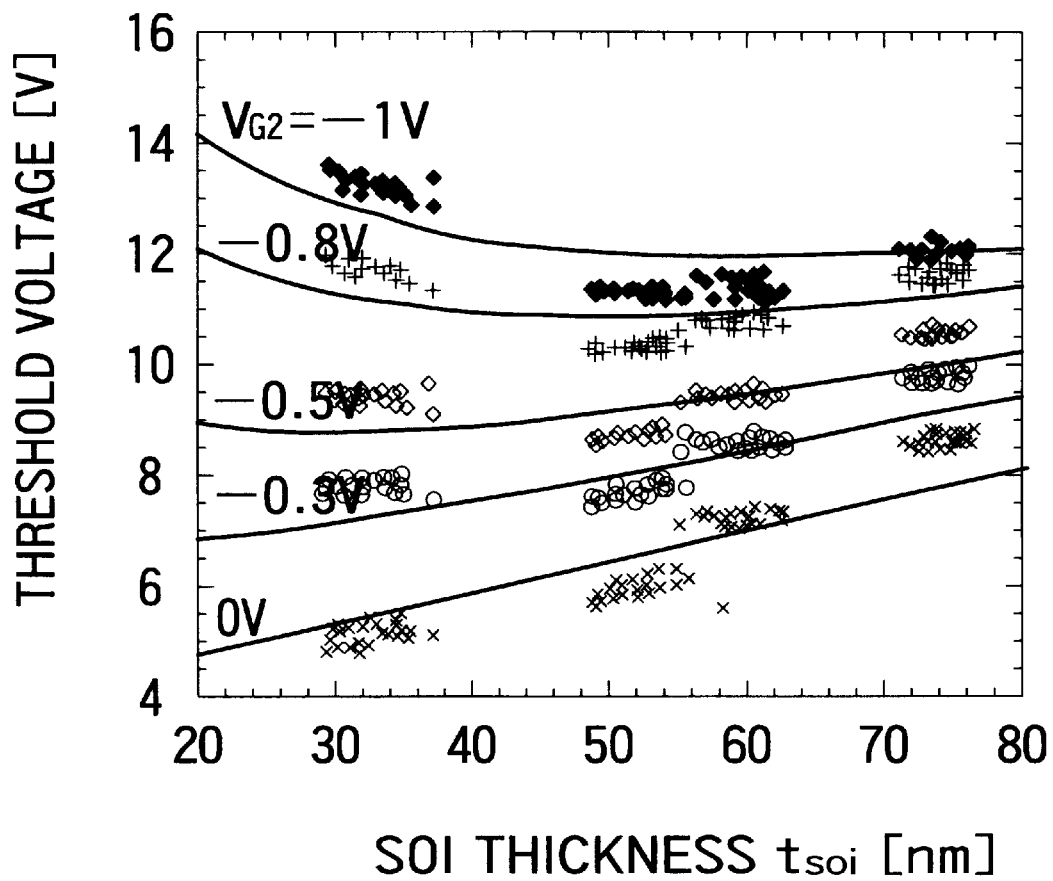
FIG. 8 shows the measured relationship between the film thickness of SOI and the threshold value.
Figure 9:
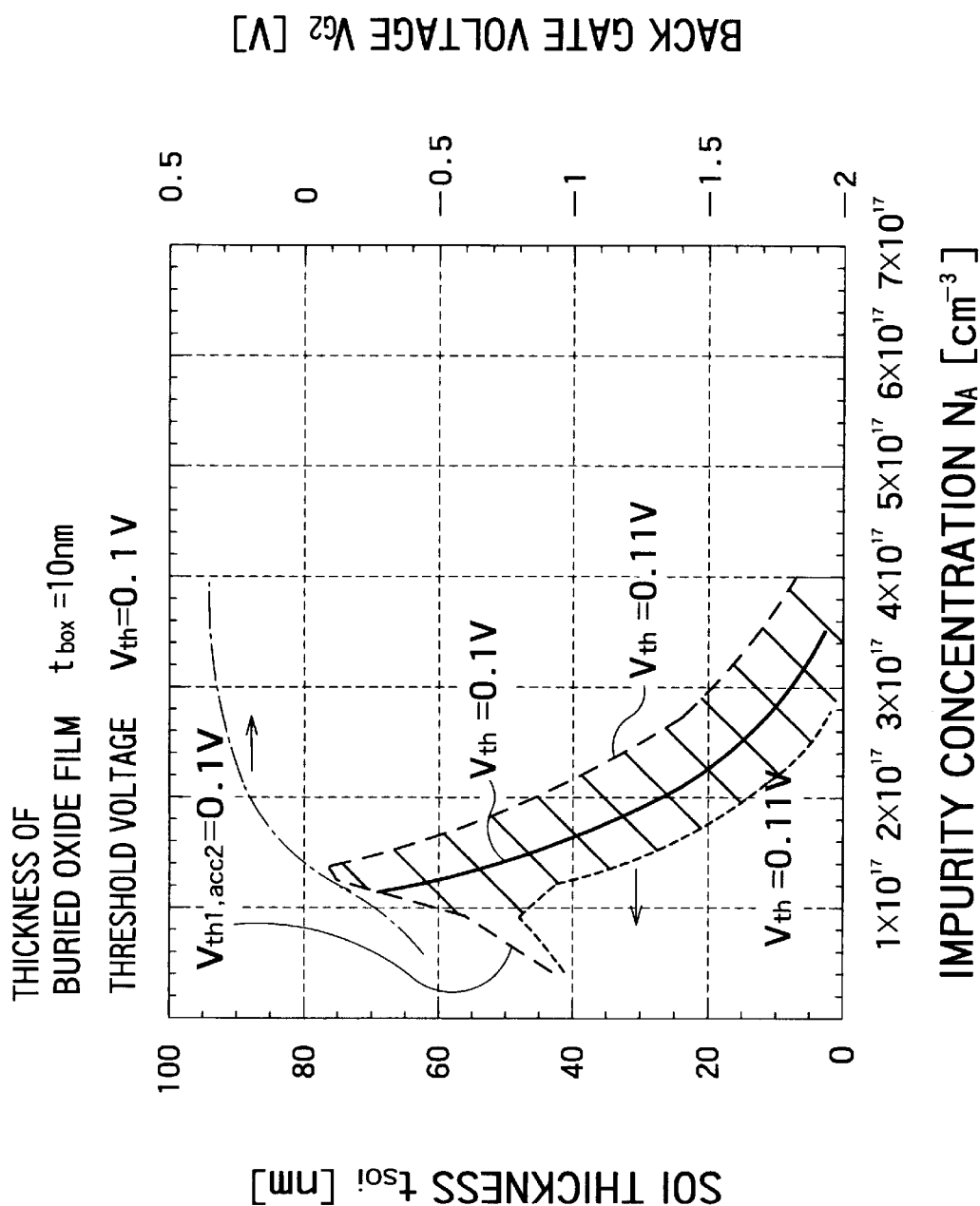
FIGS. 9 through 17 are graphs each showing SOI film thickness $t_{si}$ of the channel region minimizing the threshold value in FIG. 2 and back gate voltage $V_{G2}$ to be applied in relation with impurity concentration $N_A$ of the channel region 4 in the same FET model as that of FIG. 2.

FIG. 8 shows the measured relationship between the film thickness of SOI and the threshold value. The Inventors has found that the minimum value substantially appears in the threshold value, as seen in the figure. These values in FIG. 8 were taken from the fully depleted SOI-MOSFETs made by the Inventors, where the $t_{box}$=5 nm, $t_{OX}$=80–110 nm and $N_A$=1×10$^{17}$cm$^{-3}$. These transistors also have the back gate electrodes of the n-type silicon with an impurity concentration of 1×10$^{20}$cm$^{-3}$, and the SOI thickness of the channel being 30–90 nm.

In FIG. 8, each plot corresponds to the measured data of the each transistor. The back gate voltage was set at 0V, −0.3V, −0.5V, −0.8V and −1V for each transistor. In order to determine the SOI thickness of the transistor regions, a method described in the published research report (JianChen, Ray Solomon, Tung-Yi Chen, Ping K. Ko, and Cheeming Hu, IEEE Trans. Electron. Devices Vol. 39, No.10, 1992) was referred to. The solid lines in the figure were derived by the calculation according to the invention.

As noted from the FIG. 8, a minimal region of the threshold voltage appears versus the SOI thickness when the back gate voltage is −0.8V, for example. The Fermi-potential adjacent to the buried oxide layer seems to be substantially a flat band.

That is, near the minimum value, the threshold value changes least with fluctuation of the SOI film thickness, and changes of the threshold value with fluctuation of the SOI film thickness can be reduced remarkably in the fully depleted SOI-MOSFET.

This is a unique phenomenon occurring when the thickness of the buried oxide film is 30 nm, for example, which is thinner than the conventional one, and it was first found through researches by the Inventors themselves.

This unique phenomenon occurs probably for the following reason. That is, when the buried oxide film is thin, the potential near the back surface is fixed by the back gate voltage because of the capacitance of the insulating film thereby being large, and the difference between the surface potential (2Φ$_F$) of the SOI film and the potential of the back surface does not change so much upon the gate voltage being the threshold value, even when the SOI film is thinned. Therefore, as the SOI film becomes thinner, which results in increasing the electric field Es of the interface between silicon and SiO$_2$ (surface electric field), the quantum level energy increases. As a result, in order to invert the surface, a larger gate voltage is required. Then, as the SOI film becomes thinner, the threshold value increases.

Figure 7B:
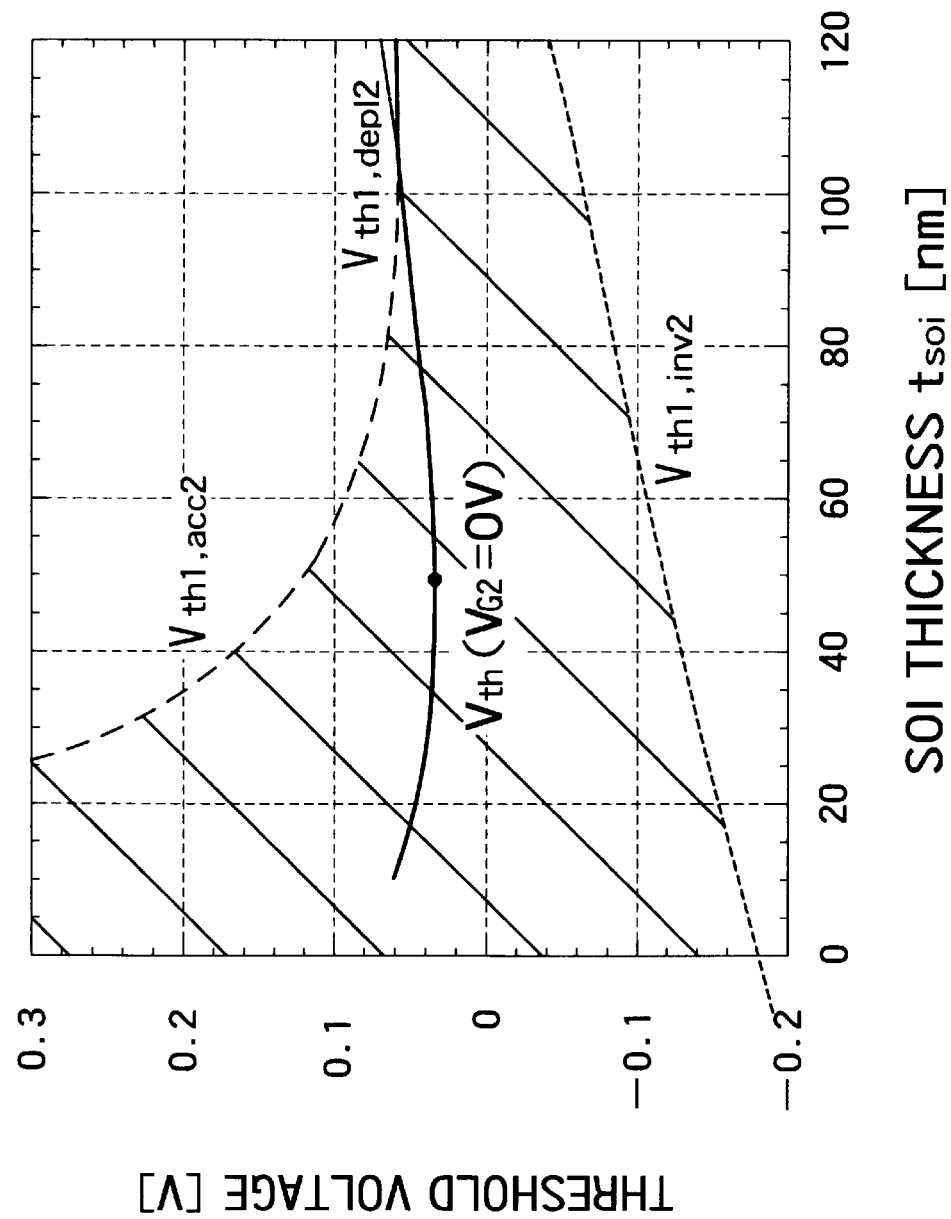
FIG. 7B is a graph showing dependency of the threshold value upon SOI film thickness of the channel region 4 in the case of the thickness of the buried oxide film being 15 nm.

FIG. 7B is a graph showing dependency of the threshold value upon the SOI film thickness of the channel region 4. As noted also from FIG. 8, also when the buried oxide film becomes thinner, a minimum value appears in the threshold value, and near the minimum value, change in threshold value with fluctuation of the SOI film thickness is very small.

FIGS. 9 through 17 are graphs showing the SOI film thickness $t_{si}$ of the channel region 4 minimizing the threshold value in FIG. 2 and the back gate voltage $V_{G2}$ applied thereupon in relation to the impurity concentration $N_A$ of the channel region 4 in the same FET model as that of FIG. 2. Here is shown cases where the thickness of the buried oxide film is 10 nm, 15 nm and 20 nm, and the fixed threshold value is 0.1 V, 0.2 V and 0.3 V. The hatched region in each of these graphs corresponds to the preferable range where the deviation of the threshold value lies within ±10% from the predetermined threshold value. The thickness of the gate oxide film tox is 3 nm in the all cases. Further, in these graphs, the substrate concentration is the same as the channel impurity concentration. However, in actually designing FET, the substrate concentration may be either equal to the channel concentration (that is, the flat band $V_{FB}$=0) or back gate concentration as high as 1×10$^{20}$cm$^{-3}$.

As noted from FIGS. 9 through 17, the SOI film thickness minimizing changes in threshold value with fluctuation of the thickness of the SOI film can be approximated as a linear line having a certain inclination relative to the impurity concentration. On the other hand, in its normal use, the width of changes in threshold value acceptable for FET may be preferably smaller than 0.1V if the tolerance against the hot carriers is considered. Therefore, the typical width of changes in threshold value acceptable for FET may be preferably kept within ±10% if the threshold value is set to be the value between 0.1 and 1 V. In the FIGS. 9 through 17, the region shown by the hatch corresponds to the range of the thickness of the SOI film within 10% in the plus and minus directions. That is, if the margin of the process upon manufacturing FET is limited within the hatched range, then a FET sufficiently restricting changes in threshold value having predetermined characteristics can be obtained.

If the fixed threshold value is changed, then the optimum ranges of the SOI film thickness and impurity concentration vary. The Inventors made a general formula for optimum conditions shown in FIGS. 9 through 17. That is, relation between the optimum thickness of the SOI film and the threshold value $V_{th}$ is as follows.

$$tsi \cong \{64 \times 1.4^{tbox/10} \times 0.9^{10 \times Vth \times 3/tox}\} - \{1.4 \times 2.5^{tbox/10} \times 0.67^{10 \times Vth \times 3/tox}\} \times 10^{-16} \times N_A \quad (11)$$

where $t_{box}$ is the effective oxide thickness (nm) of the buried insulating layer, $t_{si}$ is the thickness (nm) of the SOI layer, $N_A$ is the impurity concentration (cm$^{-3}$) of the channel region and $V_{th}$ is the threshold value (V) of the MISFET transistor when the effective oxide thickness of the gate insulating layer is $t_{ox}$ (nm).

Equation (11) is effective in the range of $V_{th}$ from 0 V to 1 V. Therefore, when $V_{th}$ is any value within the range, the optimum value of the SOI film thickness can be obtained.

In order to maintain changes in threshold value from the fixed value $V_{th}$ within the normally acceptable range, ±10%, the thickness $t_{si}$ of the SOI film must be in the following range.

$$\{64 \times 1.4^{tbox/10} \times 0.9^{9 \times V_{th} \times 3/tox}\} - \quad (12)$$
$$\{1.4 \times 2.5^{tbox/10} \times 0.67^{9 \times V_{th} \times 3/tox}\} \times 10^{-16} \times N_A =$$
$$\{64 \times 1.4^{tbox/10} \times 0.9^{27 V_{th}/tox}\} - \{1.4 \times 2.5^{tbox/10} \times 0.67^{27 V_{th}/tox}\} \times$$
$$10^{-16} \times N_A \le t_{si} \le \{64 \times 1.4^{tbox/10} \times 0.9^{11 \times V_{th} \times 3/tox}\} -$$
$$\{1.4 \times 2.5^{tbox/10} \times 0.67^{11 \times V_{th} \times 3/tox}\} \times 10^{-16} \times N_A =$$
$$\{64 \times 1.4^{tbox/10} \times 0.9^{33 V_{th}/tox}\} -$$
$$\{1.4 \times 2.5^{tbox/10} \times 0.67^{33 V_{th}/tox}\} \times 10^{-16} \times N_A$$

That is, if FET is manufactured such that the thickness tbox of the buried oxide film, thickness $t_{si}$ of the SOI film and impurity concentration $N_A$ satisfy the relation of Equation (12) relative to a predetermined threshold value $V_{th}$, then the "offset" of the threshold value of the obtained FET from the fixed value $V_{th}$ can be controlled within plus and minus 10%. Additionally, the back gate voltage $V_{G2}$ required for the threshold value to take the fixed value was newly noted to increase substantially linearly with impurity concentration $N_A$ of the channel region 4.

Therefore, when FET is made with the SOI film thickness $t_{si}$ and the impurity concentration $N_A$ determined with reference to FIGS. 9 through 17 or Equation (11) in accordance with the fixed threshold value, a semiconductor device having a minimum sensitivity of the threshold value to the SOI film thickness and having a fixed threshold value can be realized by measuring the impurity concentration of the channel region 4 and responsively applying a back gate voltage required for adjusting the threshold value to the fixed value, even when the impurity concentration $N_A$ or SOI thickness deviates from the desired value due to fluctuations in the process, for example.

In case of MISFET having a recess gate structure made by LOCOS (local oxidation of silicon) sacrificial oxidation, for example, bird's beaks at LOCOS ends often make the thickness of the channel region 4 uneven. That is, the thickness of the channel region becomes thicker near the source-drain and thinner near the center.

FIGS. 19A and 19B are cross-sectional views schematically showing a manufacturing process of a recess-type gate structure by LOCOS sacrificial oxidation. For example, a silicon oxide film 14, approximately 5 to 100 nm thick, if formed on a SOI layer 4 of 20 nm to 1 μm thick silicon, for example. Further stacked thereon is an anti-oxidation film 20 in form of a silicon nitride film, 50 to 200 nm thick, for example. After that, as shown in FIG. 19A, LOCOS is formed by thermal oxidation. Furthermore, as shown in FIG. 19B, using the anti-oxidation film 20 as a mask, the LOCOS oxide film is ion-etched to form a region for the gate. According to this method, the gate electrode can be made in self alignment, but bird's beaks of LOCOS remain in the region for the gate, and the thickness of the SOI film in the channel region is liable to become uneven. Unevenness of the thickness of the channel region deteriorates the stability of the threshold value.

In contrast, according to the invention, even if the channel thickness is not uniform, a desired threshold value can be stably obtained by selecting a SOI film thickness that minimizes the sensitivity of the threshold value for a predetermined threshold value to fluctuation in thickness from the SOI film thickness of a central part of the channel, for example. Therefore, a desired threshold value can be obtained by effecting LOCOS oxidation so as to adjust the SOI film thickness of the channel region to an optimum value as shown in FIG. 2 or FIGS. 9 through 17 and to maintain unevenness of the SOI film thickness at peripheral portions from the central portion of the channel within 20% or 10%, for example.

The portion where the impurity concentration $N_A$ of the channel region 4 be measured need not be the channel region 4 itself of MISFET, but may be any other region having the same impurity concentration as that of the channel region of MISFET. For example, when an integrated element incorporating a plurality of MISFETs, for example, the impurity concentration may be measured in any position of the integrated element. When a plurality of integrated elements are made on a wafer, the impurity concentration may be measured in any portion of the wafer provided that the evenness of the impurity concentration is acceptable throughout the wafer. Furthermore, in a manufacturing process by so-called batch processing in which a plurality of such wafers are processed simultaneously, wafers in a common batch are not different in impurity concentration so much, measurement may be done with only one wafer per batch.

If the impurity concentration of the channel region 4 is measured and the back gate voltage for adjusting the threshold value to a fixed one is determined in this manner, the back gate voltage need not be changed as long as the transistor is used with this threshold value. That is, once the back gate voltage is determined, the device does not require a control circuit. Therefore, after the impurity concentration of the channel region 4 is measured and a back gate voltage necessary for the present invention is determined, it is sufficient to configure the variable power source for the back gate to output the required voltage.

For measurement of the impurity concentration of the channel region 4, a known method as introduced in the literature ("Materials Processing Theory and Practice volume. 2-impurity doping processes in silicon": by F. F. Y. Wang, North Holland Publishing Company (1981)), for example, may be used. Shown below is a construction involving measurement of the impurity concentration.

Figure 20:
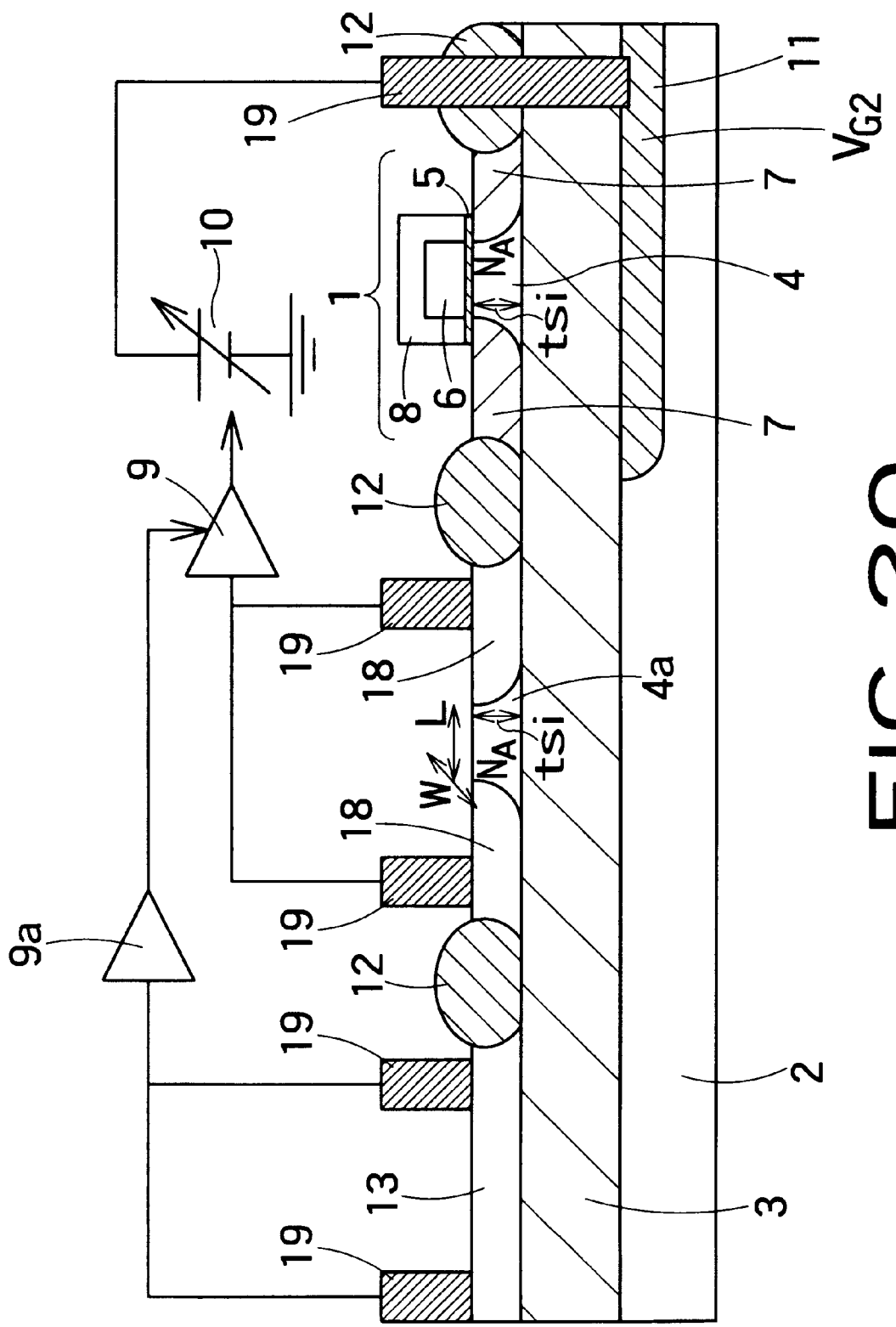
FIG. 20 is a cross-sectional view schematically showing a second example of the semiconductor device according to the invention.

FIG. 20 is a cross-sectional view schematically showing a second example of the semiconductor device according to the invention. Here are attached common reference numerals to the same components as those of FIG. 1 and is omitted their detailed explanation.

In FIG. 20, 4a refers to a dummy region, 12 to an element separating region, 13 to a high-concentrated semiconductor region, 18 to an electrode region and 19 to a metal plug. The dummy region 4a is a semiconductor region made under the same condition as that of the channel region. The high-concentrated semiconductor region 13 is a semiconductor region doped with a p-type dopant, for example, to the soluble limit.

The back gate 11 is a conductive region formed inside the support substrate 2. Preferably, the support substrate 2 is made of p-type Si whilst the back gate 11 is made of n-type Si so that different voltages be applied to them. The backgate 11 is formed directly under FET to be controlled in threshold value, and not formed under the dummy region 4a where the impurity concentration is measured. This is for the purpose of preventing that the thickness of the depletion layer in the dummy region 4a changes with voltage applied to the back gate 11.

Explained below is a method for measuring the impurity concentration and the thickness of the channel region 4.

In FIG. 20, circuits 9, 9a are control circuits. The circuit 9a measures the resistance of the high-concentrated semiconductor region 13 formed to exhibit the soluble limit, determines the SOI film thickness and outputs it to the circuit 9. The circuit 9 measures the resistance 18-4a-18 at opposite ends of the dummy region 4a and determines the impurity concentration of the channel region 4 by using the data on the SOI film thickness supplied from the circuit 9a. A value of the back gate voltage necessary for obtaining a desired threshold value is determined from the impurity concentration thus determined, and it is output to a power source 10.

In the example of FIG. 20, electrode regions 18 of the same conduction type as that of the semiconductor layer, for example, p⁺-type are formed in contact with the dummy region 4a doped with the same impurity as that of the channel region of the transistor FET1. Then, the control circuit 9 measures resistance between the electrode regions 18. The specific resistance ρ is expressed as ρ=W $t_{si}$ R/L where R is the resistance, L is the distance between the electrode regions 18, W is the width and $t_{si}$ is the thickness of the SOI film. Once the specific resistance ρ is obtained, the impurity concentration $N_A$ of the channel region 4 can be obtained from an Irving curve, for example.

On the other hand, the SOI film thickness $t_{si}$ can be obtained from the high-concentrated semiconductor region 13. That is, as shown in FIG. 20, in the p⁺-type high-concentrated semiconductor region 13 doped with boron (B), for example, into silicon up to the soluble limit, the resistance of the semiconductor region 13 is acquired. From the resistance of the high-concentrated semiconductor region 13, the specific resistance ρ can be obtained, and since the impurity concentration is determined by the solubility, it can be decomposed into $t_{si}$ and $N_A$. Therefore, the thickness of the semiconductor layer can be obtained by measuring the resistance of the high-concentrated semiconductor region 13.

The SOI film thickness $t_{si}$ obtained in this manner is introduced into the above-mentioned equation to obtain the impurity concentration $N_A$ of the channel region 4. In this example, the region for measuring $N_A$ can be made in the same process as that of MISFET1.

The circuits 9 and 10 may be in form of a half-Vdd circuit or a substrate bias circuit, respectively, for example.

Figure 21:
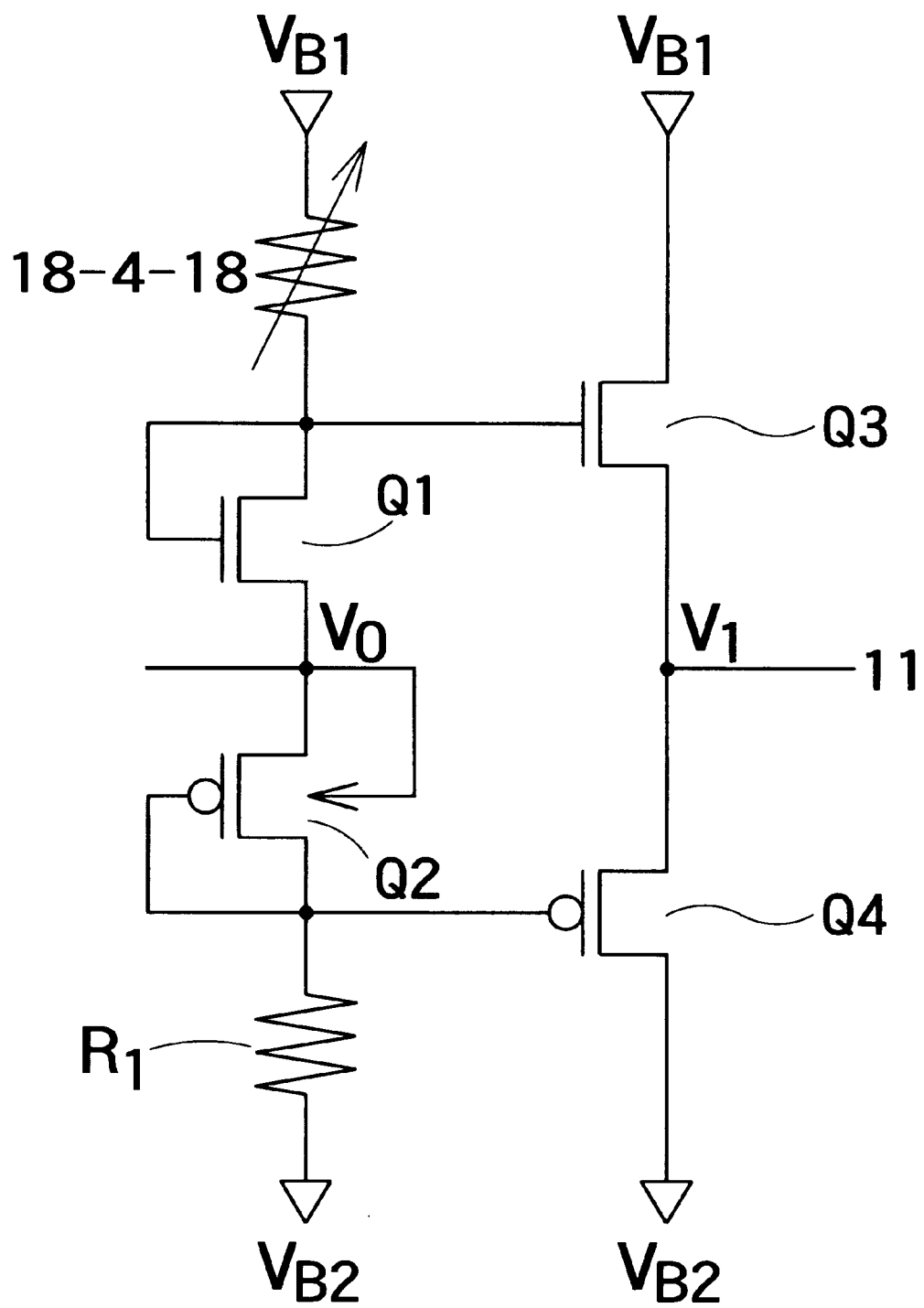
FIG. 21 is a circuit diagram schematically showing an embodiment using a half-$V_{dd}$ circuit.

FIG. 21 is a schematic circuit diagram of an embodiment using a half-Vdd circuit. $V_{B2}$ is a voltage, which is 0 V, for example, and $V_{B1}$ is a voltage that is, for example, $V_{DD}$. They have the relation of $V_{B1} > V_{B2}$. The resistor of 18-4-18 in FIG. 21 is the resistance measuring device 18-4-18 formed in the dummy region 4a of FIG. 20, and R1 is a resistor having the same resistance value as that appearing when the dummy region 4a is made with the fixed impurity concentration. Transistors Q3, Q4 are wider than Q1 and Q2 to form current buffers. R1 and the conductance of 18-4-18 are amply smaller than Q1 or Q2 and the transconductance. Since the resistor of 18-4-18 changes when the impurity concentration changes, the voltage output therefrom also changes due to resistive division, such that the larger the 18-4-18 resistance, the smaller the output, and the smaller the 18-4-18 resistance, the larger the voltage of the node $V_0$. the voltage $V_1$ of the node connected to the back gate 11 is determined to equalize the output node $V_0$ to the voltage. Thus, the back gate voltage can be changed by changing the resistance of the resistance measuring device. Any influence of changes in thickness $t_{si}$ of the SOI film can be removed by changing $V_{B1}$.

Figure 22A:
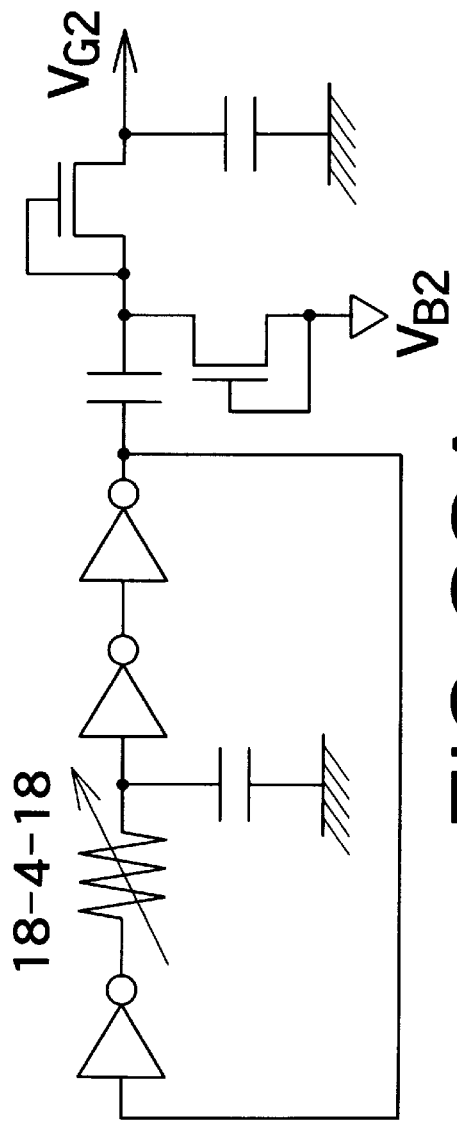
FIGS. 22A and 22B are circuit diagrams schematically showing embodiments relying on a substrate bias circuit.
Figure 22B:
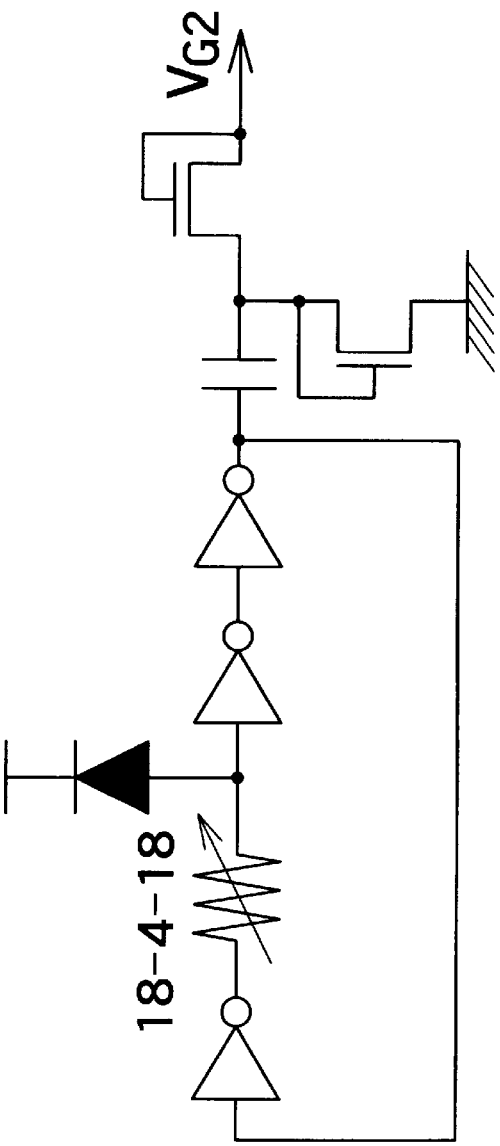

FIGS. 22A and 22B are schematic circuit diagrams of an embodiment using a substrate bias circuit. That is, 18-4-18 resistor is provided in a ring oscillator which varies in frequency because the resistance varies with impurity concentration of the dummy region 4a. Due to such changes in frequency, the number of excitation of the charge pump circuit varies, causing the current supplied to the back gate to change, and enabling the back gate voltage to be changed.

Next explained is a manufacturing process of the semiconductor device of FIG. 20.

Figure 23:
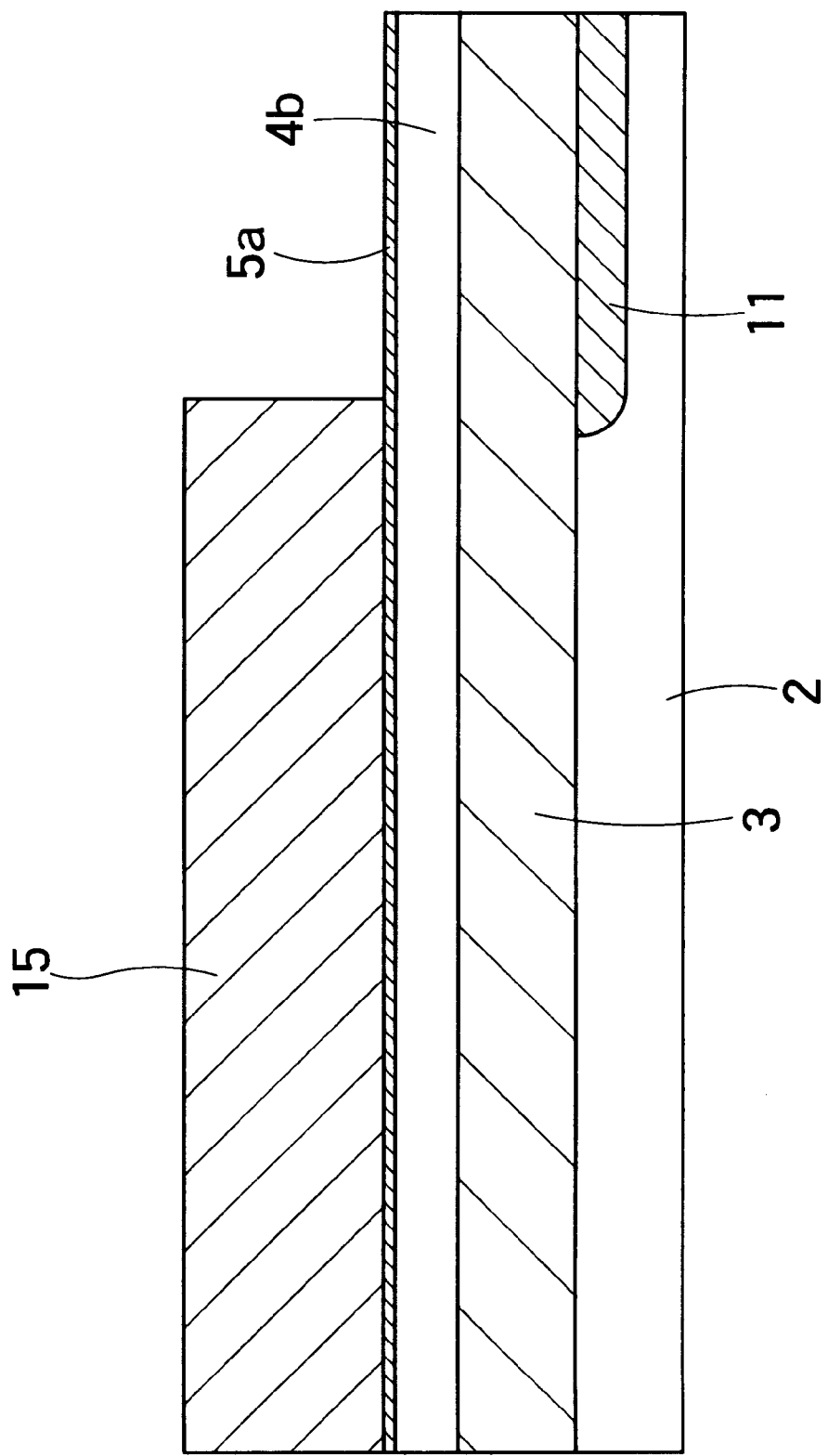
FIG. 23 is a cross-sectional view showing a manufacturing process of a central part of the semiconductor device shown in FIG. 20.
Figure 24:
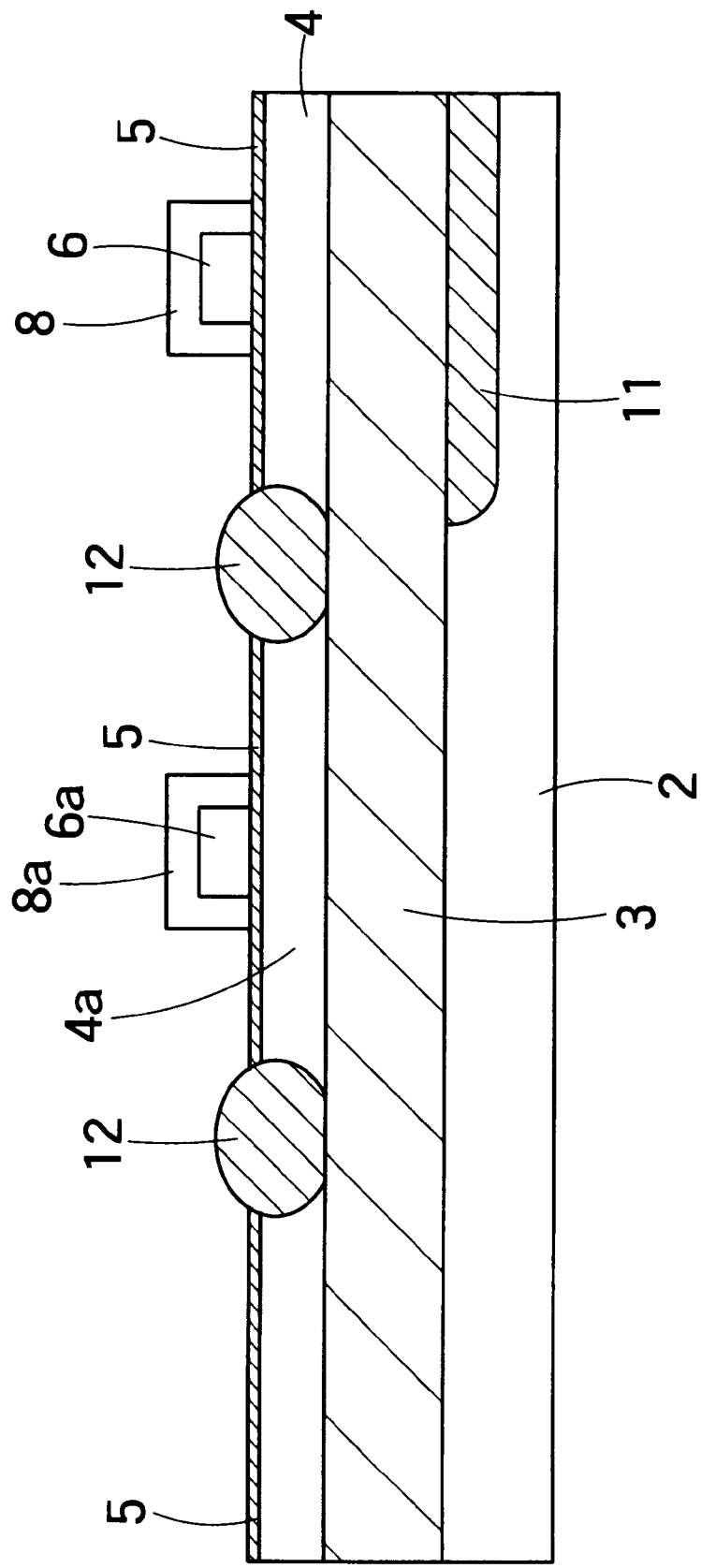
FIG. 24 is a cross-sectional view showing a manufacturing process of a central part of the semiconductor device shown in FIG. 20.
Figure 25:
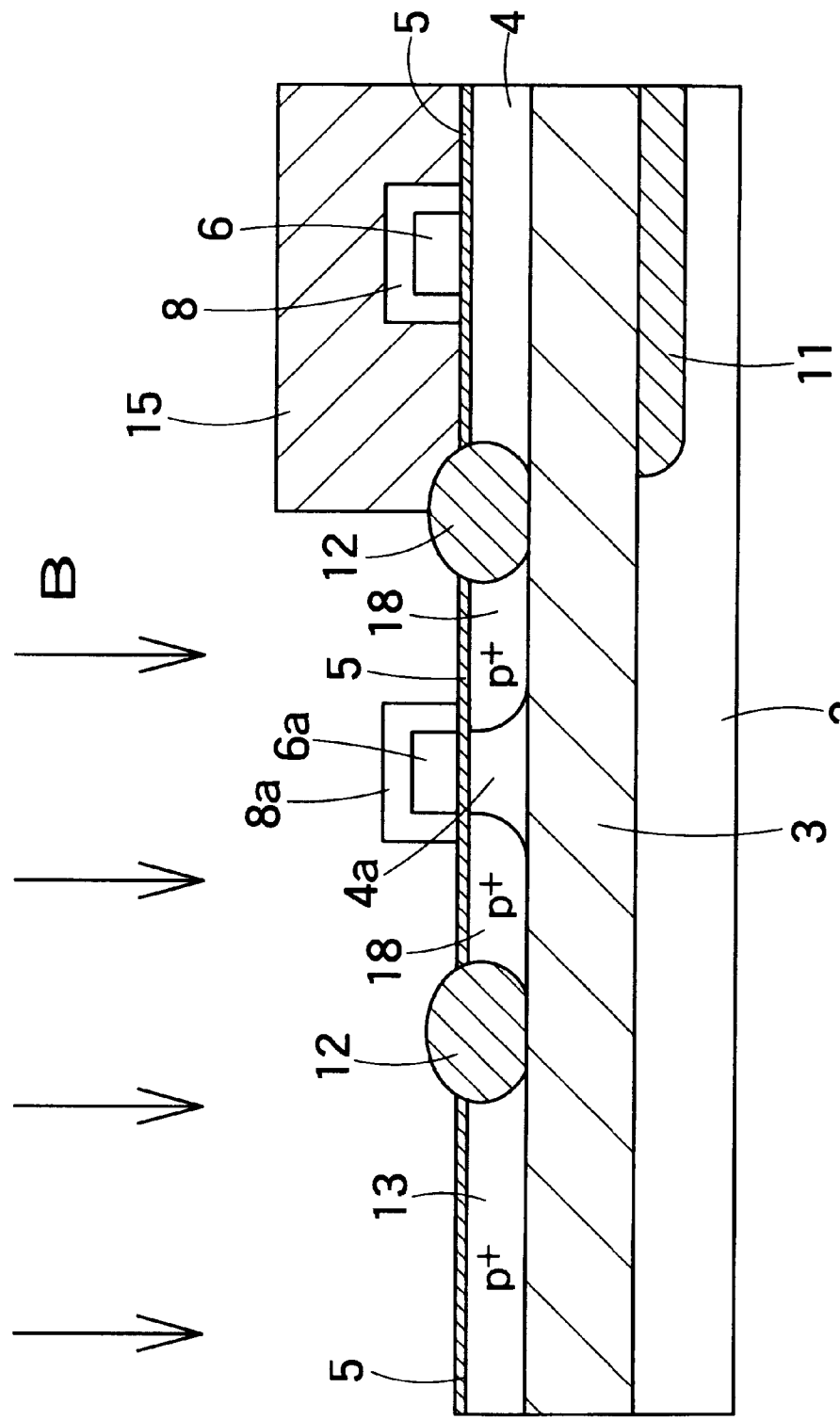
FIG. 25 is a cross-sectional view showing a manufacturing process of a central part of the semiconductor device shown in FIG. 20.

FIGS. 23 through 25 are cross-sectional views showing a manufacturing process of a central part of the semiconductor device shown in FIG. 20. First referring to FIG. 23, the back gate 11 is made. More specifically, a resist mask 15 is formed on a SOI wafer, and an impurity such as boron is ion-implanted into the support substrate 2 of silicon, for example, via the channel region 4 and the insulating film 3. In this manner, a p-type back gate 11 having an impurity concentration from $3 \times 10^{16} \text{cm}^{-3}$ to $1 \times 10^{20} \text{cm}^{-3}$, for example.

The channel region 4 and the dummy region 4a can be made by the method explained with reference to FIG. 1. The dummy region 4a is a region for measuring the impurity concentration of the channel region 4. Therefore, in the manufacturing process, the dummy region 4a is preferably made simultaneously with the channel region 4 under the same condition.

Next made are element separating regions 12 as shown in FIG. 24 by lithography to form the gate electrodes 6, 6a having a gate length L. Further formed on the gate electrodes are insulating films 8, 8a.

Next made is the electrode region as shown in FIG. 25. More specifically, the region for MISFET is masked by a resist mask 15, and boron, for example, is ion-implanted into portions at opposite sides of the gate electrode 6 by the dose amount of $10^{13}$ to $10^{16}$ cm⁻² to form the p-type electrode region 18.

The process for making the electrode region 18 may be done concurrently upon making the source-drain of the p-type MISFET. That is, by ion-implanting boron, for example, after the process of making the gate electrode, the p-type electrode region 18 and the source-drain region 7 can be made simultaneously using the gate electrode as a mask.

Furthermore, boron, for example, is ion implanted into a region different from the electrode region 18 up to the soluble limit of the semiconductor layer to form the high-concentrated semiconductor region 13 (FIG. 25).

The high-concentrated semiconductor region 13 may be made simultaneously by ion implantation for making the electrode region 18 and the source-drain region 7. That is, a region where the gate is not made is prepared, and boron, for example, is injected up to the impurity concentration of the soluble limit for silicon upon ion implantation for making the source-drain region of the p-type MISFET. Thus, the high-concentrates semiconductor region 13 can also be made simultaneously.

Next made are contacts 19 to the back gate 11 as shown in FIG. 20. More specifically, contact holes are formed from above the element separating regions 12 by ion etching, for example, and an electrode material such as tungsten (W) is stacked to form metal contacts 19. The process of making the metal contacts 19 may be done concurrently with the process for making the metal contact in the resistance measuring region shown in FIG. 20 and contacts (not shown) to the gate-source-drain electrodes. upon making these contact holes, by ion etching using a gas having a large etching selectivity between silicon oxide films and silicon, regions different in depth of contact holes can be processed by simultaneous etching.

Next explained is another construction for determining the thickness $t_{si}$ of the SOI film.

Figure 26:
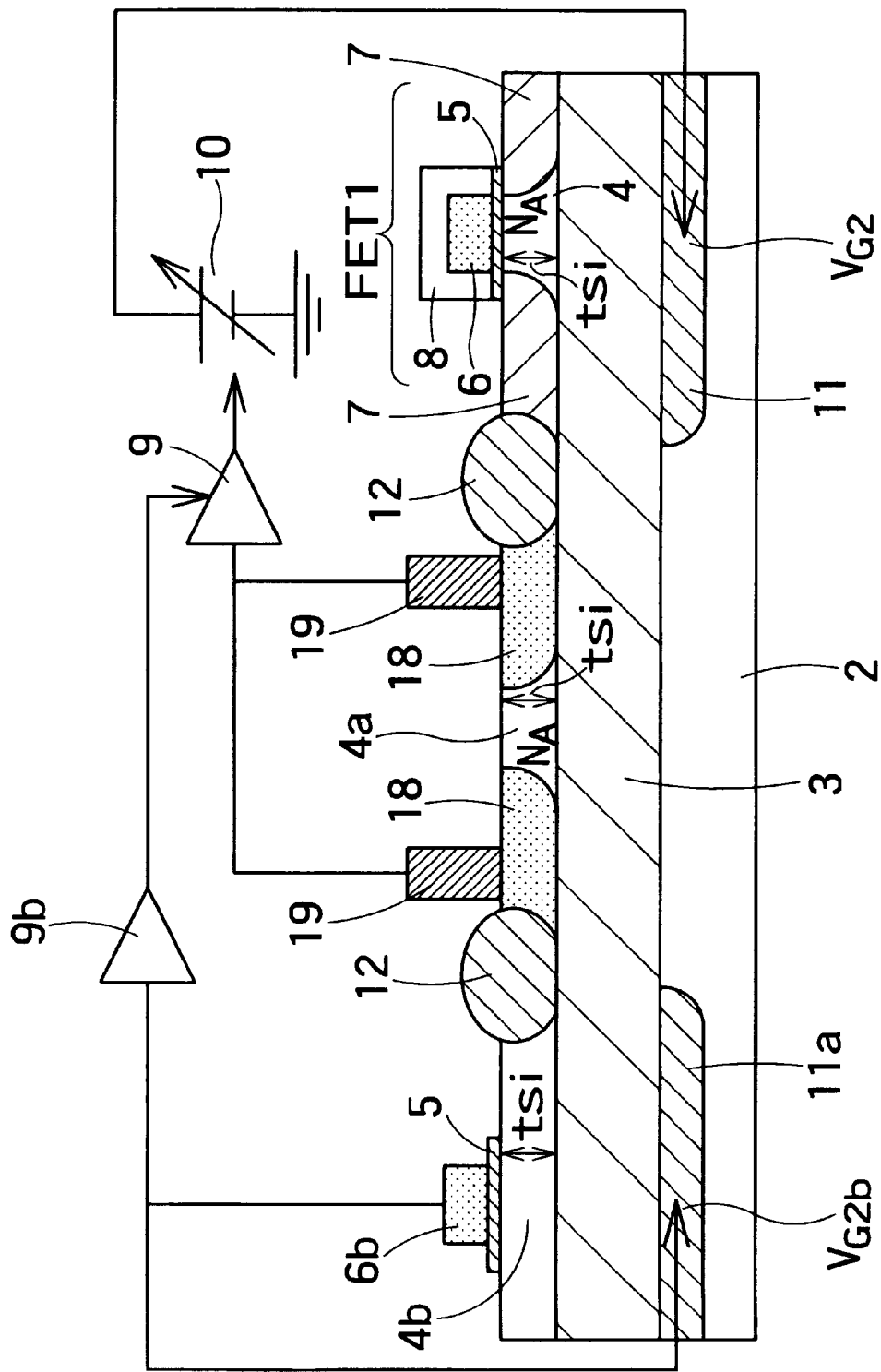
FIG. 26 is a cross-sectional view schematically showing a third example of the semiconductor device according to the invention.

FIG. 26 is a cross-sectional view schematically showing a third example of the semiconductor device according to the invention. In the construction shown here, a dummy region 4b is formed separately from the MISFET transistor 1, and a gate electrode 6b and a back gate 11a are made above and below the dummy region 4b. The, the capacitance between these electrodes is measured.

The back gate 11a is preferably doped with a sufficient amount of impurity by $10^{18}$cm⁻³ or more, for example, to reliably prevent surface depletion in the semiconductor layer along the surface of the back gate. The electrodes 6b and 11a are preferably formed such that the dummy region 4b is fully carrier-freed and an inversion layer is never produced along its surface.

The capacitance $C_{total}$ measured under these conditions is equal to the value obtained by serially connecting capacitance values of the gate insulating film 5, dummy region 4b and insulating film 3. Therefore, the capacitance is expressed as:

$$C_{total} = \frac{1}{\frac{1}{\frac{\varepsilon_{Si}}{t_{Si}}} + \frac{1}{\frac{\varepsilon_{OX}}{t_{OX}}} + \frac{1}{\frac{\varepsilon_{OX}}{t_{box}}}}$$

where $\varepsilon_{OX}$ and $\varepsilon_{Si}$ are dielectric constants of the gate insulating film 5 and the dummy region 4b (i.e., the channel region 4), and $t_{OX}$, $t_{si}$ and $t_{box}$ are thicknesses of the gate insulating film 5, dummy region 4b and insulating film 3, respectively. As a result, once the thickness $t_{OX}$ of the gate insulating film 5 and the thickness $t_{box}$ of the insulating film 3 are obtained, and if the capacitance values of the gate insulating film 5 and the insulating film 3 are already known, the thickness $t_{si} = \varepsilon_{Si}/C_{total} - \varepsilon_{Si}(t_{OX}+t_{box})/\varepsilon_{OX}$ of the dummy region 4b (i.e., the channel region 4) can be calculated.

Alternatively, $t_{si}$ can be obtained by using a detector element made on the left side (in the drawing) of the semiconductor device shown in FIG. 29 which will be explained in greater detail. That is, in FIG. 29, the capacitance Ctotal is measured between the $n^+$ layer 16 and the back gate 11b. Here, the voltage source 10b is supplied with enough voltage to make an inversion layer along the interface between the gate insulating film 5b and the SOI layer 4a. Additionally, under the conditions where the portion of the dumy region 4a nearer to the back gate is carrier-freed by applying enough voltage to the back gate, the capacitance $C_{total}$ measured here is expressed as:

$$C_{total} = \frac{\frac{\varepsilon_{Si}}{t_{Si}} \frac{\varepsilon_{OX}}{t_{box}}}{\frac{\varepsilon_{Si}}{t_{Si}} + \frac{\varepsilon_{OX}}{t_{box}}}$$

Therefore, if tbox is known, $t_{si}$ can be calculated. According to this method, $t_{si}$ can be calculated accurately even upon fluctuation of tox.

For obtaining the specific resistance, a four-terminal method separating voltage current terminals may be used. This method is advantageous in reducing errors caused by contact resistance of electrodes.

Next explained is a manufacturing method of the semiconductor device shown in FIG. 26.

Figure 27:
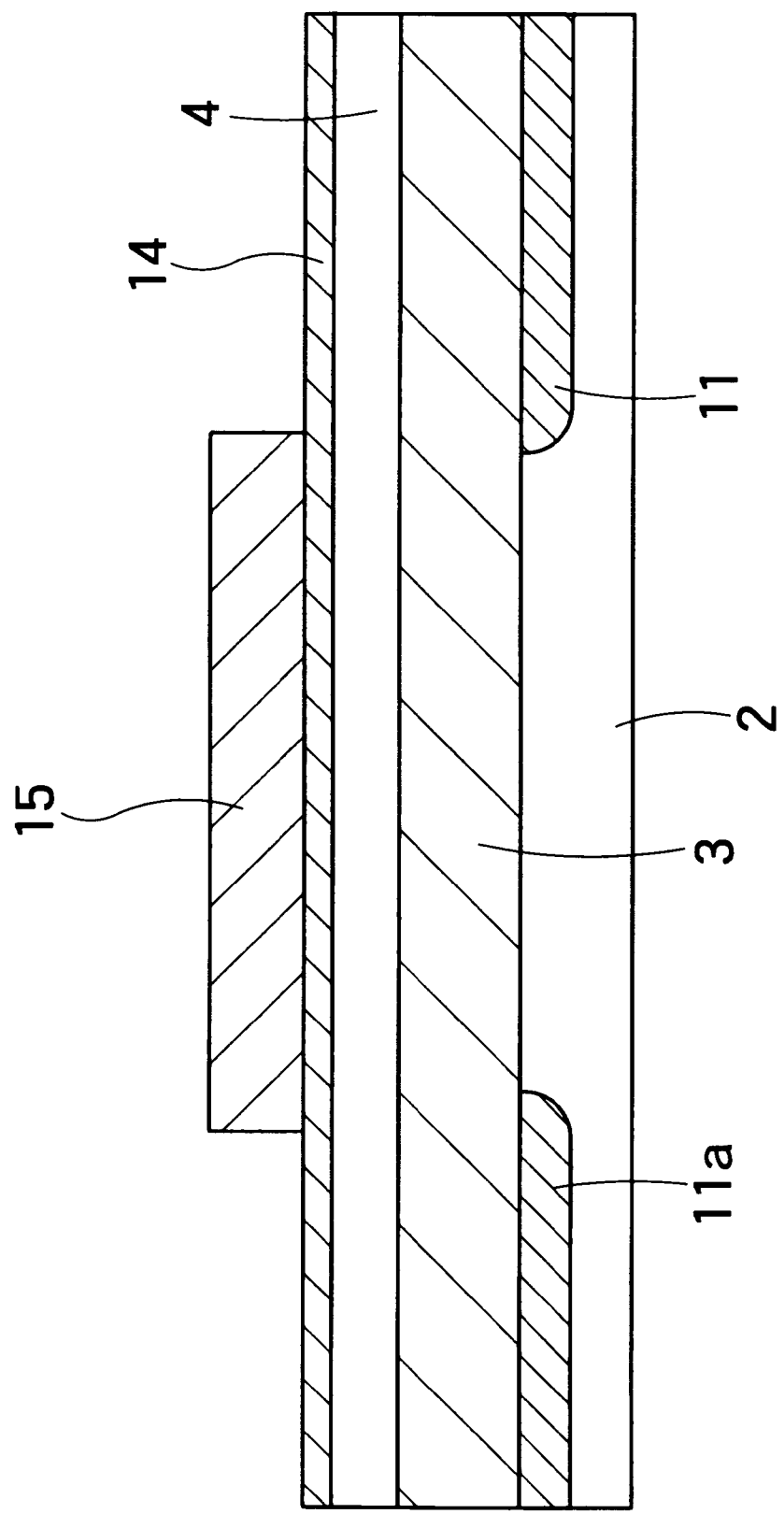
FIG. 27 is a cross-sectional view schematically showing a manufacturing process of a central part of the semiconductor device shown in FIG. 26.
Figure 28:
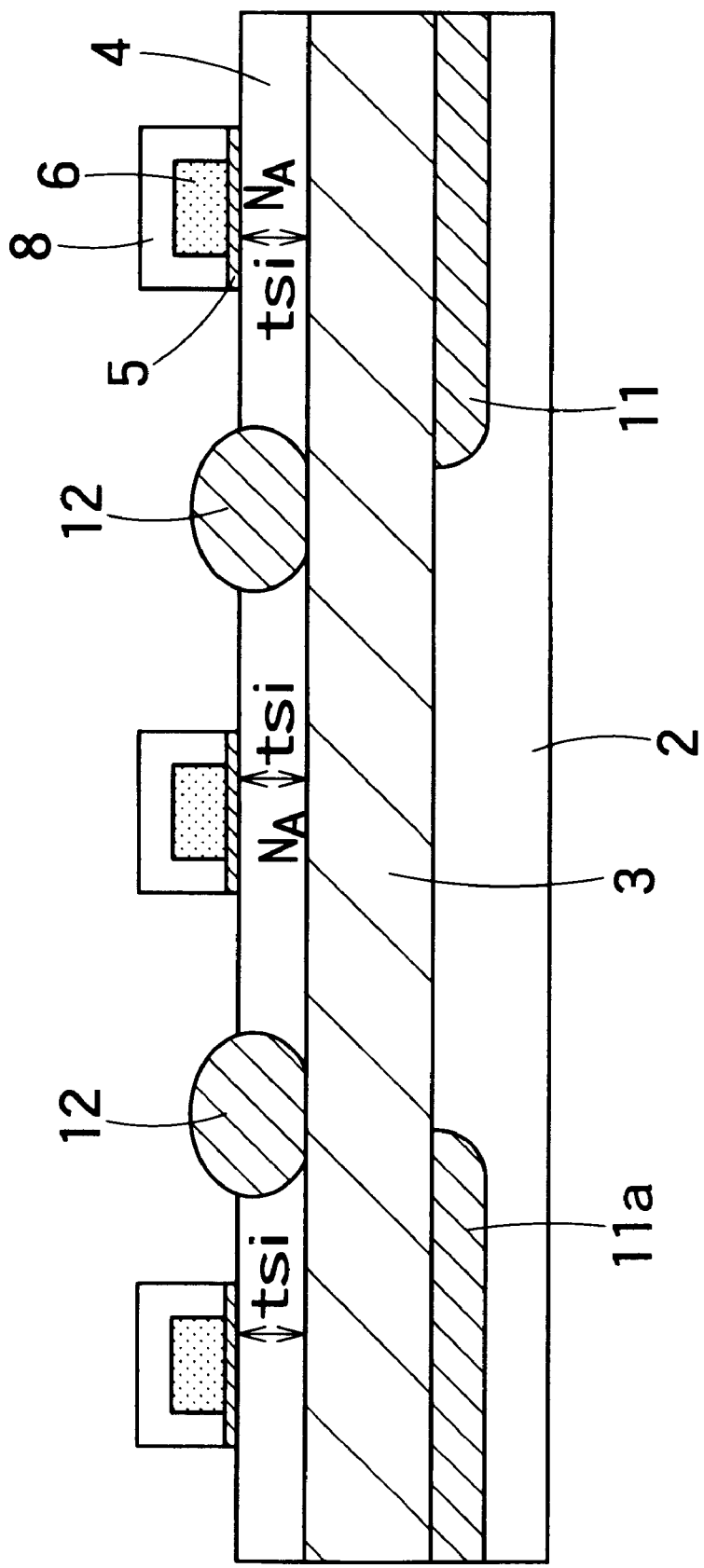
FIG. 28 is a cross-sectional view schematically showing a manufacturing process of a central part of the semiconductor device shown in FIG. 26.

FIGS. 27 and 28 are cross-sectional views schematically showing a manufacturing process of a central part of the semiconductor device shown in FIG. 26. By lithography and ion implantation of boron, for example, p-type back gates 11, 11a having an impurity concentration from $3 \times 10^{16} cm^{-3}$ to $1 \times 10^{20} cm^{-3}$, for example, are made in regions of the support substrate 2 of silicon, for example, in alignment with regions for MISFET and for measuring the capacitance via the insulating film (FIG. 27). Here again, the channel region 4 and the dummy region 4b can be made by the manufacturing process as explained with reference to FIG. 1.

After that, element separating regions 12 are made, and gate insulating films 5 and gate electrodes 6 are formed, as shown in FIG. 28. Subsequently, the electrode region 18 and the source-drain region 7 are made as shown in FIG. 26. To make them, the same method as explained with reference to FIG. 20 can be used. In case of the example shown in FIG. 15, for measuring the capacitance of the dummy region 4b, it is sufficient to ensure that the semiconductor layer under the gate electrode 6b be carrier-freed sufficiently. Therefore, since the gate electrode 6b serves as a mask, no particular masking with a resist, for example, is required on regions for the electrode region 18 and the source-drain region 7 upon ion implantation thereto.

Next explained is a fourth example of the semiconductor device according to the invention.

Figure 29:
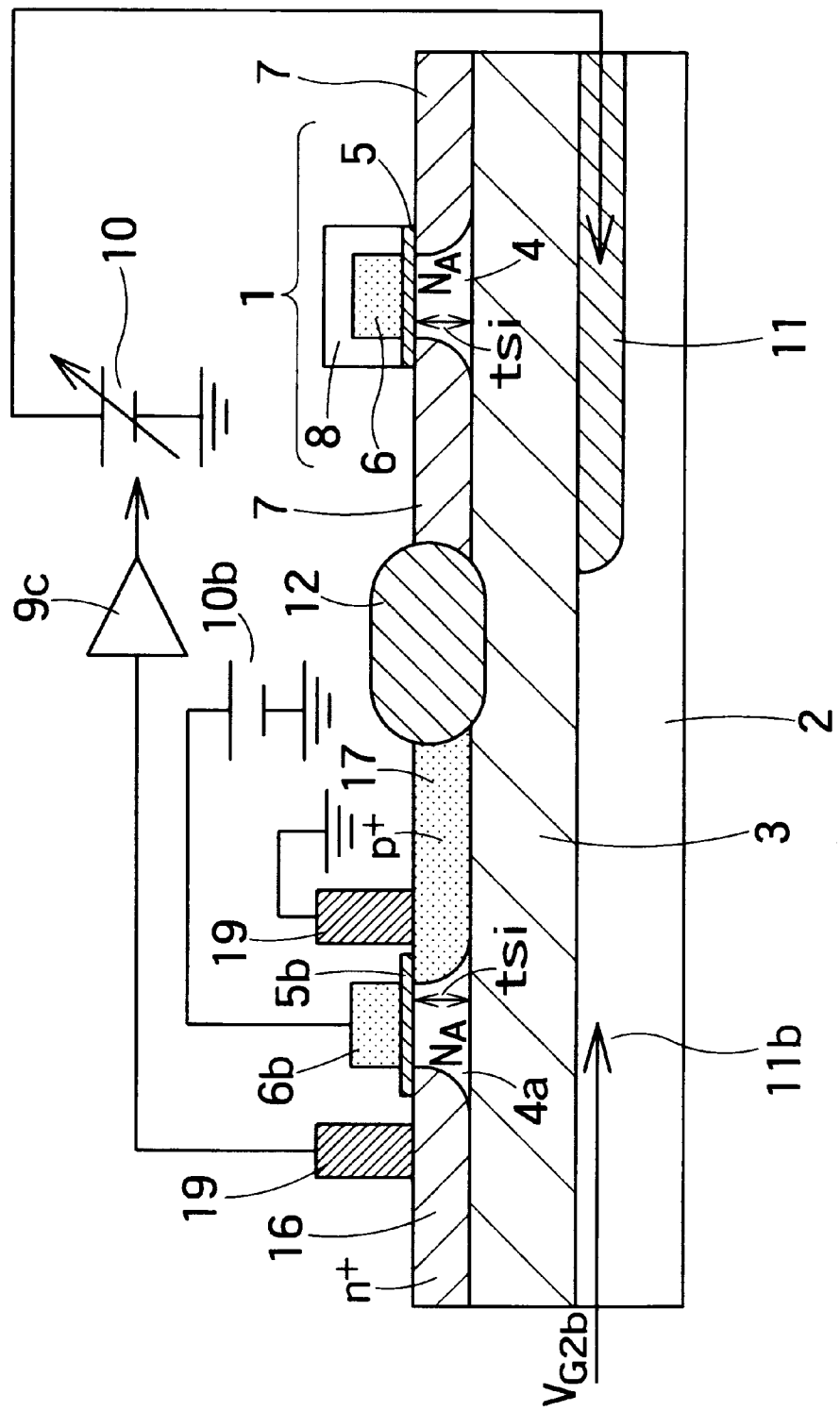
FIG. 29 is a cross-sectional view schematically showing a fourth example of the semiconductor device according to the invention.

FIG. 29 is a cross-sectional view schematically showing the semiconductor device as the fourth example. That is, in the semiconductor device shown here, the impurity concentration can be obtained by a C-V measurement method using a detector element for a MIS capacitor provided in addition to the MISFET1. An insulating film 5b is stacked on the dummy region 4a adjacent to FET1 via the element separating region 12, and $p^+$-type polysilicon (polycrystalline silicon) 6b, for example, is stacked thereon as a MIS capacitor electrode.

A voltage source $V_{G2b}$ is made for the back gate 11 made below the MIS capacitor in addition to the voltage source used for the MISFET transistor. The voltage source $V_{G2b}$ may be a fixed power source applied with a voltage ensuring that the electron state along the surface in contact with the insulating film 3 in the dummy region 4a exhibits accumulation.

By using the MIS capacitor shown here, the impurity concentration of the semiconductor is obtained by C-V method, and the back gate voltage required to realize the present invention can be determined. The capacitance is measured by applying the fixed gate voltage to a degree not fully carrier-freeing the dummy region 4a and using the electrodes in the $n^+$-type and $p^+$-type semiconductor regions provided near the gate.

Since the capacitance hereupon is proportional to $(N_A)^{1/2}$ where the impurity concentration is $N_A$, $N_A$ can be obtained from the capacitance.

Figure 30:
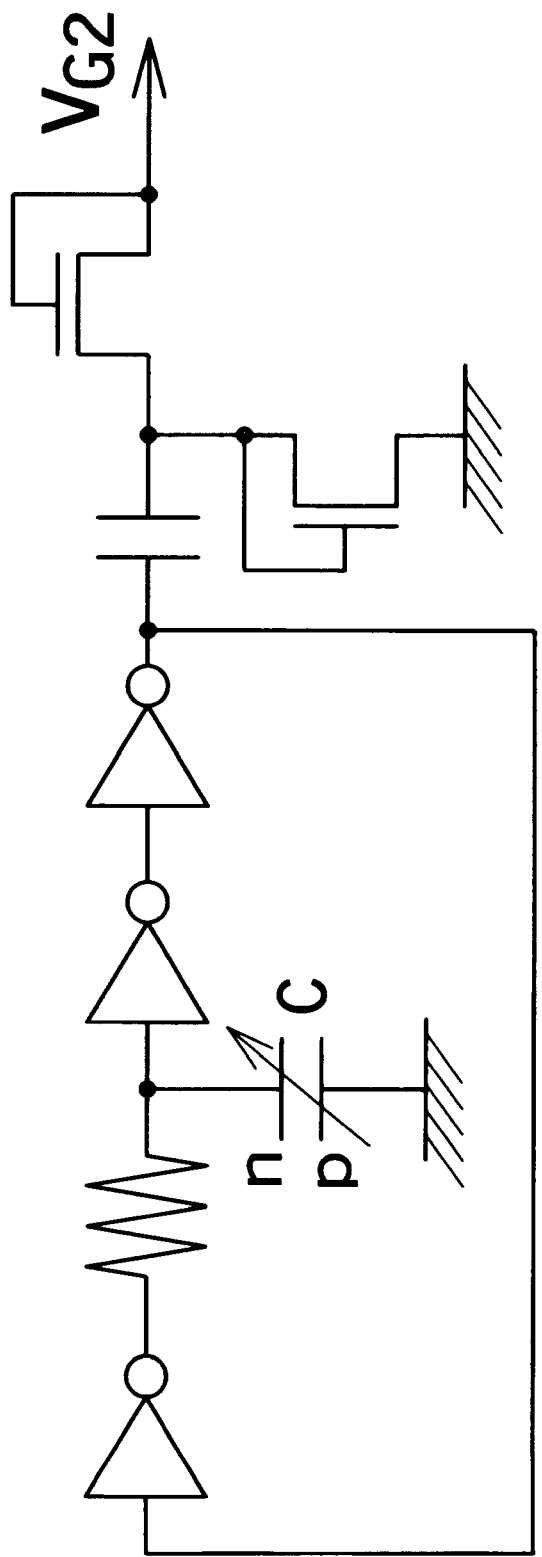
FIG. 30 is a circuit diagram schematically showing an example of circuits 9c and 10b.

FIG. 30 is a schematic circuit diagram showing an example of the circuits 9c and 10b. The circuit shown here is similar to the circuit of FIG. 11, for example, and capacitance C by the MIS capacitor of the detector element is incorporated into a ring oscillator. When the impurity concentration of the dummy region 4a varies, capacitance C varies, and the frequency of the ring oscillator varies. By changing the frequency, the back gate voltage can be changed.

Next explained is a manufacturing method of the semiconductor device shown in FIG. 29.

Figure 31:
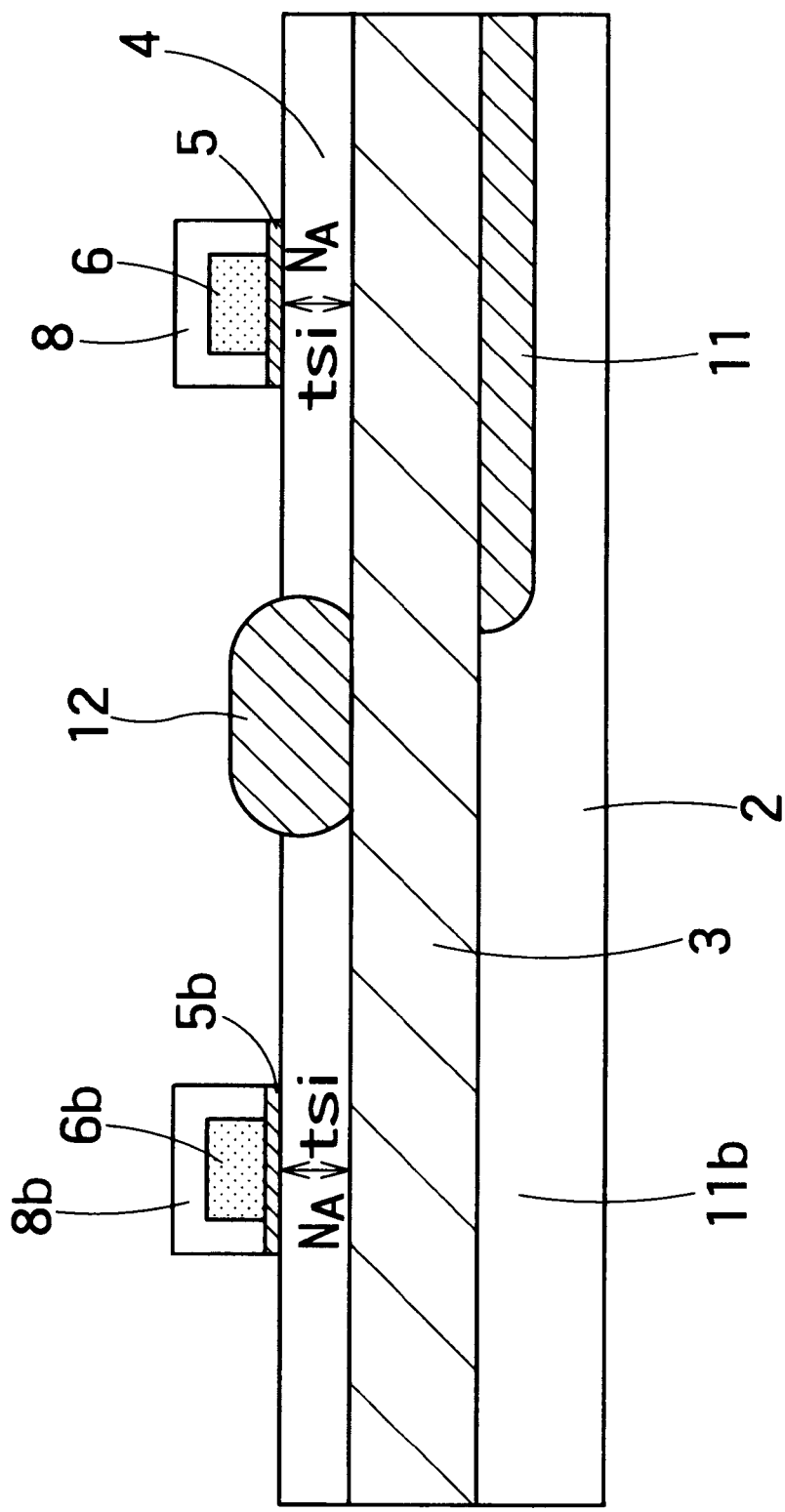
FIG. 31 is a cross-sectional view schematically showing a manufacturing process of a central part of the semiconductor device shown in FIG. 29.
Figure 32:
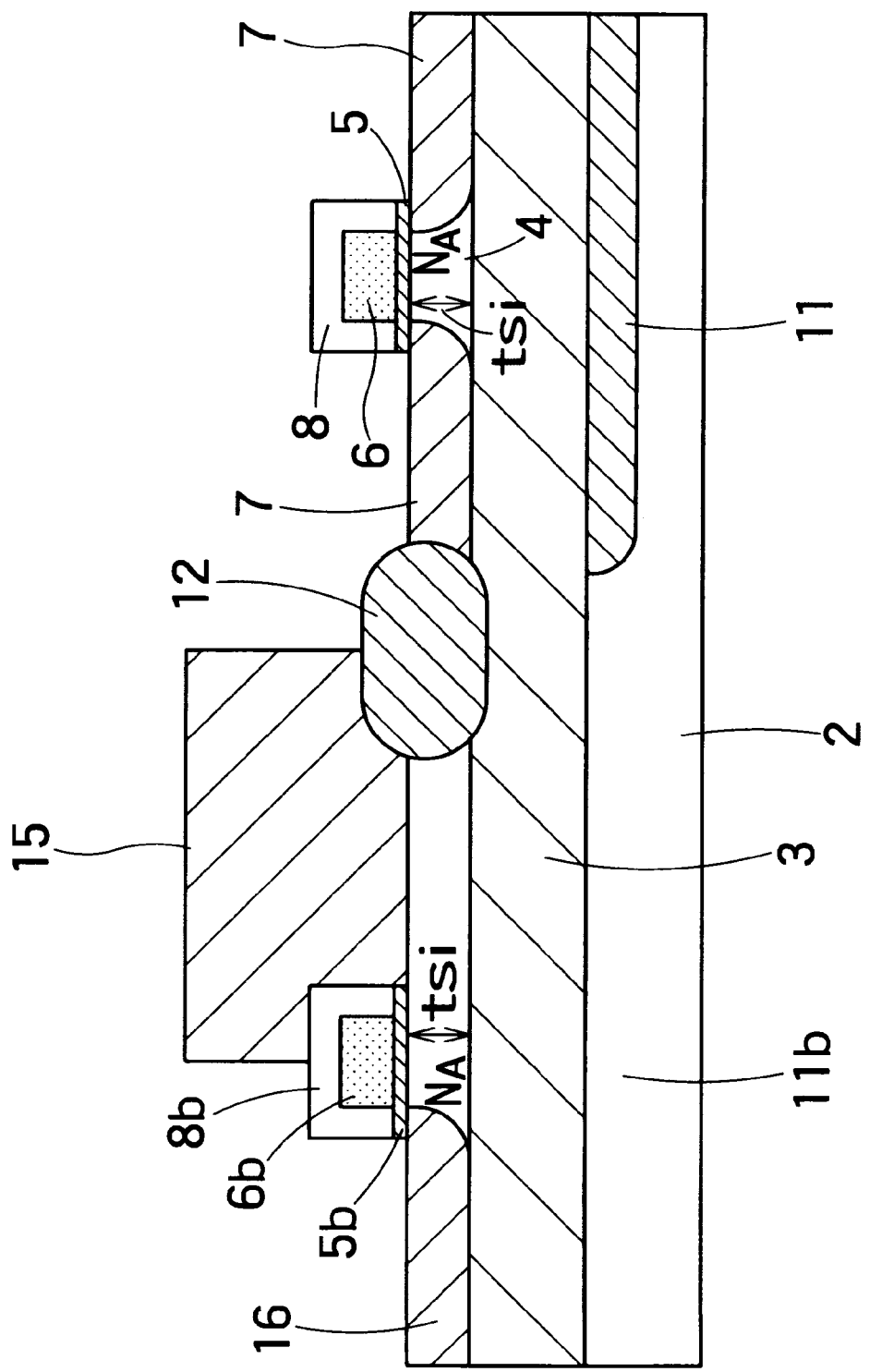
FIG. 32 is a cross-sectional view schematically showing a manufacturing process of a central part of the semiconductor device shown in FIG. 29.

FIGS. 31 and 32 are cross-sectional views schematically showing a manufacturing process of a central part of the semiconductor device shown in FIG. 29. First referring to FIG. 31, a back gate 11b other than the MISFET transistor is formed in a region that is, for example, adjacent to the region for the MISFET transistor. Thereafter, in the same process as the gate process, a gate insulating film 5b made of silicon oxide, for example, and a gate electrode 6b made of n-type polysilicon are made to form a MIS capacitor. They may be made simultaneously with the process for making the gate of MISFET1 (FIG. 31).

Next formed are $n^+$-type and $p^+$-type semiconductor regions near the gate electrode of the MIS capacitor. That is, for ion implantation for making source-drain regions 7 of n-type and p-type MISFETs, ions may be injected into the MIS capacitor region to one side and to the other side thereof (FIG. 32).

For measurement of the impurity concentration using C-V method, there is also another method for obtaining it from a p-n junction.

Figure 33:
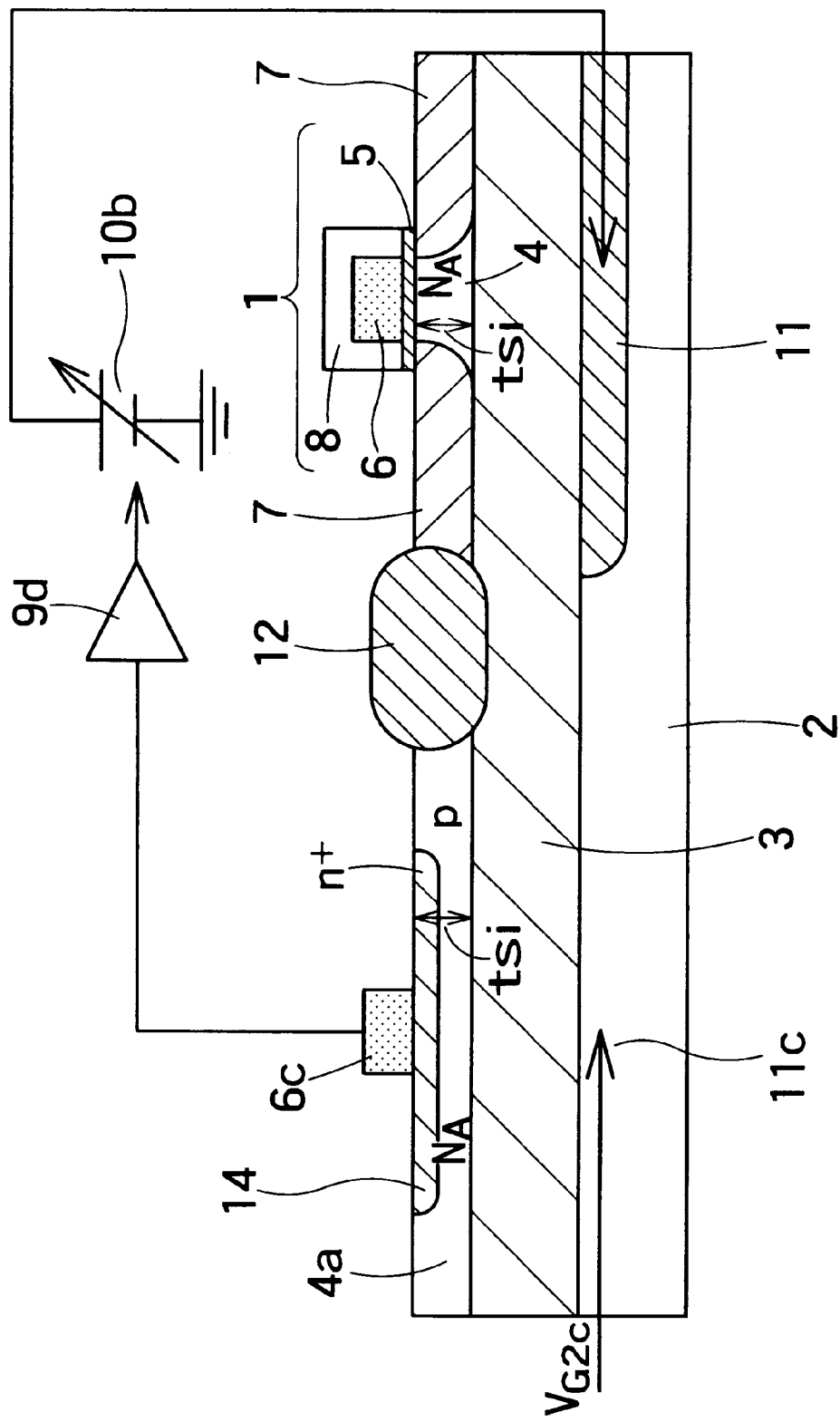
FIG. 33 is a cross-sectional view schematically showing a semiconductor device including a detector element for measuring impurity concentration from a p-n junction.

FIG. 33 is a cross-sectional view schematically showing a semiconductor device including a detector element for measuring the impurity concentration through a p-n junction. That is, a n+-type silicon region 14 is made on the surface layer of the dummy region 4a adjacent to FET1 via the element separating region 12. Using the p-n junction made in this manner, the impurity concentration is measured by C-V method, and the back gate voltage required to realize the invention can be determined. Here, a sufficiently large negative voltage $V_{G2}$a is applied to the back gate 11 c in alignment with the dummy region 4a via the insulating film 3 to change the electron state along the surface in contact with the insulating film 3 into an accumulation state.

Figure 34:
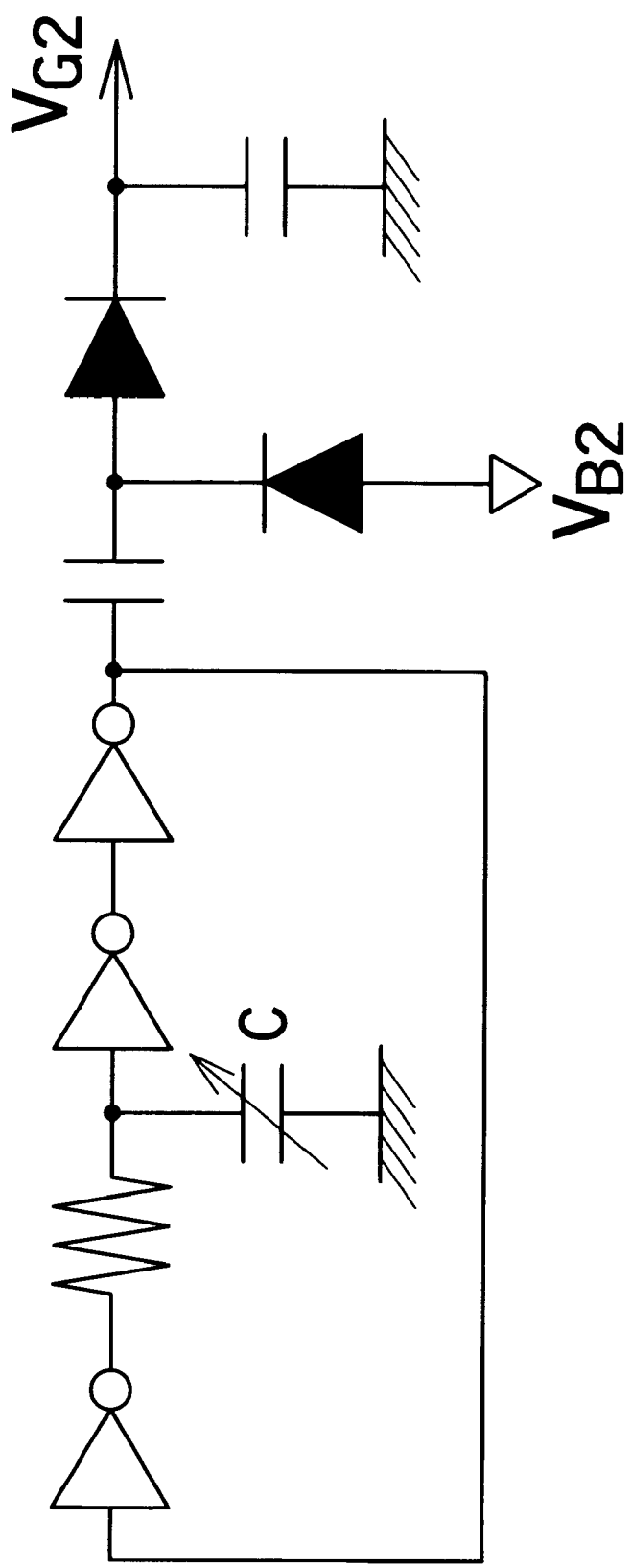
FIG. 34 is a circuit diagram schematically showing an example of circuit 9d and 10b including the detector element shown in FIG. 33.

FIG. 34 is a schematic circuit diagram of an example of the circuits 9d, 10b including the detector element of FIG. 33. Capacitance C in the circuit of FIG. 34 is a capacity measured at the electrode 6b. the diode capacitance of the p-n junction diode in the dummy region as shown in FIG. 33 varies with impurity concentration. When the capacitance C changes in this manner, the frequency of the ring oscillator changes, and the back gate voltage $V_{G2}$ can be fed back. If the capacitance C is small, the pumping frequency increases, and $V_{G2}$ rises. Although needless to say, a Schottky junction, for example, may be used instead of the p-n junction.

Next explained is a fifth example of the invention.

Figure 35:
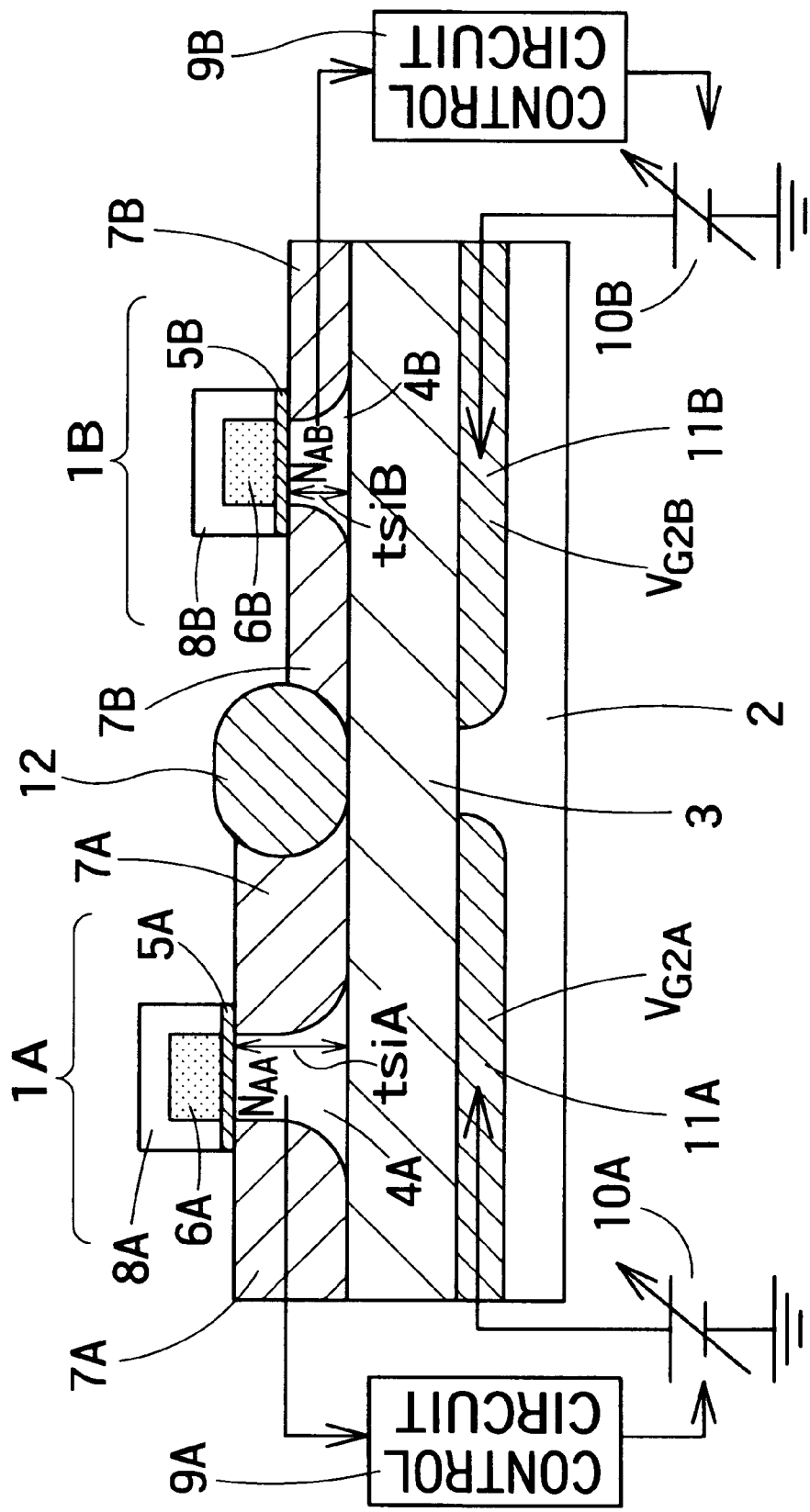
FIG. 35 is a cross-sectional view schematically showing a semiconductor device taken as a fifth example of the invention.

FIG. 35 is a cross-sectional view schematically showing a semiconductor device according to the fifth example of the invention. In the embodiment shown here, two or more fully depleted transistors different in threshold value are formed on a common substrate such that threshold values of respective transistors are minimum in sensitivity to fluctuation of the film thickness and become fixed threshold values.

To simplify the explanation, the example is shown in FIG. 35 as having two fully depleted transistors different in thickness of the channel region 4 and impurity concentration and aligned in parallel. However, it is sufficient for them to be formed on the insulating substrate 3 and they need not closely aligned in the direction shown here.

The embodiment shown here includes at least two fully depleted transistors 1A and 1B different in threshold value on a common substrate. More specifically, a SOI layer having a thickness around 1 nm to 0.1 μm, a channel region 4A which may be 40 nm thick, for example, and a channel region 4B, 20 nm thick, are formed on the insulating film 3 of silicon oxide, for example, on the support substrate 2 made of silicon, for example. Their impurity concentrations are within the range from $3 \times 10^{16} cm^{-3}$ to $1 \times 10^{19} cm^{-3}$, approximately, and they are different impurity concentrations $N_{AA}$, $N_{AB}$ such as $1.3 \times 10^{17} cm^{-3}$ and $2.0 \times 10^{17} cm^{-3}$, for example. In locations of the support substrate 2 opposed to the SOI layer forming MISFETs 1A and 1B via the insulating film 3, back gates 11A, 11B are formed to give different potentials to associated MISFETs. Additionally, control circuits 9A, 9B are formed to fix back gate voltages responsive to impurity concentrations of the channel regions 4A, 4B, respectively, and variable power sources 10A, 10B are provided to feed the electrodes 11A, 11B.

Explanation is made here by using the model explained with reference to FIG. 2. As shown in FIGS. 9 through 17 and by Equation (11), the optimum region, that is, design value, of the channel region 4 minimizing the sensitivity of the threshold value to fluctuation of the SOI thickness and adjusting the threshold value to the fixed value is definitely determined by the threshold value. That is, if a different threshold value is fixed, the optimum thickness of the semiconductor minimizing the sensitivity of the threshold value to fluctuation of the SOI film thickness becomes a different value.

If the result of calculations shown in FIGS. 9 through 17 and Equation (11), when fully depleted transistors minimizing fluctuation of two threshold values, 0.1V and 0.2V, are formed on a common substrate whose $t_{box}$=20 nm and $t_{OX}$=3 nm, the channel regions 4 need thicknesses of 40 nm and 20 nm, respectively, and impurity concentrations of $1.3 \times 10^{17} cm^{-3}$ and $2.0 \times 10^{17} cm^{-3}$, respectively, and two transistors cannot be made with a common thickness and a common impurity concentration. That is, by setting different values of the SOI film thickness and impurity concentration for respective transistors, it is possible to realize transistors which do not easily vary in threshold value with fluctuation of the SOI film thickness.

In the case where the fixed threshold value of FET1A is smaller than that of the FET1B, a channel region 4A with a thick SOI film thickness ($t_{si\ A}$) and a low impurity concentration ($N_{AA}$) and a channel region 4B with a thin SOI film thickness ($t_{si\ B}$) and a high impurity concentration ($N_{AB}$) are preferably made on a common substrate to minimize sensitivities of threshold values of respective FETs.

Additionally, it is preferable to provide back gate electrodes and detector elements, not shown, which can set potentials independently from each other in a plurality of regions different in thickness and impurity concentration of the channel regions. That is, impurity concentrations and film thicknesses of respective regions are measure by using these detector elements, then the results of measurement are fed back, and predetermined back gate voltages are applied to respective FETs. Thus, the threshold values of respective FETs can be adjusted to predetermined values. Detector elements therefor may be those shown in FIGS. 9, 15, 18 or 22, for example. Also, circuits for measurement and circuits for applying back gate voltages may be any of various examples shown in this specification.

Also when an n-type MISFET and a p-type MISFET are made on a common substrate, this embodiment can be used. That is, n-type MISFET, for example, as FET1A shown in FIG. 24 and p-type MISFET, for example, as FET1B may be used. Usually, there is a difference between n-type MISFET and p-type MISFET in terms of difference in work function between the gate electrode and the substrate and in electric charge along the interface of the gate insulating film. Therefore, they are different also in absolute value $|V_{FB}|$ of their flat band voltages. As a result, even if a common threshold value is fixed, n-type MISFET and p-type MISFET are different also in SOI film thickness for minimizing the sensitivity of the threshold value to fluctuation of the SOI film thickness. That is, as shown in FIG. 24, by using optimum SOI film thicknesses for respective transistors FET 1A and FET 1B, sensitivities of their threshold value can be held small.

Next explained is a manufacturing method of the semiconductor device shown in FIG. 35.

FIGS. 36A and 36B are cross-sectional views schematically showing a manufacturing process of a central part of the semiconductor device shown in FIG. 35. Upon making this structure, back gates 11A, 11B are formed in the SOI substrate as shown in FIG. 36A by lithography and ion implantation so that different potentials can be applied to respective MISFETs. The SOI layer on the insulating film 3 is thinned to 40 nm, for example, by polishing, dry etching or wet etching, and boron (B), for example, is ion-implanted thereto to form the SOI layer 4 with the impurity concentration of $1.3 \times 10^{17} cm^{-3}$, for example.

After that, a resist mask 15 is applied, and the channel region 4B, 20 nm thick, for example, is made by etching. Subsequently, boron (B), for example, is ion-implanted into the channel region 4B to adjust the impurity concentration $N_{AB}$ of this region to $2.0 \times 10^{17} cm^{-3}$, for example.

Thereafter, through the gate step and subsequent steps not shown, fully depleted transistors FET1A, FET1B can be made on the common substrate. Additionally, detector elements, not shown, are made appropriately for respective channel regions. Furthermore, by making circuits 9A, 9B for controlling back gate voltages in response to impurity concentrations of SOI layers forming MISFETs and providing variable power sources 10A, 10B for feeding the back gates 11A, 11B, the semiconductor device is completed.

Next explained is a sixth example of the invention.

Figure 37:
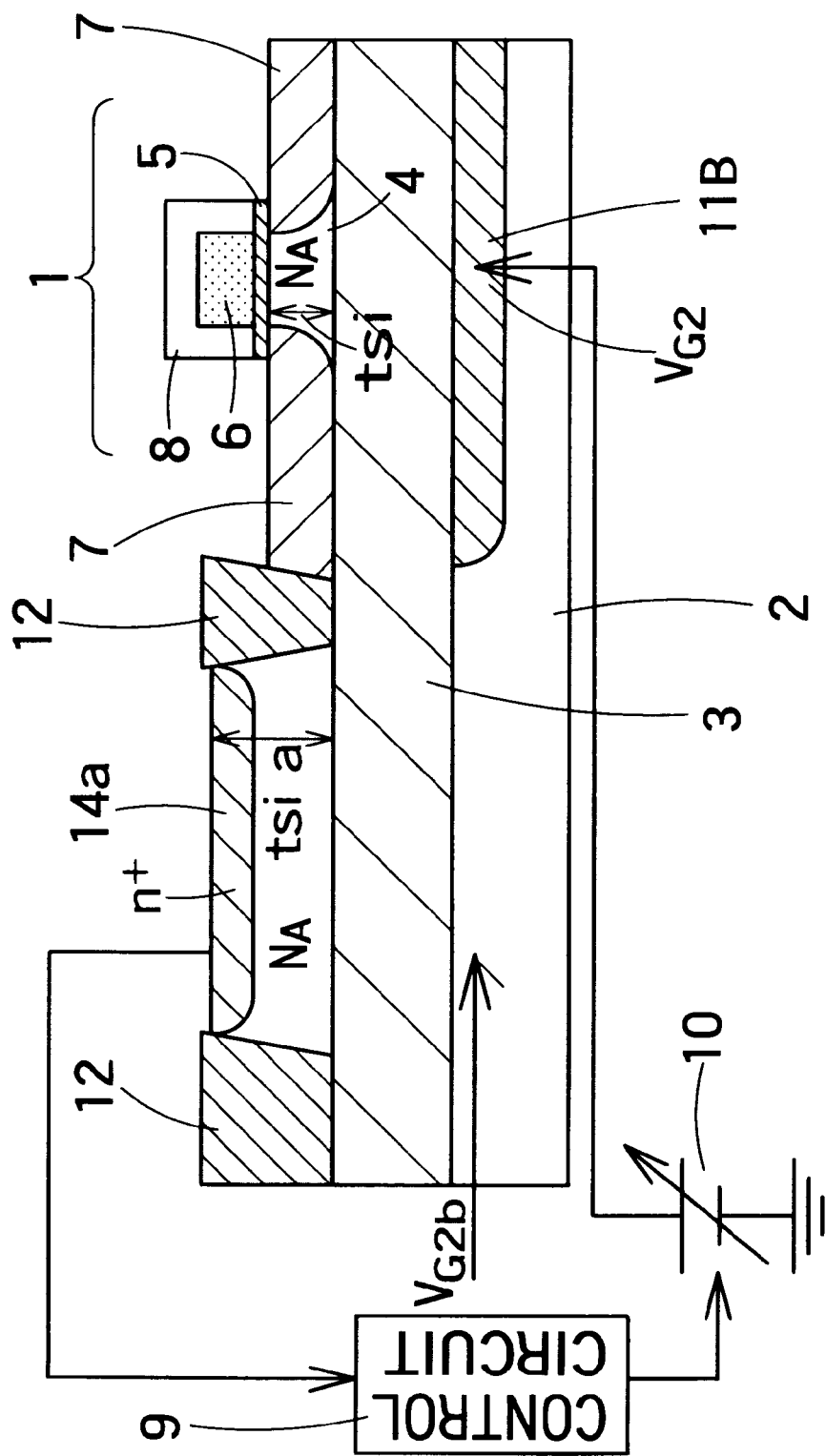
FIG. 37 is a cross-sectional view schematically showing a semiconductor device taken as a sixth example of the invention.

FIG. 37 is a cross-sectional view schematically showing a semiconductor device as the sixth example of the invention. The example shown here is characterized in making FET1 on a thin SOI layer and a detector element for measuring the impurity concentration on a thick SOI layer.

The detector element has a p-n junction and can measure the impurity concentration by using c-V method. Details of its structure and the method of measurement may be the same as those explained with reference to FIG. 33. When the p-n junction is made on the thinner SOI layer, positional control of the junction is not easy, and there is the possibility that the p-type layer is lost by punch-through of ion-implanted phosphorus (P) or arsenic (As). There is also the possibility that the depletion layer of the p-type layer extends into the back gate region and disables measurement of $N_A$. In contract, the example shown here, permitting the p-n junction to be made in the region with the thicker SOI layer, is advantageous in much more facilitating fabrication of the p-n junction, providing the region for the p-type layer, and so forth.

Its manufacturing process is briefly explained below. First made is a SOI layer made of p-type silicon that is 40 nm thick and has the impurity concentration of $1.3 \times 10^{17} cm^{-3}$, for example. After that, by patterning and etching, the thickness of the SOI layer in location for a transistor is adjusted to 20 nm, for example. After that, boron (B), for example, is ion-implanted to adjust the impurity concentration of the SOI layer to $2.0 \times 10^{17} cm^{-3}$, for example. Furthermore, the gate process and subsequent processes are conducted for the region where the MISFET should be made.

Figure 38:
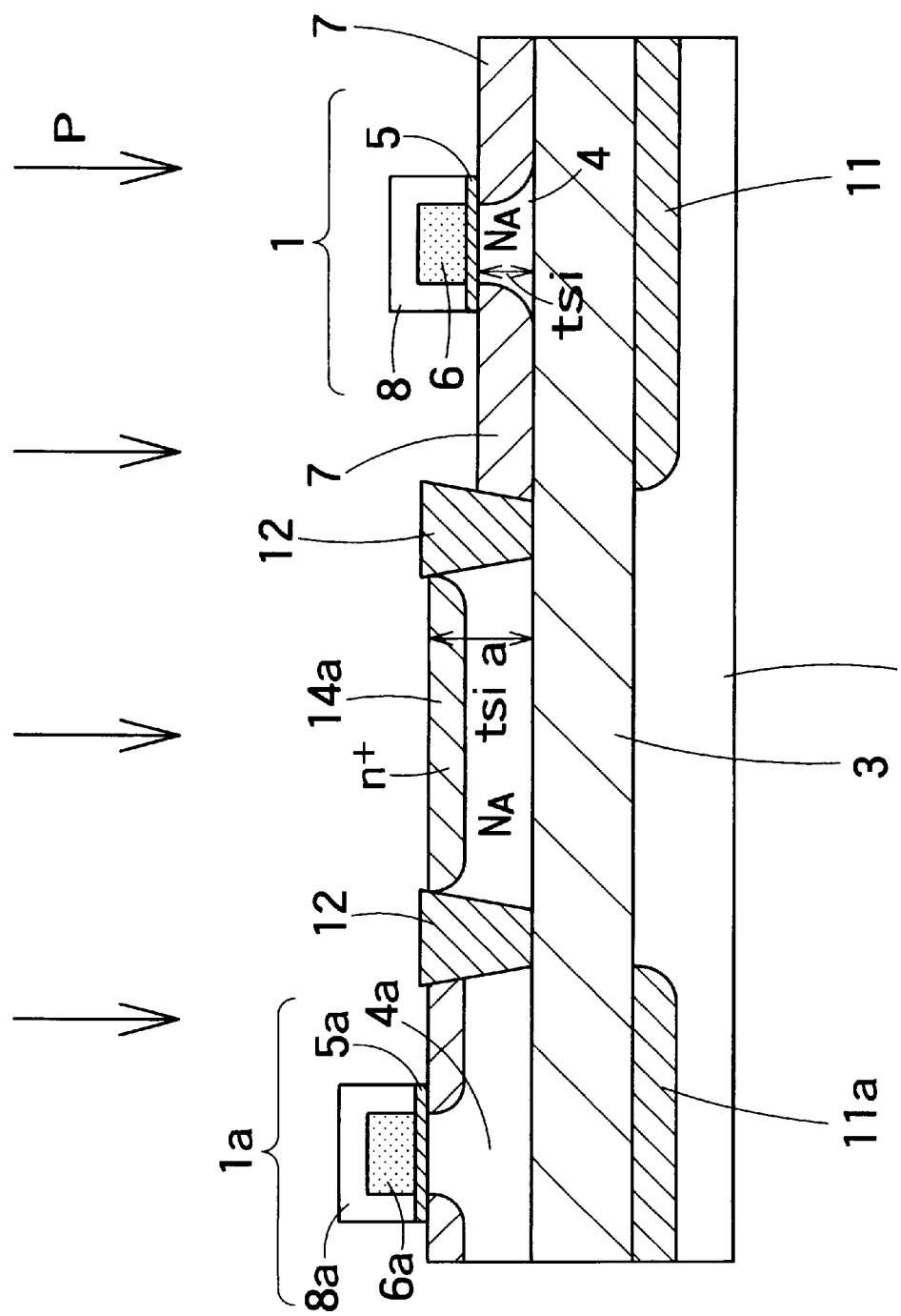
FIG. 38 is a cross-sectional view schematically showing a process for ion-implanting phosphorus (P)

Thereafter, as shown in FIG. 38, phosphorus (P), for example, is ion-implanted into the region for the defector element to make a p-n junction. This process of ion implantation may be common to the process of making the source-drain region 7 of the n-type MISFET.

As another method for making the SOI regions different in thickness as shown in FIGS. 35 and 37, LOCOS (local oxidation of silicon) sacrificial oxidation can be employed.

FIGS. 39A and 39B are cross-sectional views of a device under different steps of a manufacturing process, which explain a technique for making a thin SOI region by using a recess structure by LOCOS sacrificial oxidation. In this method, a silicon oxide film 14 is first made on a SOI layer 4a, and a film 20 of silicon nitride is next stacked on the entire surface of the silicon oxide film 14. Then, as shown in FIG. 39A, an opening is made in a channel region of the silicon nitride film 20, which should be thinned. Thereafter, ions are implanted into the SOI layer below the opening to get a predetermined impurity concentration through annealing.

After that, as shown in FIG. 39B, the surface layer is thermally oxidized until the thickness of the SOI layer below the opening decreases to a predetermined thickness. Then, by removing the silicon nitride film 20 and the silicon oxide film 14, the SOI region having a reduced thickness and a predetermined impurity concentration can be obtained.

Thereafter, through the process of making the gate and subsequent processes, not shown, the semiconductor device can be completed.

Figure 40:
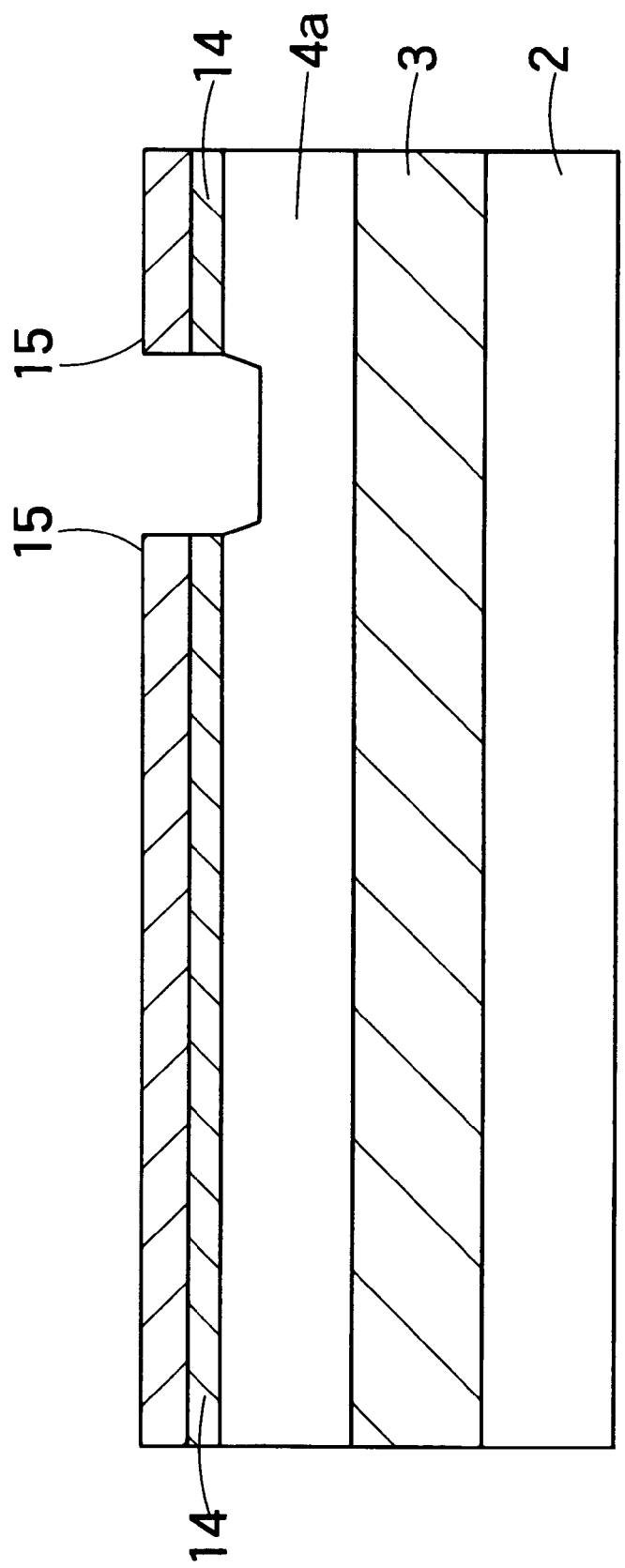
FIG. 40 is a cross-sectional view schematically showing a concave structure.

The above explanation has been directed to a recess structure by LOCOS sacrificial oxidation as a method for thinning the channel portion of the SOI layer. However, the same purpose can be attained by employing a concave structure as shown in FIG. 40 in which the SOI layer in the channel region is thinned by lithography and etching.

Next explained is a seventh example of the invention. For the purpose of establishing a predetermined threshold value and reducing fluctuation in threshold value with varieties in the manufacturing process, the foregoing examples have been explained as using a technique for providing a measuring detector element for measuring the impurity concentration or the carrier concentration and a control circuit for determining the back gate voltage in response to the impurity concentration or the carrier concentration measured by the measuring detector element on a common substrate where the fully depleted transistor is made. In contrast, the example shown here realizes a semiconductor device that includes a storage element which stores an impurity concentration or a carrier concentration previously measured by a measuring detector element.

Figure 41:
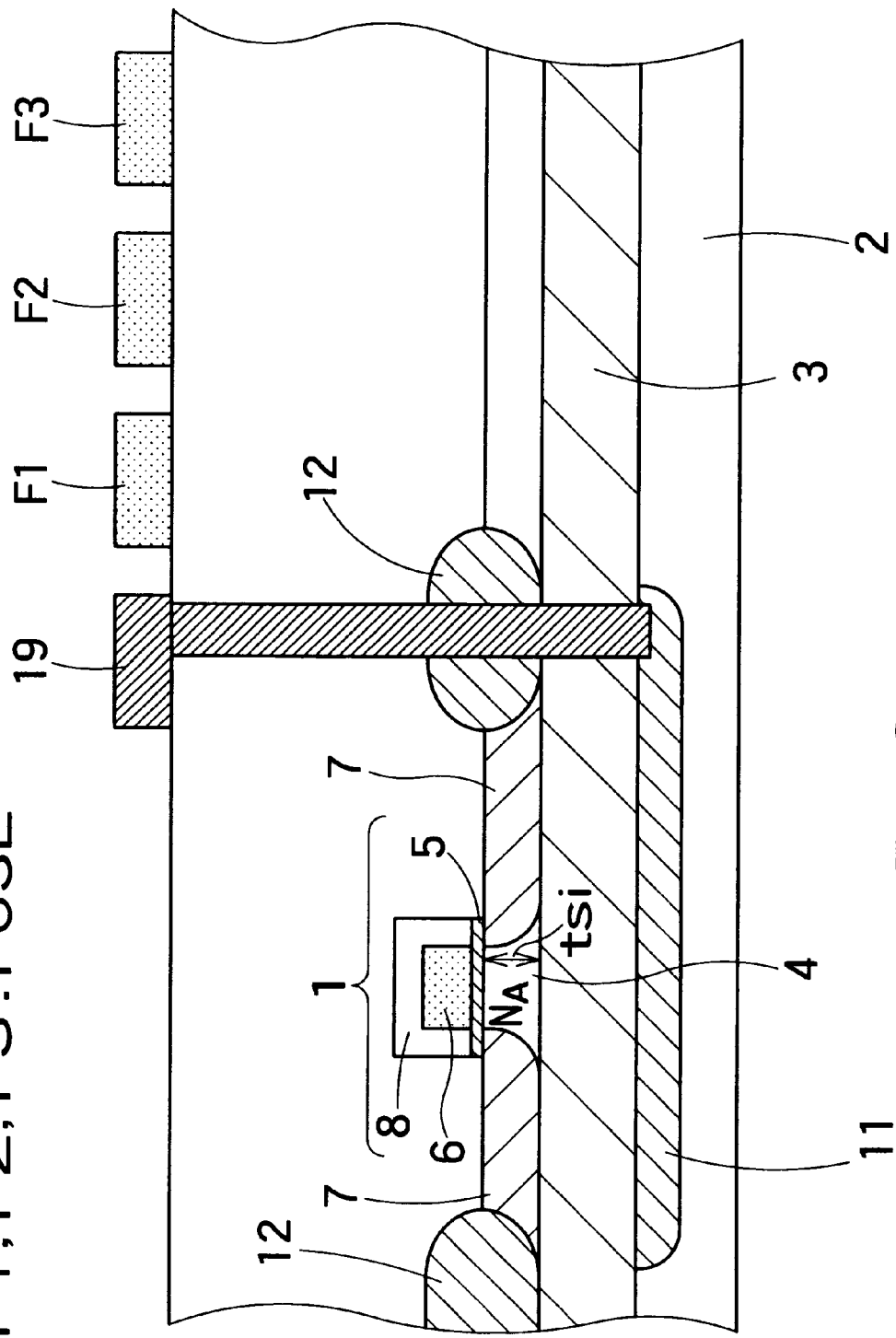
FIG. 41 is a cross-sectional view of a central part of a semiconductor device taken as a seventh example of the invention.
Figure 42:
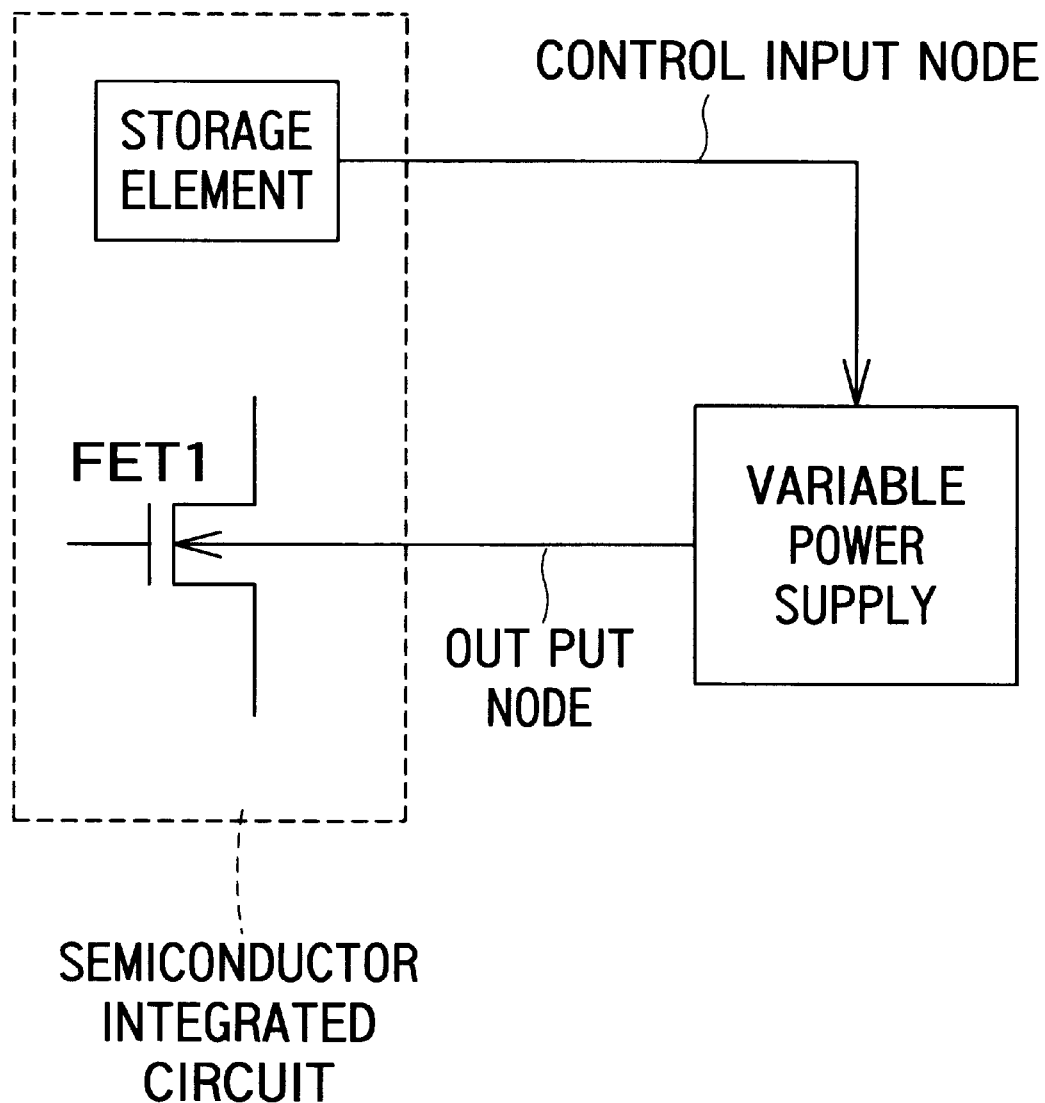
FIG. 42 is a block diagram functionally explaining relations among respective components in the seventh example.

FIG. 41 is a cross-sectional view of a central part of the semiconductor device according to the example. FIG. 42 is a block diagram functionally explaining relations among respective components in this example. In FIGS. 41 and 42, the same components as those of the foregoing examples are labeled with common reference numerals, and their detailed explanation is omitted. Also in this example, there is provided a fully depleted transistor FET1 which includes a channel region having a SOI film thickness and a impurity or carrier concentration determined to reduce the threshold value sensitivity for a predetermined threshold value (for example, values satisfying the relations shown in FIGS. 9 through 17), and a back gate 11. This example further includes a storage element for storing information on impurity or carrier concentration for determining the back gate voltage to be applied to the back gate 11. The storage element is characterized in including fuses F1, F2, F3 in form of wiring layers of polysilicon, amorphous silicon, aluminum (Al) and copper (Cu), or platinum silicide (PtSi) and titanium silicide (TiSi), for example.

Figure 43:
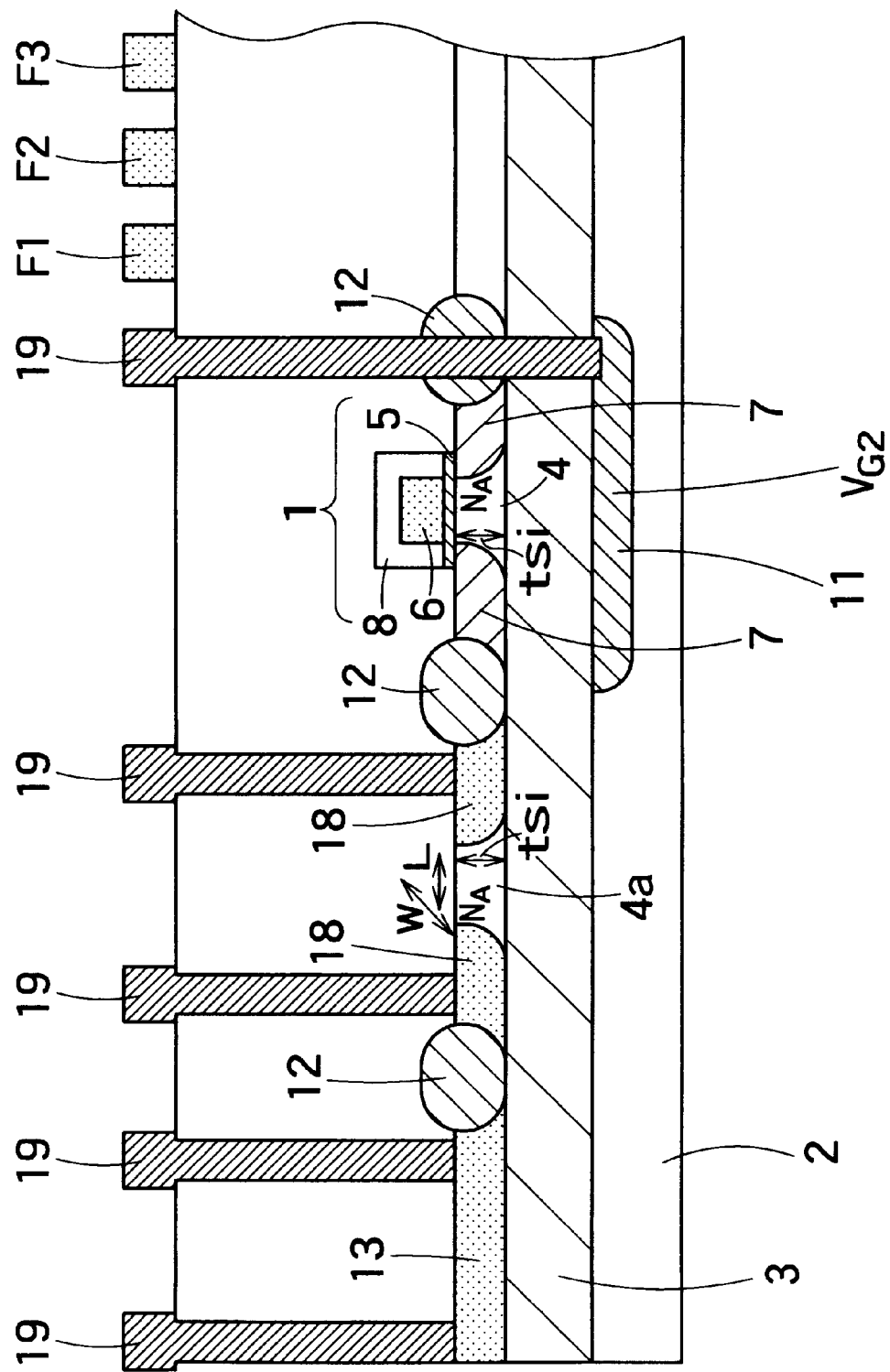
FIG. 43 is a cross-sectional view explaining a manufacturing process of the semiconductor device shown in FIG. 41.
Figure 44:
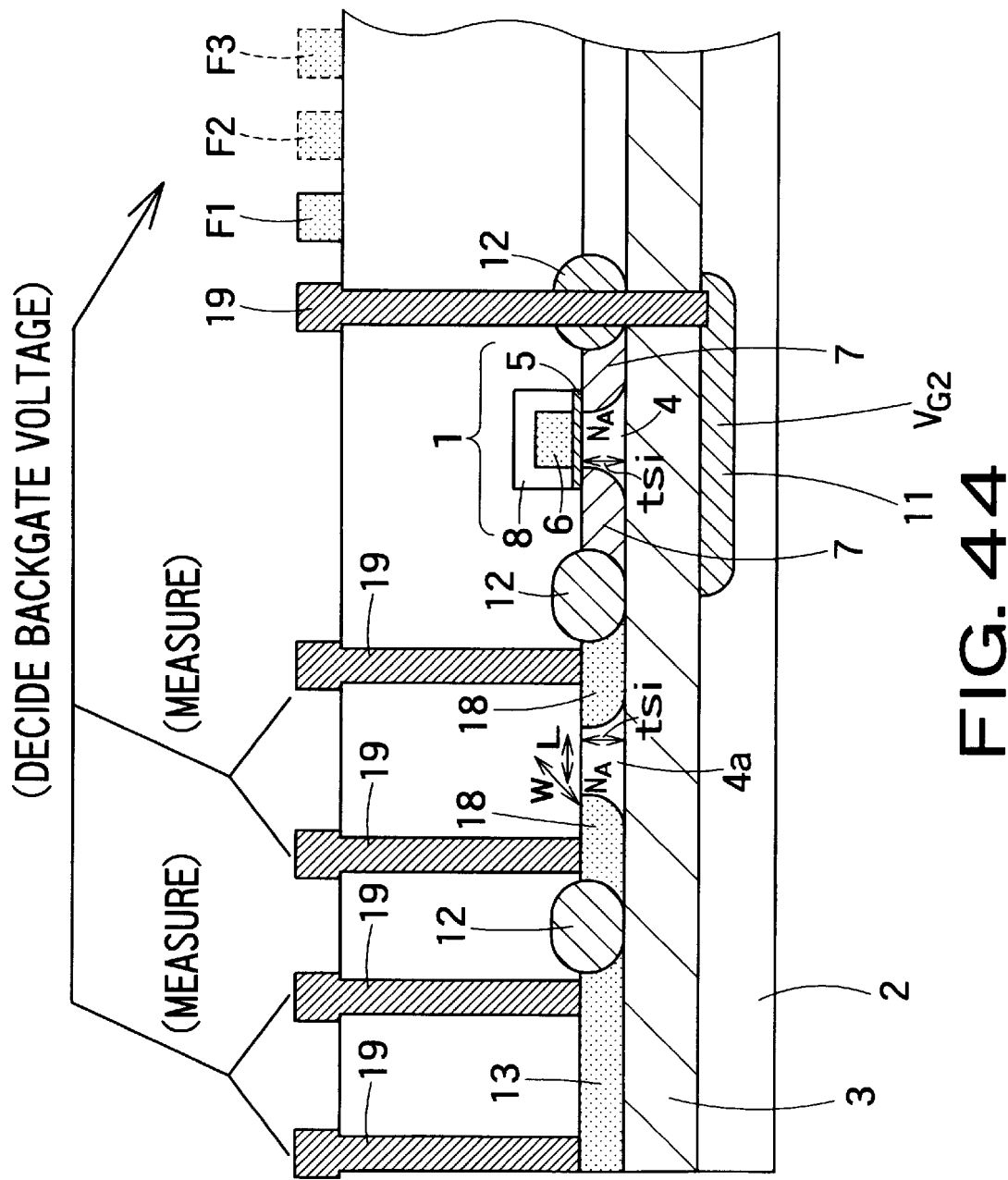
FIG. 44 is a cross-sectional view explaining a manufacturing process of the semiconductor device shown in FIG. 41.
Figure 45:
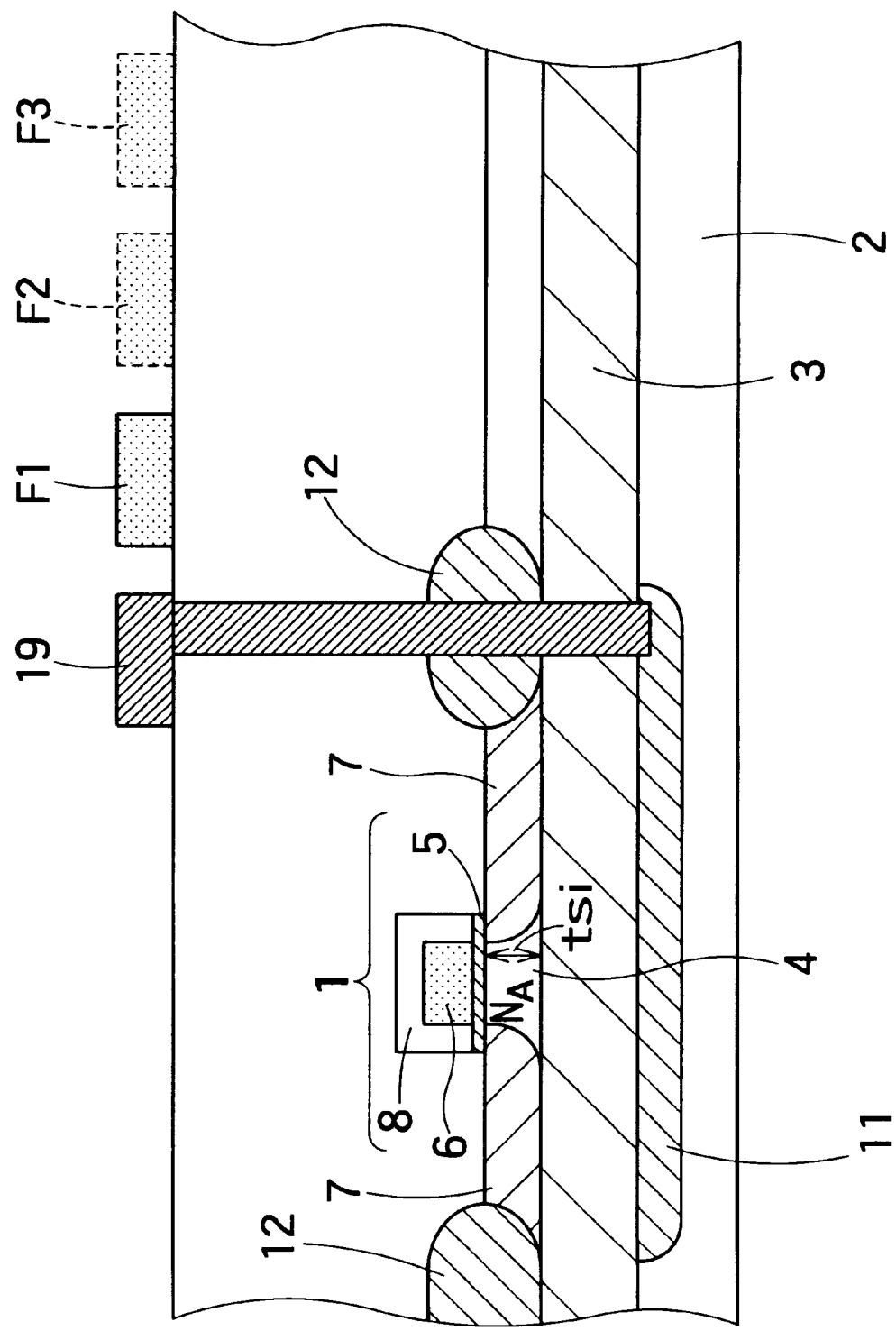
FIG. 45 is a cross-sectional view explaining a manufacturing process of the semiconductor device shown in FIG. 41.

FIGS. 43 through 45 are cross-sectional views for explaining a manufacturing method of the semiconductor device shown in FIG. 41. Here again, as shown in FIG. 43, a measuring detector element is made in the course of the manufacturing process. The detector element is configured to measure the impurity or carrier concentration from the specific resistance ρ of the SOI layer as shown in FIG. 20.

Next, as shown in FIG. 44, the impurity or carrier concentration of the channel region 4 is measured by using the measuring detector element. Based on the measured value, a back gate voltage required for the predetermined threshold value is determined, and stored in the storage element. The array of fuses F1–F3 is provided to apply selected one of a plurality of voltages to the back gate. That is, by cutting the fuses, a required back gate voltage is made. The measuring detector element need not be made for each FET1. For example, a single measuring detector element may be made for a plurality of FETs having a common threshold value to reduce areas of respective elements. More specifically, a single measuring detector element may be provided for a semiconductor device having an integrated circuit incorporating a plurality of FETs, or a single measuring detector element may be provided for a wafer on which a plurality of such semiconductor devices are made. Furthermore, if a plurality of wafers are processed by batch processing, the measuring detector element may be provided on only one of these wafers, provided that variation is small among them.

After the impurity or carrier concentration of the channel region 4 is measured and a required back gate voltage is determined from the relations as shown in FIGS. 9 through 17 and Equation (11), the measuring detector element completes its role. Then, as shown in FIG. 45, in the dicing process for dividing the product into chips, the measuring detector element may be removed from FET1.

According to this example, any chip finally obtained need not include the circuit for measuring the impurity, but can store necessary information in the storage element much smaller in size than the said circuit. Therefore, this example permits higher integration of circuits and reduction of the chip area. Furthermore, because of omission of the circuit for measuring the impurity or carrier concentration, it also contributes to reducing the power consumption.

For measurement of the impurity or carrier concentration of the channel region, any of the methods explained with the foregoing examples may be similarly used here, instead of the measuring detector element shown in FIG. 43.

Additionally, this example is applicable also to a semiconductor device including a plurality of different FETs as shown in FIG. 35. That is, in the case where some kinds of MISFETs different in thickness of the channel region, impurity concentration, etc. are made in a semiconductor device, a storage element can be provided for each kind of FET to feed back the result of measurement by the detector element and to apply an optimum back gate voltage.

Next explained are specific constructions of the bias circuit used in this example.

FIGS. 46 through 51 show some constructions of the bias circuit including the storage element, which can be used in this embodiment.

Figure 46:
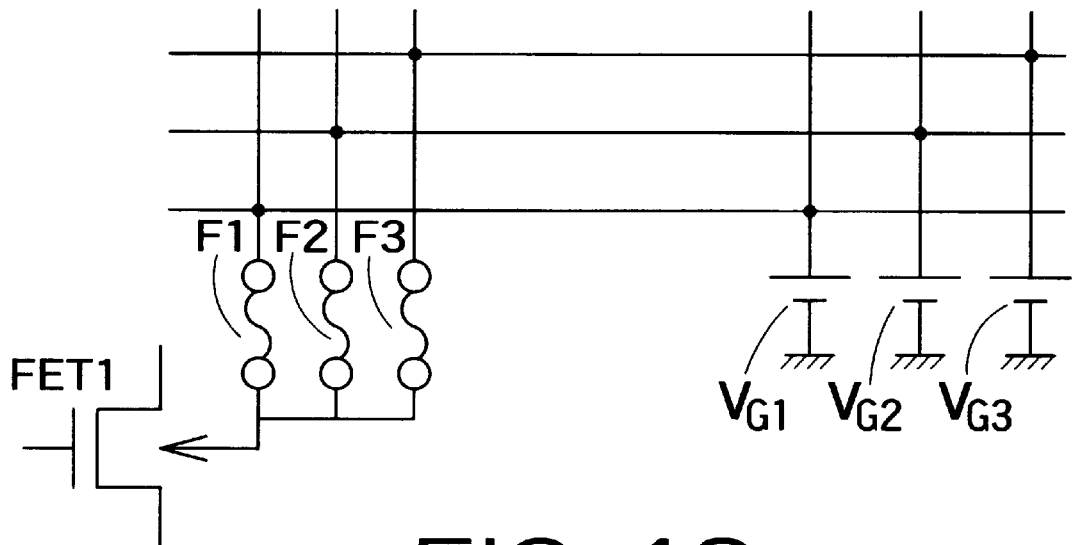
FIG. 46 is a diagram showing a construction of a bias circuit including a storage element usable in the seventh example.

The construction shown in FIG. 46 is configured to previously estimate the range of fluctuation in impurity or carrier concentration of the channel region 4, preset optimum back gate voltages for estimated values, such as $V_{G1}$, $V_{G2}$ and $V_{G3}$, for example, and cut fuses of the storage element, where necessary.

Figure 10:
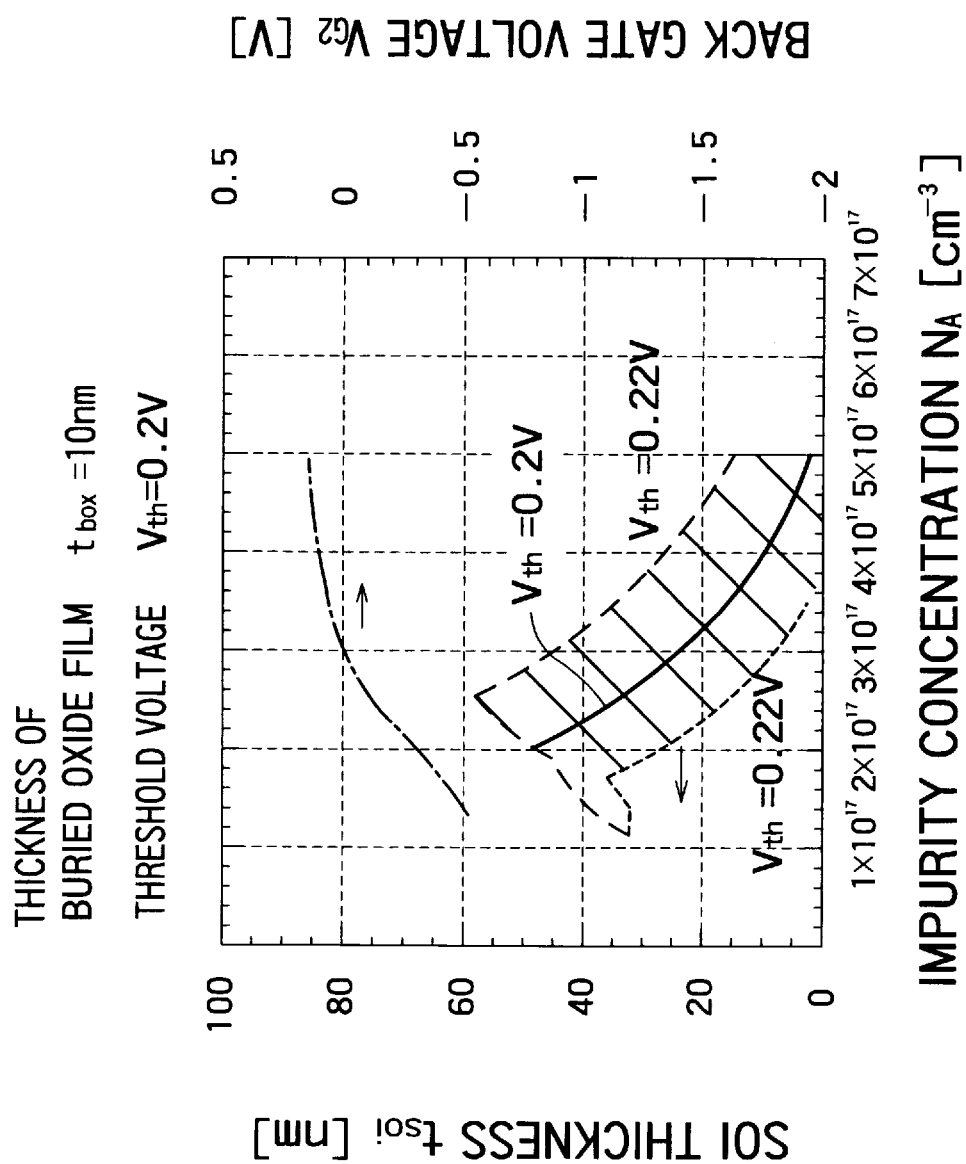
Figure 11:
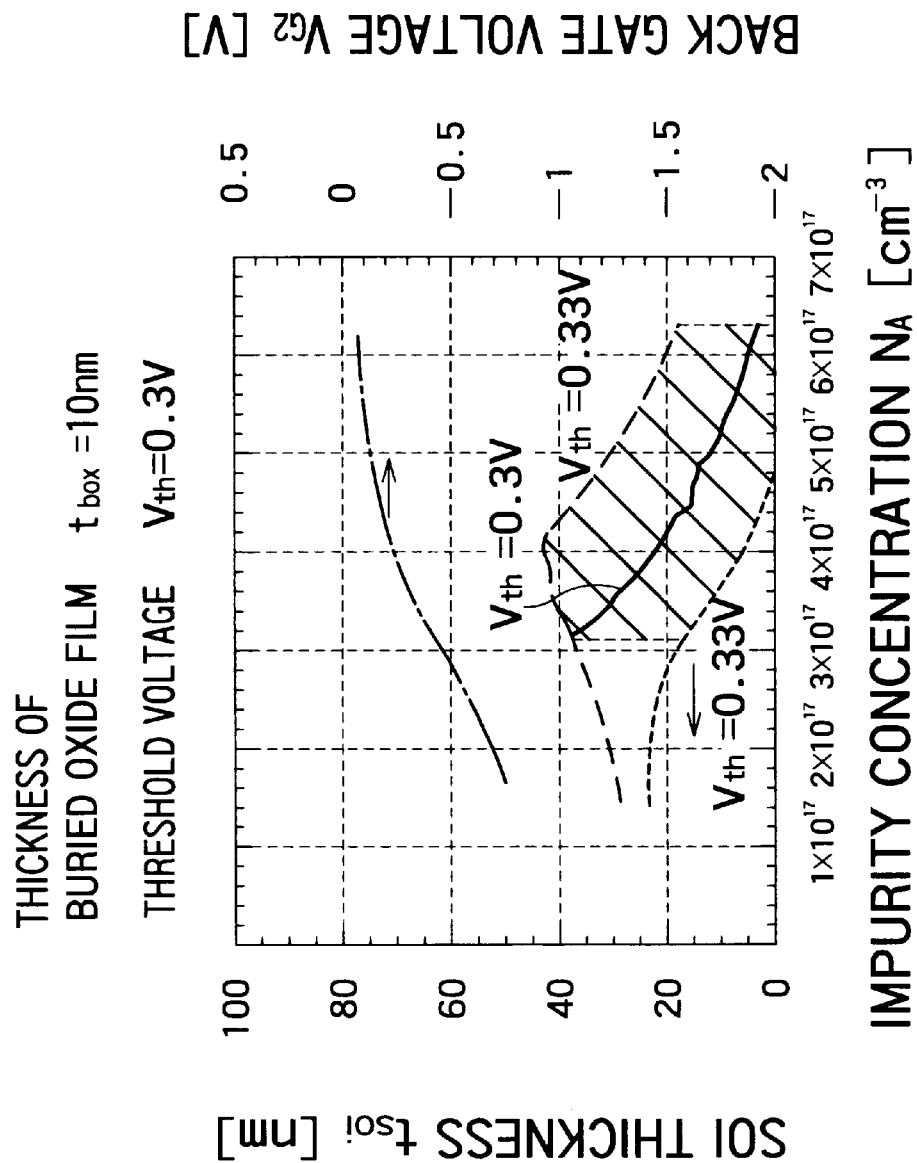
Figure 12:
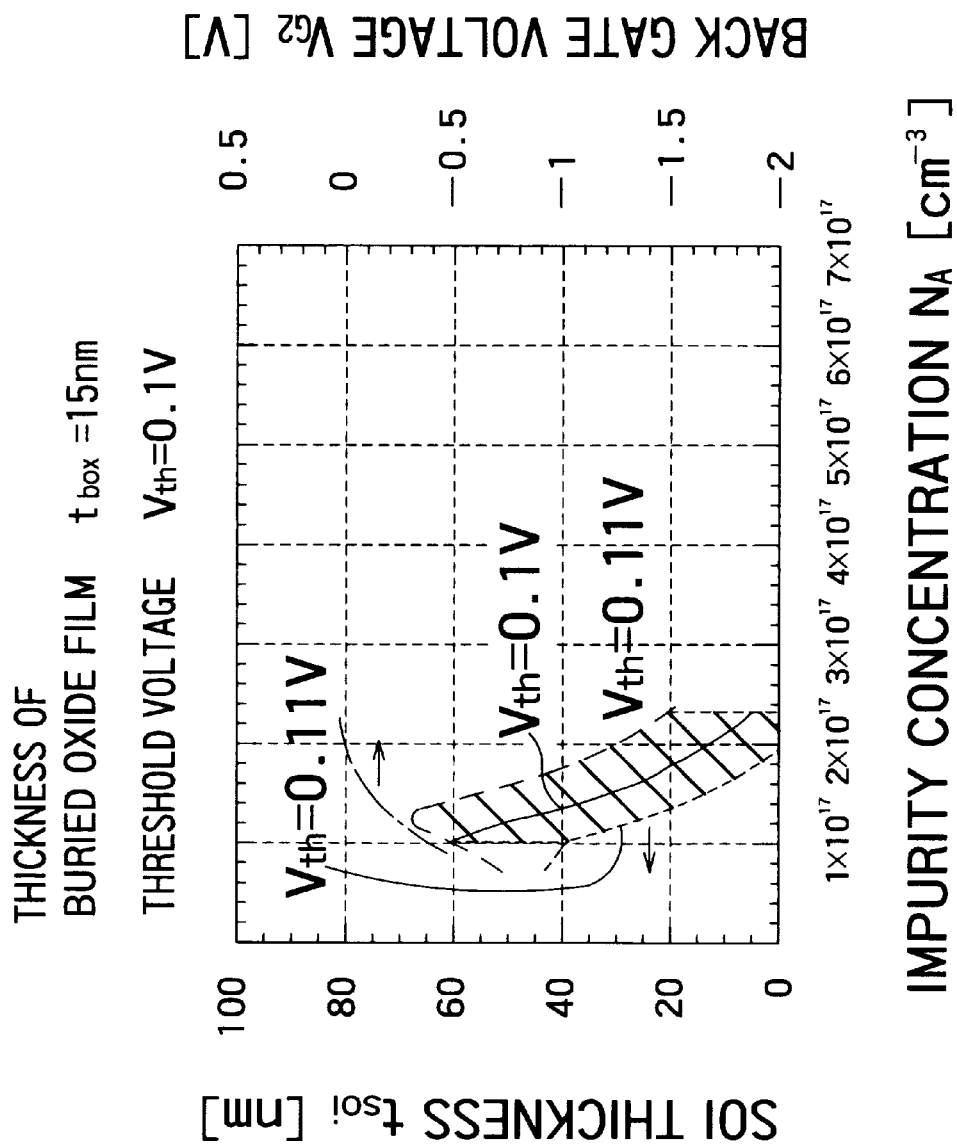
Figure 13:
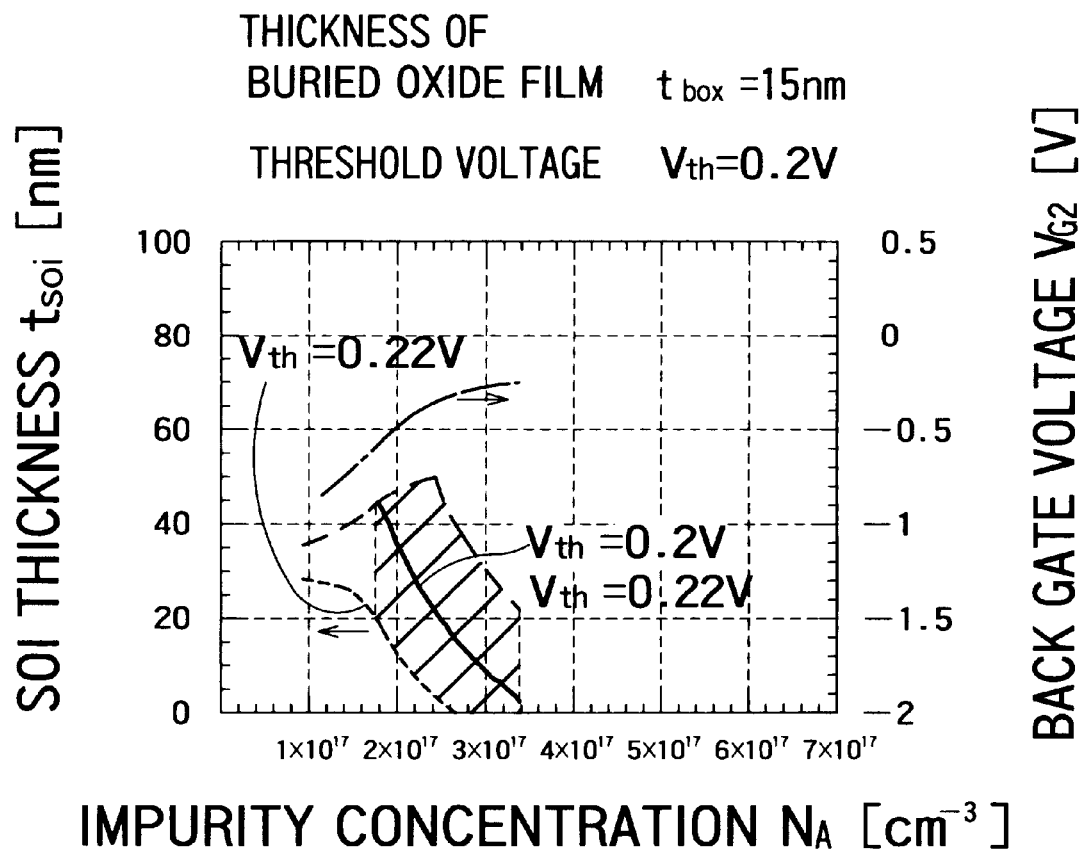
Figure 14:
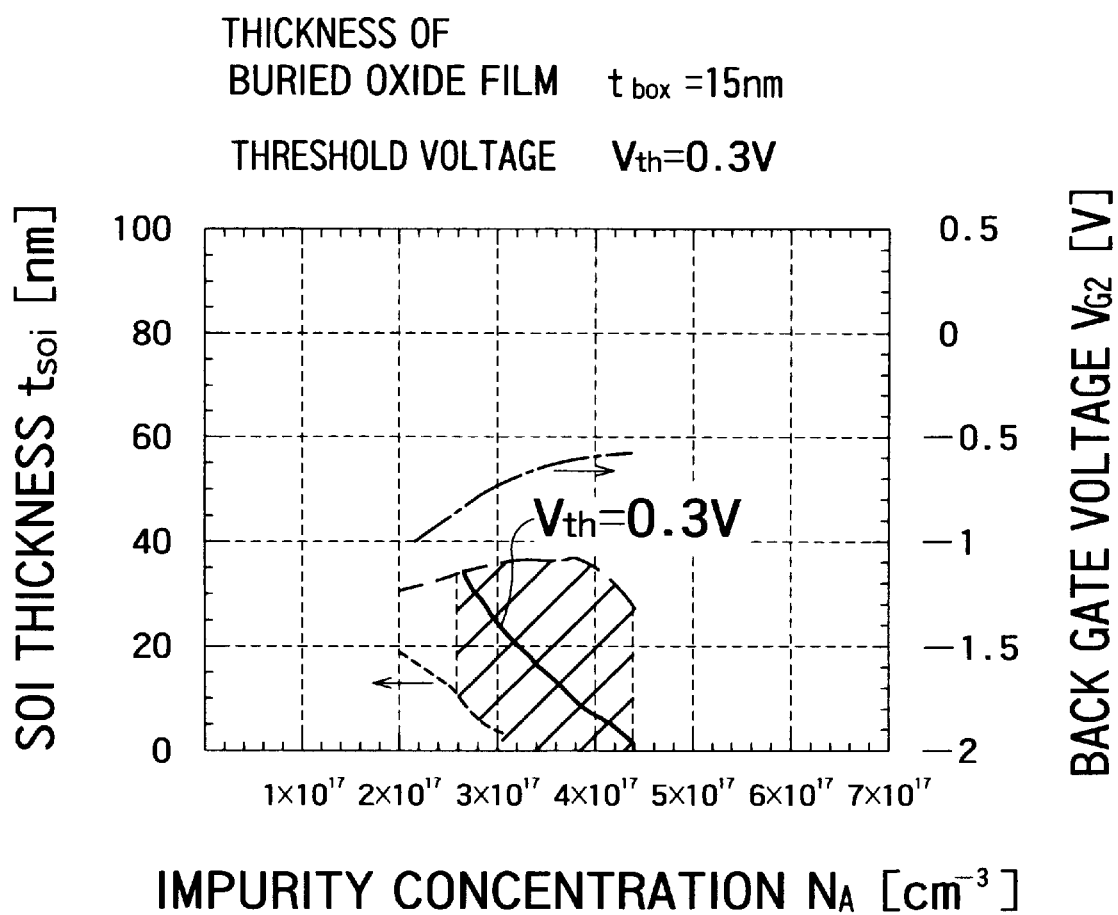
Figure 15:
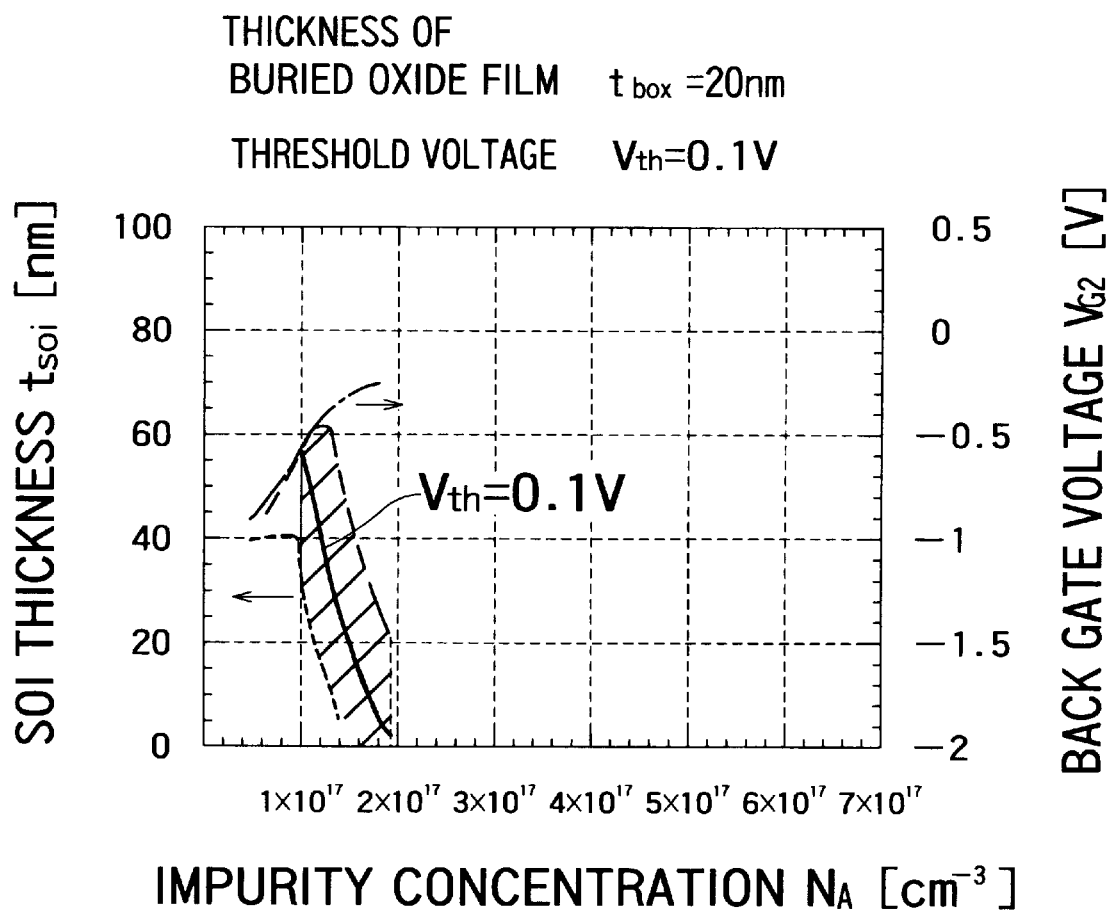
Figure 16:
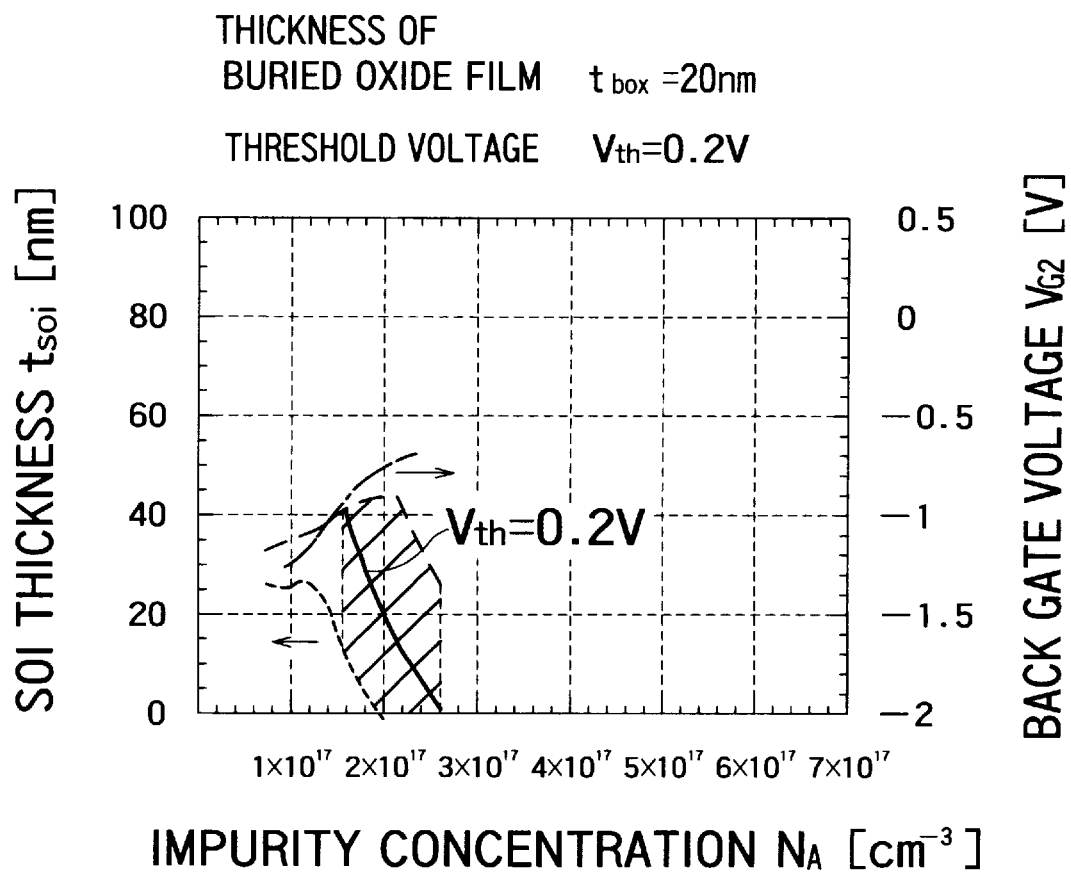
Figure 17:
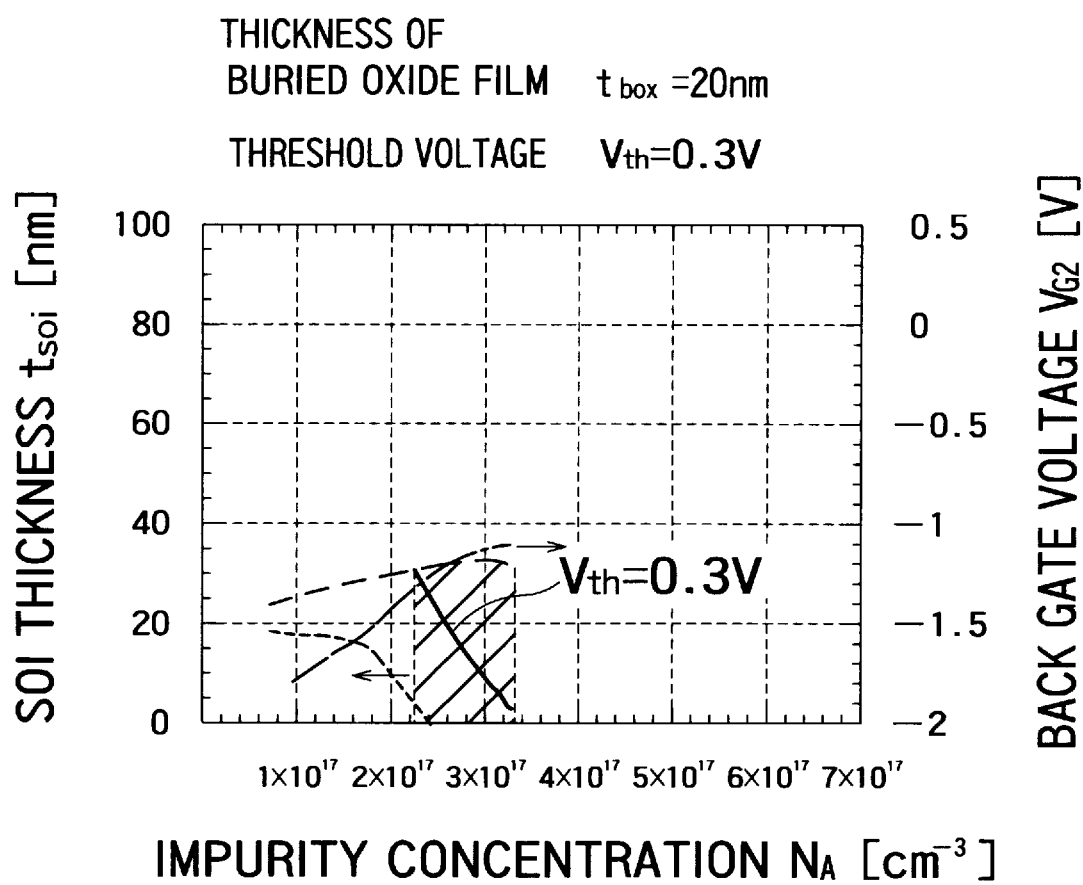
Figure 18:
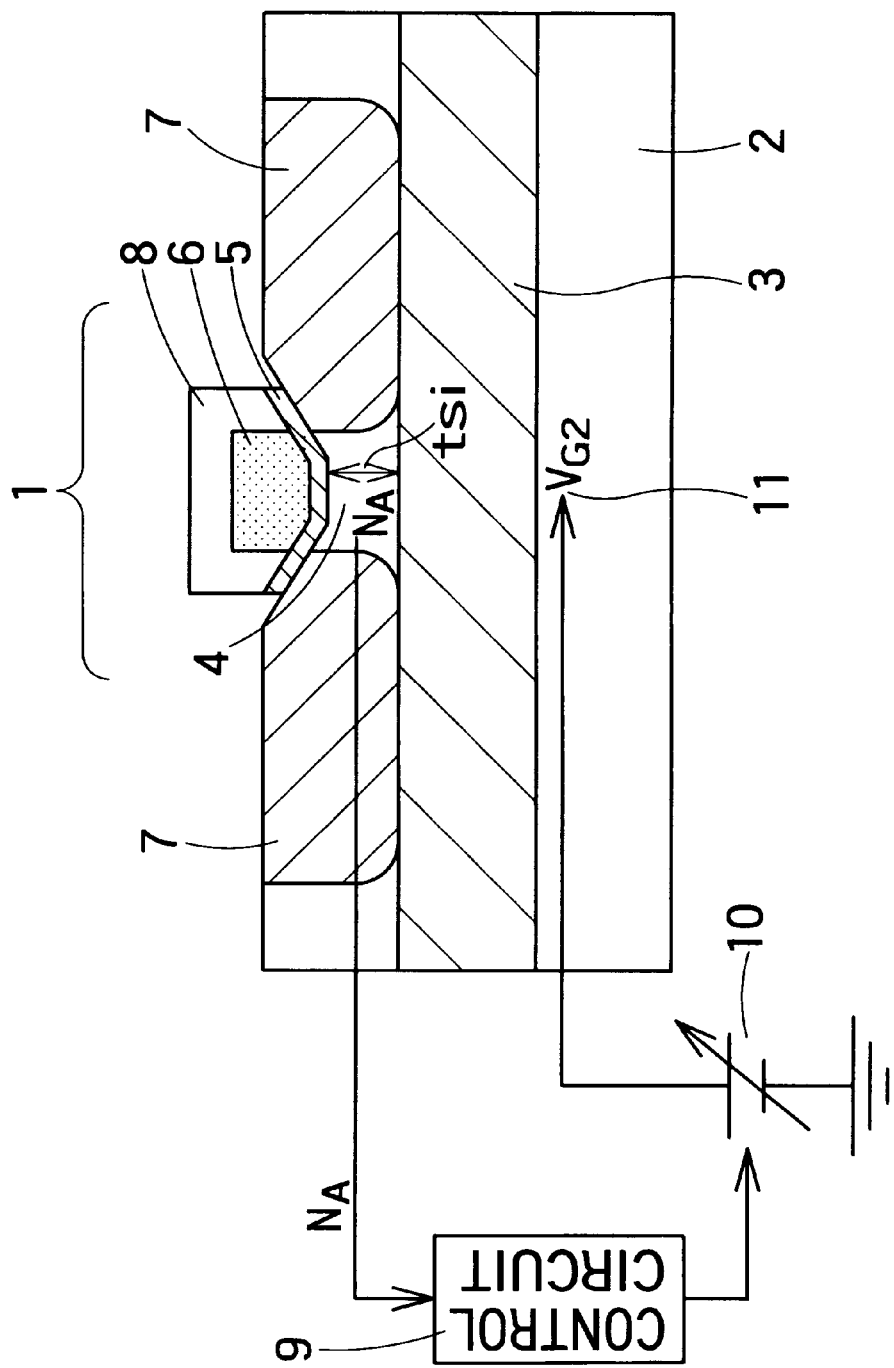
FIG. 18 is a cross-sectional view showing MISFET having a recessed gate structure made by a method such as LOCOS sacrificial oxidation.

This is explained more specifically with reference to the graph of FIG. 10 and Equation (11) showing the relation between the SOI film thickness and the impurity concentration. First let the desired threshold value be 0.2V and let the impurity concentration vary within the range from $2.1 \times 10^{17} \text{cm}^{-3}$ to $4.4 \times 10^{19} \text{cm}^{-3}$, for example. Then, $-0.25V$, $0V$ and $0.1V$ are prepared as $V_{G1}$, $V_{G2}$ and $V_{G3}$ as back gate voltage sources. Thus, the impurity concentration of the channel region 4 is measured by using the detector element. When the measure value is in the range from $2.1 \times 10^{17} \text{cm}^{-3}$ to $2.8 \times 10^{17} \text{cm}^{-3}$, F1 of the storage element is maintained while F2 and F3 are cut, so as to apply $V_{G1}=-0.25V$ as the back gate voltage. When the measured value is in the range from $2.8 \times 10^{17} \text{cm}^{-3}$ to $3.1 \times 10^{17} \text{cm}^{-3}$, F2 is maintained while F1 and F3 are cut, so as to apply $V_{G2}=0V$ as the back gate voltage. When the measured value is in the range from $3.1 \times 10^{17} \text{cm}^{-3}$ to $4.4 \times 10^{17} \text{cm}^{-3}$, F3 is maintained while F1 and F2 are cut, so as to apply $V_{G3}=0.1V$ as the back gate voltage. In this manner, a back gate in a desired range can be applied in response to the measured value, and a threshold value nearest to the desired threshold value can be obtained.

Figure 47:
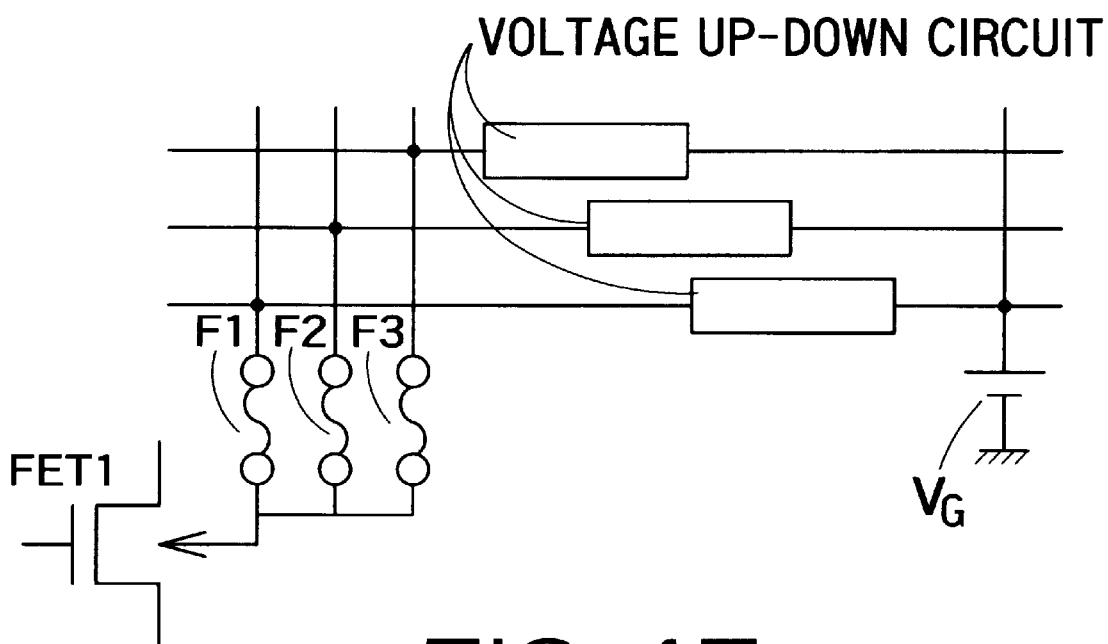
FIG. 47 is a diagram showing a construction of a bias circuit including a storage element usable in the seventh example.

In the construction shown in FIG. 47, power sources $V_{G1}$ through $V_{G3}$ are replaced by voltage up-down circuits. This is convenient because the back gate voltage can be appropriately increased or reduced to a predetermined value, based on a source voltage used conventionally.

Figure 48:
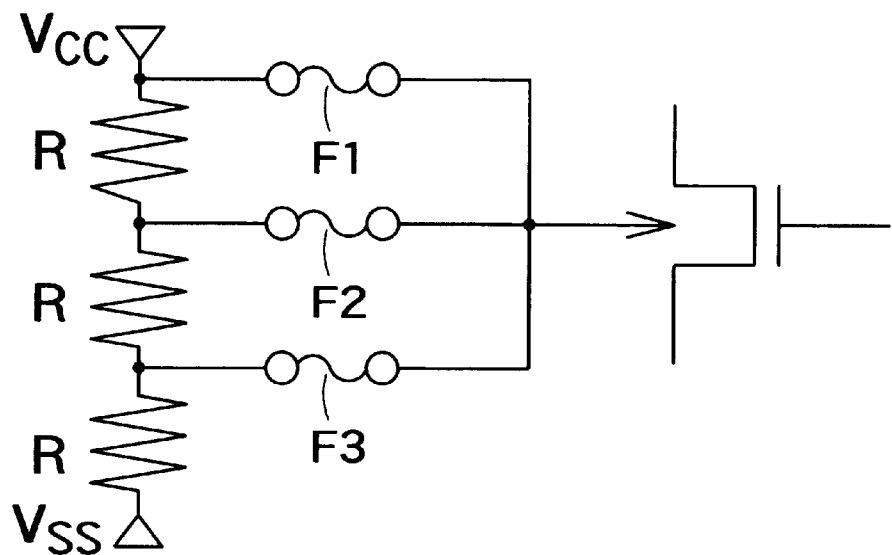
FIG. 48 is a diagram showing a construction of a bias circuit including a storage element usable in the seventh example.

The construction shown in FIG. 48 is configured to appropriately divide the voltage in the range of Vcc to Vss from Vcc=3V, which is the source voltage, to Vss=0V, for example, to use any as the back gate voltage. For example, resistors of a resistance R, for example, are connected in series, and fuses are connected to permit an appropriate voltage to be extracted at each terminal. Then, upon applying a back gate voltage, for example, the voltage of ⅔ Vcc can be applied to the back gate by maintaining F2 and cutting F1 and F3; the voltage of ⅓ Vcc can be applied by maintaining F3 and cutting F1 and F2; and the voltage of Vcc can be applied by maintaining all fuses. Although three resistors are provided in FIG. 48, any plurality of resistors may be provided. As the number of resistors increases, the voltage is divided to a larger number of steps, and a value nearer to the desired threshold value is obtained. The voltage range is not limited to Vcc to Vss, but can be changed by using voltage up-down circuits.

Figure 49:
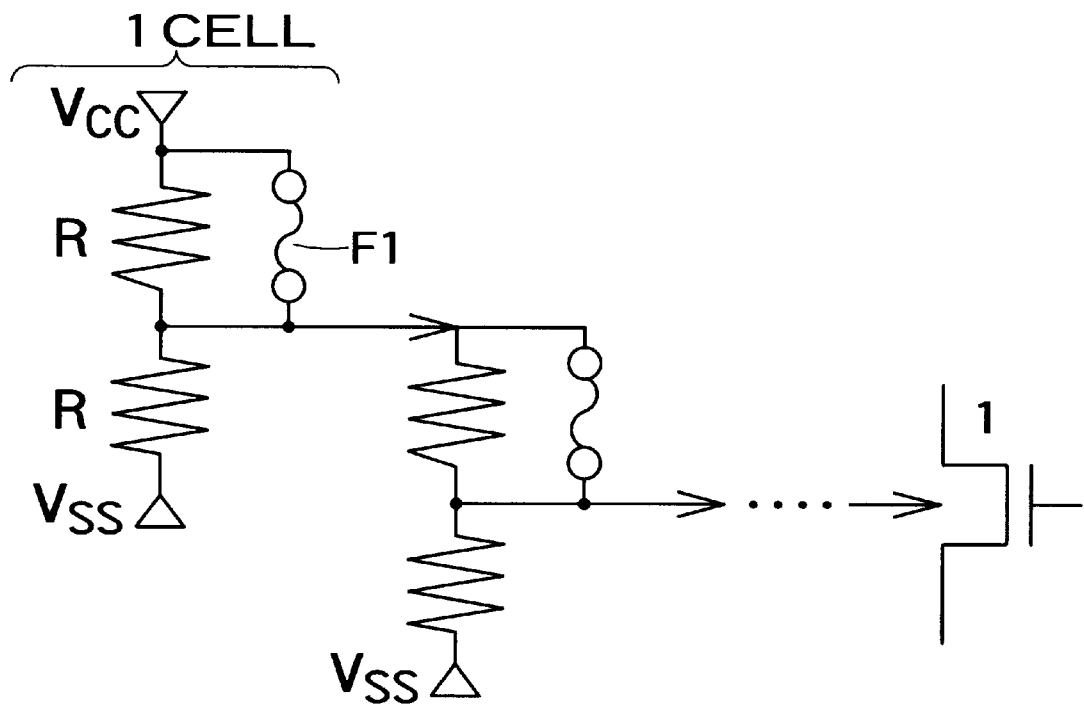
FIG. 49 is a diagram showing a construction of a bias circuit including a storage element usable in the seventh example.
Figure 50:
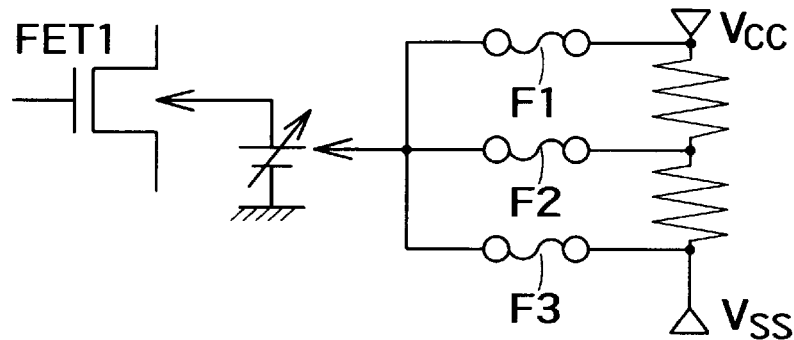
FIG. 50 is a diagram showing a construction of a bias circuit including a storage element usable in the seventh example.

The construction shown in FIG. 49 is a modification of the construction of FIG. 48, in which the voltage range from Vcc to Vss, for example, can be divided by using n cells each including two resistors and one fuse.

In stead of applying a resistor output directly to the substrate bias node as shown in FIG. 48, the resistor output may be connected to a variable power source whose output voltage is changed by a control input. This is advantageous in that a large substrate bias output current can be obtained even if the current flowing in the resistor is small.

Figure 51:
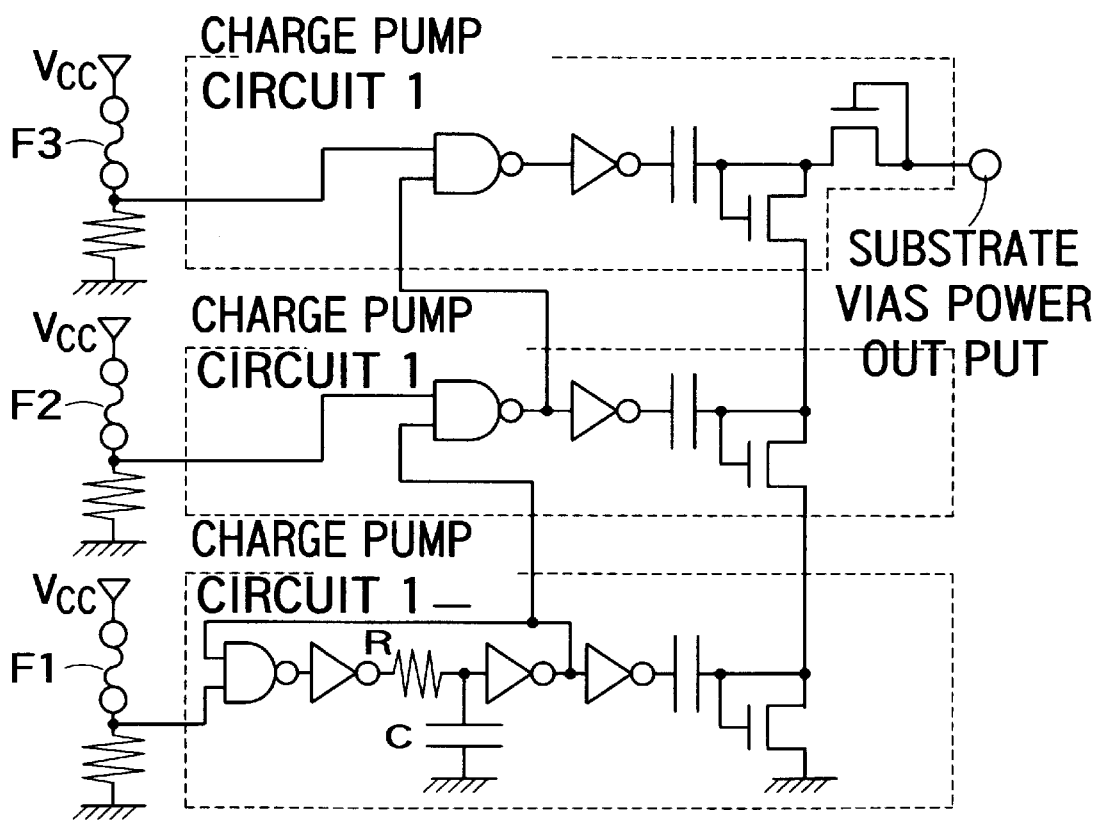
FIG. 51 is a diagram showing a construction of a bias circuit including a storage element usable in the seventh example.

Furthermore, as shown in FIG. 51, a plurality of charge pump circuits may be connected continuously to switch the substrate bias voltage in accordance with conditions of the fuses F1 through F3 of the storage element. Assuming the threshold value of the transistor be Vt, $-3$ Vcc+4 Vt can be obtained as the open voltage of the substrate bias source output when holding F1, F2 and F3 connected; $-1$ Vcc+4 Vt is obtained upon F1 and F2 being held and F3 being cut; and $-$Vcc+4 Vt is obtained upon F1 being held and F2 and F3 being cut.

The storage element used in this example is not limited to the above-explained construction relying on cutting fuses. For example, the storage may rely on a method storing charges in floating gate electrodes, or a method polarizing dielectric elements, or a method, so-called anti-fuse, utilizing insulation breakdown of a thin semiconductor or insulator interposed between metals or silicides.

Although some embodiments of the invention have been explained taking some specific examples, the invention is not limited to these examples.

For example, usable as the method for making an insulating film are a method of making an oxide film by thermal oxidation, a method for making an oxide film injected with oxygen under an acceleration energy as low as approximately 30 keV, a method for stacking a silicon oxide film, a method for stacking a silicon nitride film, or an appropriate combination of them. Also usable are methods other than these methods for converting silicon into a silicon oxide film or a silicon nitride film, namely, a method for injecting oxygen ions into stacked silicon or a method for oxidizing stacked silicon, for example. Usable as these insulating films are, in addition to a silicon nitride film, a tantalum oxide film, a titanium oxide film, a single layer film or a multi-layered film of ferroelectric films or paraelectric films of strontium titanate, barium titanate or zirconium lead titanate.

Additionally, although not referred to in explanation of the foregoing examples, usable for separation of elements are element separation of trench separation, LOCOS element separating film, recessed LOCOS, improved LOCOS, field shield separation or their combination.

Furthermore, although the foregoing examples use p-type Si as the SOI layer, n-type Si, GaAs and InP are also usable. p-type MISFET may be used instead of n-type MISFET, changing the n-type into the p-type, replacing As, P, Sb, etc. as the doping impurity seed with In, B, etc., and changing replacing As, P, Sb, etc. also for ion implantation by In, B, $BF_2$, for example.

Usable as the gate electrode are, in addition to polycrystalline silicon, single crystal silicon, porous silicon, amorphous silicon, SiGe mixed crystal, SiC mixed crystal, metal or silicide of GaAs, W, Ta, Ti, Hf, Co, Pt or Pd. A multi-layered structure of these materials is also acceptable.

Also usable as the insulating layer 3 are, in addition to the oxides, nitrides such as silicon nitride. In this case, the value expressed by 3.9 $t_1/E_1$ can be employed as the effective oxide thickness of such an insulating layer 3, where $E_1$ is the dielectric constant and $t_1$ is the actual thickness of the insulating layer.

While the present invention has been disclosed in terms of the preferred embodiment in order to facilitate better understanding thereof, it should be appreciated that the invention can be embodied in various ways without departing from the principle of the invention. Therefore, the invention should be understood to include all possible embodiments and modification to the shown embodiments which can be embodied without departing from the principle of the invention as set forth in the appended claims.

What is claimed is:

1. A semiconductor device comprising:

a support substrate having a first back gate;

an insulating film provided on said support substrate;

a first semiconductor layer provided on said insulating film;

a first MISFET having as a channel region thereof a first portion of said first semiconductor layer opposed to said first back gate of said support substrate;

a detector element outputting a measurement signal which varies with impurity concentration, carrier concentration or thickness of said first semiconductor layer; and voltage applying means for applying a voltage to said first back gate responsive to said measurement signal.

2. The semiconductor device according to claim 1 wherein said detector element include a second portion of said first semiconductor layer and a plurality of electrodes formed on said second portion, and can measure resistance between said electrodes.

3. The semiconductor device according to claim 2 wherein said second portion includes a third portion having substantially the same carrier concentration as that of said channel region.

4. The semiconductor device according to claim 1 wherein said detector element includes a second back gate formed in said support substrate, a second portion of said first semiconductor layer, a second insulating film stacked on said second portion of said first semiconductor layer and an electrode formed on said insulating film, and can measure electric capacitance between said back gate and said electrode.

5. The semiconductor device according to claim 1 wherein said detector element includes a third portion having substantially the same carrier concentration as that of said channel region, and n-type and p-type portions at opposite sides of said third portion, and can measure electric capacitance by applying a voltage between said n-type and p-type portions.

6. The semiconductor device according to claim 1 wherein said detector element includes a second semiconductor layer formed on said insulating film and having a thickness different from that of said first semiconductor layer.

7. The semiconductor device according to claim 1 wherein said MISFET is a fully depleted transistor in which said channel region can be completely charge-freed.

8. The semiconductor device according to claim 7 satisfying the relation:

$$\{64 \times 1.4^{t_{box}/10} \times 0.9^{27V_{th}/t_{ox}}\} -$$
$$\{1.4 \times 2.5^{t_{box}/10} \times 0.67^{27V_{th}/t_{ox}}\} \times 10^{-16} \times N_A \le$$
$$t_{si} \le \{64 \times 1.4^{t_{box}/10} \times 0.9^{33V_{th}/t_{ox}}\} -$$
$$\{1.4 \times 2.5^{t_{box}/10} \times 0.67^{33V_{th}/t_{ox}}\} \times 10^{-16} \times N_A$$

where $t_{box}$ is the thickness (nm) of said insulating film, $t_{si}$ is the thickness (nm) of said first semiconductor layer, $N_A$ is the impurity concentration (cm$^{-3}$) of said channel region, $V_{th}$ is a threshold value (V) of said MISFET and $t_{ox}$ is a effective oxide thickness (nm) of a gate insulator of said MISFET.

9. The semiconductor device according to claim 8 wherein the effective oxide thickness of said insulating film is not larger than 30 nm.

10. A semiconductor device comprising:

a support substrate having a back gate;

an insulating film provided on said support substrate;

a first semiconductor layer provided on said insulating film;

a first MISFET having as a channel region thereof a portion of said first semiconductor layer opposed to said back gate of said support substrate;

a storage element storing information on a voltage to be applied to said back gate; and voltage applying means for applying a voltage to said back gate responsive to said information stored in said storage element.

11. The semiconductor device according to claim 10 wherein said storage element stores information on impurity concentration carrier concentration thickness said first semiconductor layer.

12. The semiconductor device according to claim 11 wherein said storage element is an array of fuses for applying selected one of a plurality of voltages to said back gate.

13. The semiconductor device according to claim 11 wherein said MISFET is a fully depleted transistor in which said channel region can be completely carrier-freed.

14. The semiconductor device according to claim 13 satisfying the relation:

$$\{64 \times 1.4^{t_{box}/10} \times 0.9^{27V_{th}/t_{ox}}\} -$$
$$\{1.4 \times 2.5^{t_{box}/10} \times 0.67^{27V_{th}/t_{ox}}\} \times 10^{-16} \times N_A \le$$
$$t_{si} \le \{64 \times 1.4^{t_{box}/10} \times 0.9^{33V_{th}/t_{ox}}\} -$$
$$\{1.4 \times 2.5^{t_{box}/10} \times 0.67^{33V_{th}/t_{ox}}\} \times 10^{-16} \times N_A$$

where $t_{box}$ is the thickness (nm) of said insulating film, $t_{si}$ is the thickness (nm) of said first semiconductor layer, $N_A$ is the impurity concentration (cm$^{-3}$) of said channel region, $V_{th}$ is a threshold value (V) of said MISFET and $t_{ox}$ is a effective oxide thickness (nm) of a gate insulator of said MISFET.

15. The semiconductor device according to claim 14 wherein the effective oxide thickness of said insulating film is not larger than 30 nm.

16. A semiconductor device including a support substrate having a first back gate, an insulating film on said support substrate, and a first MISFET having as a channel region thereof a portion of a first semiconductor layer provided in alignment with said first back gate on said insulating film, characterized in satisfying the relation:

$$\{64 \times 1.4^{t_{box}/10} \times 0.9^{27 V_{th}/t_{ox}}\} -$$
$$\{1.4 \times 2.5^{t_{box}/10} \times 0.67^{27 V_{th}/t_{ox}}\} \times 10^{-16} \times N_A \le$$
$$t_{si} \le \{64 \times 1.4^{t_{box}/10} \times 0.9^{33 V_{th}/t_{ox}}\} -$$
$$\{1.4 \times 2.5^{t_{box}/10} \times 0.67^{33 V_{th}/t_{ox}}\} \times 10^{-16} \times N_A$$

where $t_{box}$ is the thickness (nm) of said insulating film, $t_{si}$ is the thickness (nm) of said first semiconductor layer, $N_A$ is the impurity concentration (cm$^{-3}$) of said channel region, $V_{th}$ is a threshold value (V) of said MISFET and $t_{ox}$ is a effective oxide thickness (nm) of a gate insulator of said MISFET.

17. The semiconductor device according to claim 16 wherein said support substrate has a second back gate, and said semiconductor device further comprises a second MISFET having as its channel region a portion of a second semiconductor layer provided in alignment with said second back gate on said insulating film, a thickness of said second semiconductor layer being different from the thickness of said first semiconductor layer and/or an impurity concentration of the channel region of the second MISFET being different from the impurity concentration of the channel region of said first MISFET.

18. The semiconductor device according to claim 17 satisfying the relation:

$$\{64 \times 1.4^{t_{box2}/10} \times 0.9^{27 V_{th2}/t_{ox2}}\} -$$
$$\{1.4 \times 2.5^{t_{box2}/10} \times 0.67^{27 V_{th2}/t_{ox2}}\} \times 10^{-16} \times N_{A2} \le$$
$$t_{si2} \le \{64 \times 1.4^{t_{box2}/10} \times 0.9^{33 V_{th2}/t_{ox2}}\} -$$
$$\{1.4 \times 2.5^{t_{box2}/10} \times 0.67^{33 V_{th2}/t_{ox2}}\} \times 10^{-16} \times N_{A2}$$

where $t_{box2}$ is the thickness (nm) of said insulating film, $t_{si2}$ is the thickness (nm) of said first semiconductor layer, $N_{A2}$ is the impurity concentration (cm$^{-3}$) of said channel region, $V_{th2}$ is a threshold value (V) of said second MISFET and $t_{ox2}$ is a effective oxide thickness (nm) of a gate insulator of said second MISFET.

19. The semiconductor device according to claim 18 wherein the effective oxide thickness of said insulating film is not larger than 30 nm.

20. The semiconductor device according to claim 19 further comprising:

first voltage applying means for applying a voltage to said first back gate; and second voltage applying means for applying a voltage to said second back gate.

* * * * *